United States Patent [19]
Nakagawa et al.

[11] Patent Number: 5,536,961
[45] Date of Patent: Jul. 16, 1996

[54] HIGH BREAKDOWN VOLTAGE SEMICONDUCTOR DEVICE

[75] Inventors: Akio Nakagawa, Hiratsuka; Norio Yasuhara, Yokohama; Tomoko Matsudai, Tokyo, all of Japan

[73] Assignee: Kabushiki Kaisha Toshiba, Kawasaki, Japan

[21] Appl. No.: 396,794

[22] Filed: Mar. 1, 1995

Related U.S. Application Data

[63] Continuation of Ser. No. 220,283, Mar. 30, 1994, Pat. No. 5,434,444, which is a continuation of Ser. No. 829,214, Jan. 31, 1992, Pat. No. 5,343,067, which is a continuation-in-part of Ser. No. 642,565, Jan. 18, 1991, Pat. No. 5,241,210, which is a continuation-in-part of Ser. No. 236,746, Aug. 26, 1988, abandoned, which is a continuation-in-part of Ser. No. 161,102, Feb. 26, 1988, abandoned.

[30] Foreign Application Priority Data

| Feb. 26, 1987 | [JP] | Japan | 62-43564 |
| Jul. 29, 1987 | [JP] | Japan | 62-189420 |
| Jul. 4, 1988 | [JP] | Japan | 63-166403 |
| Jan. 31, 1991 | [JP] | Japan | 3-31720 |
| Mar. 28, 1991 | [JP] | Japan | 3-90068 |
| Apr. 16, 1991 | [JP] | Japan | 3-109605 |
| Sep. 20, 1991 | [JP] | Japan | 3-268970 |

[51] Int. Cl.[6] ................................ H01L 29/76
[52] U.S. Cl. .......... 257/374; 257/378; 257/499; 257/506; 257/510; 257/511
[58] Field of Search ................. 257/374, 378, 257/508, 506, 499, 510, 511

[56] References Cited

U.S. PATENT DOCUMENTS

| 4,839,309 | 6/1989 | Easter et al. | 257/508 |
| 5,306,942 | 4/1994 | Fujii | 257/508 |

*Primary Examiner*—William Mintel
*Assistant Examiner*—Roy Potter
*Attorney, Agent, or Firm*—Oblon, Spivak, McClelland, Maier & Neustadt

[57] ABSTRACT

A high breakdown voltage semiconductor device comprising a semiconductor substrate an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, and a second low resistance region of a second conductivity type formed in a peripheral surface portion of the element region. Dose of impurities in the element region is set such that a portion of the element region between the first low resistance region and the second low resistance region is completely depleted when voltage is applied between the first and second low resistance regions.

11 Claims, 65 Drawing Sheets

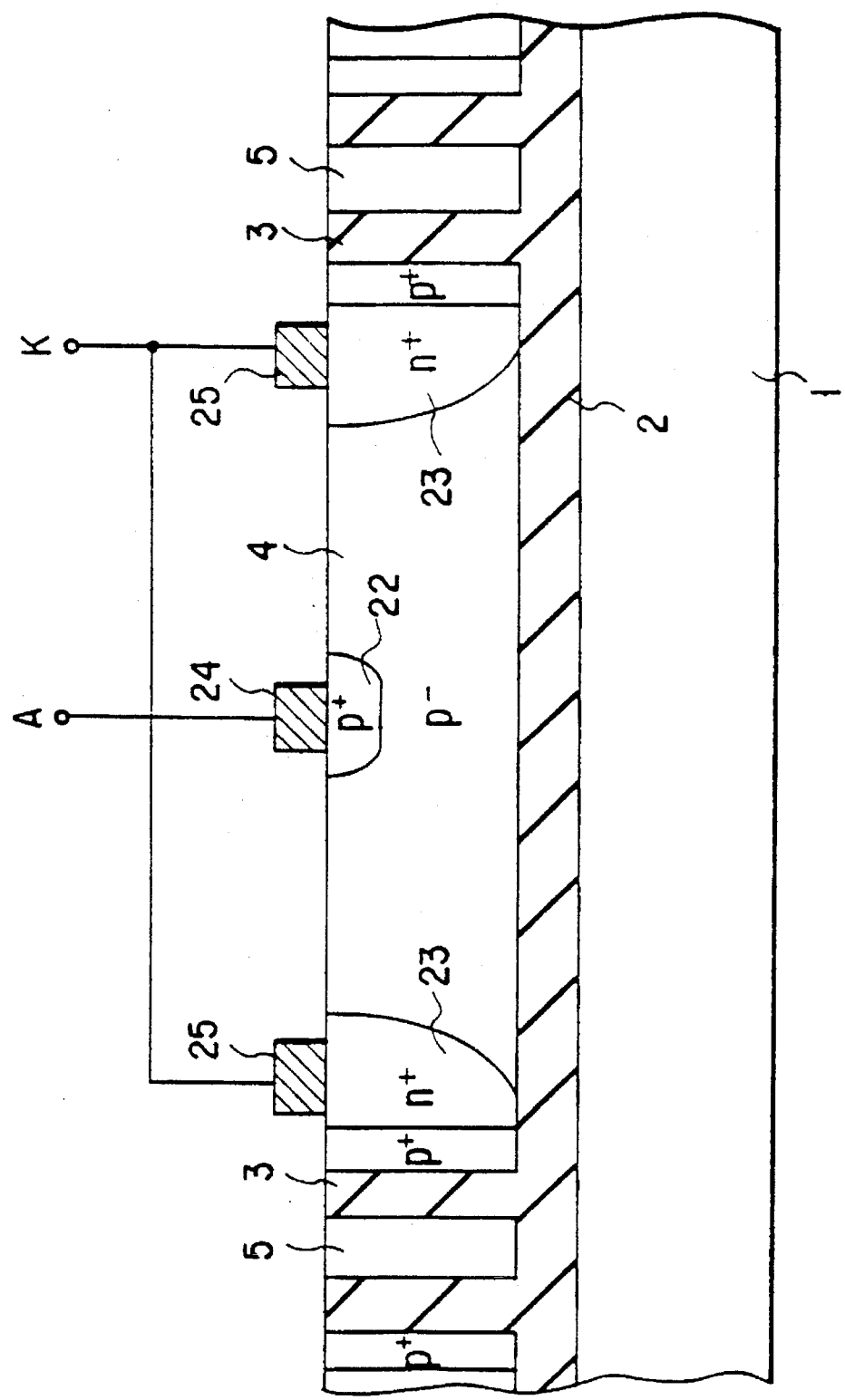
F I G. 5

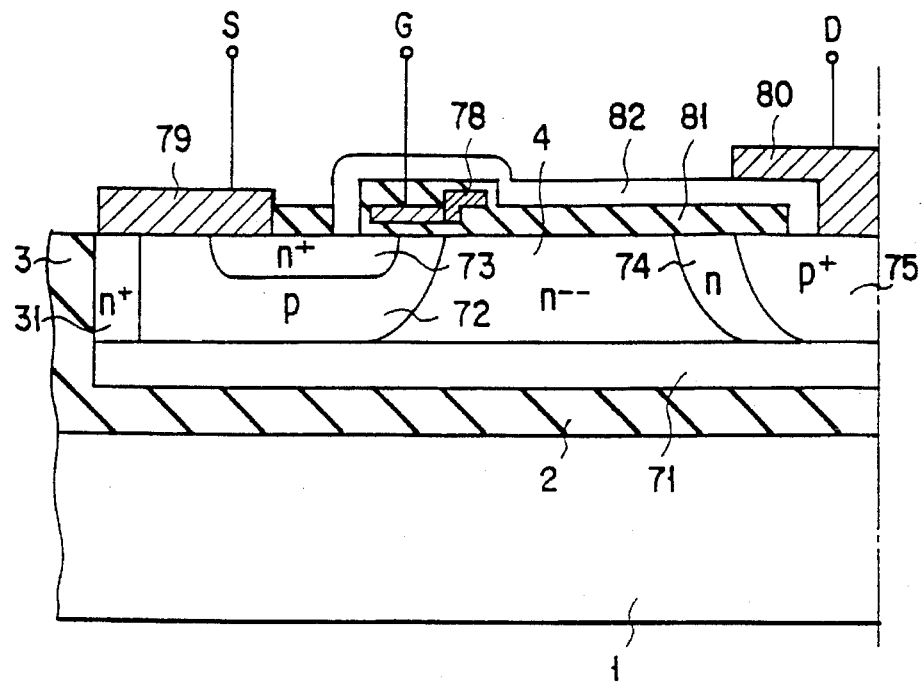
F I G. 8
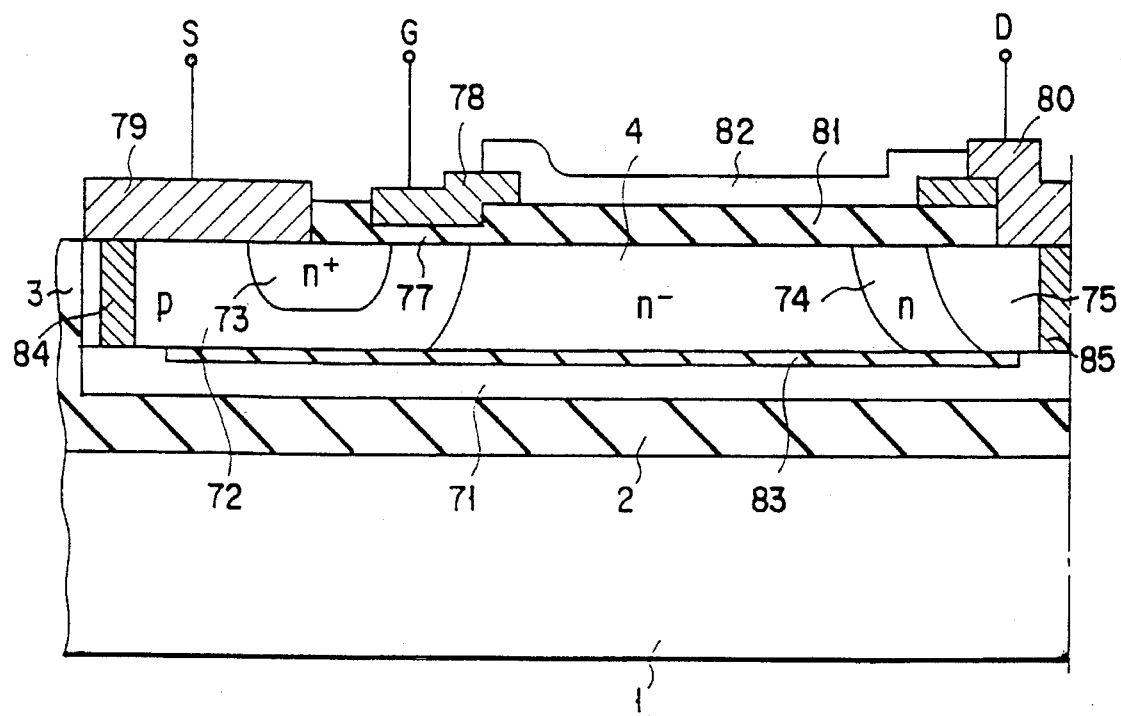
F I G. 9

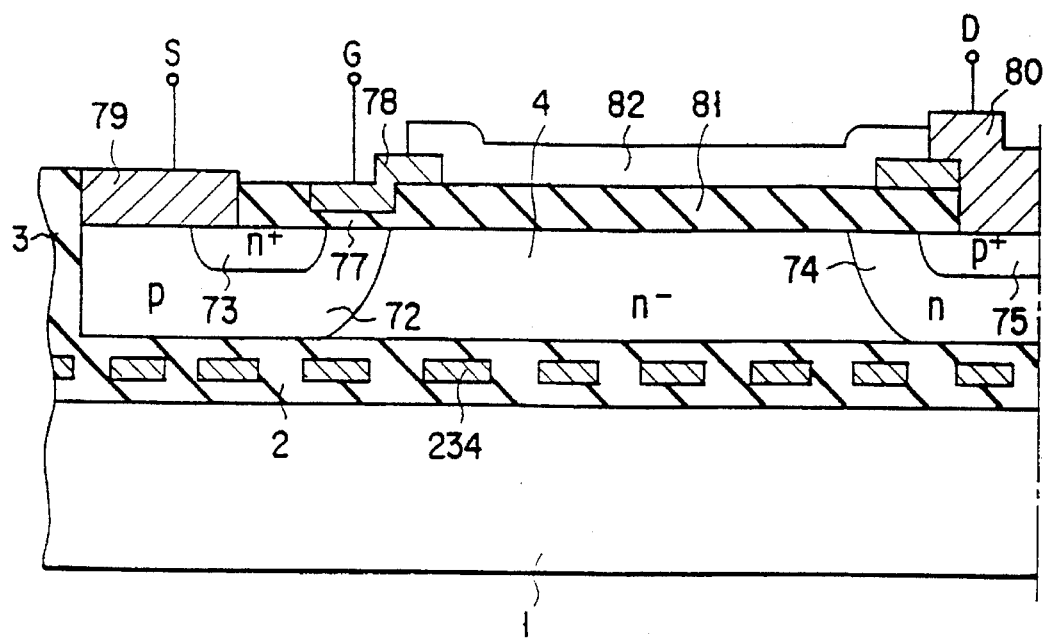
F I G. 15
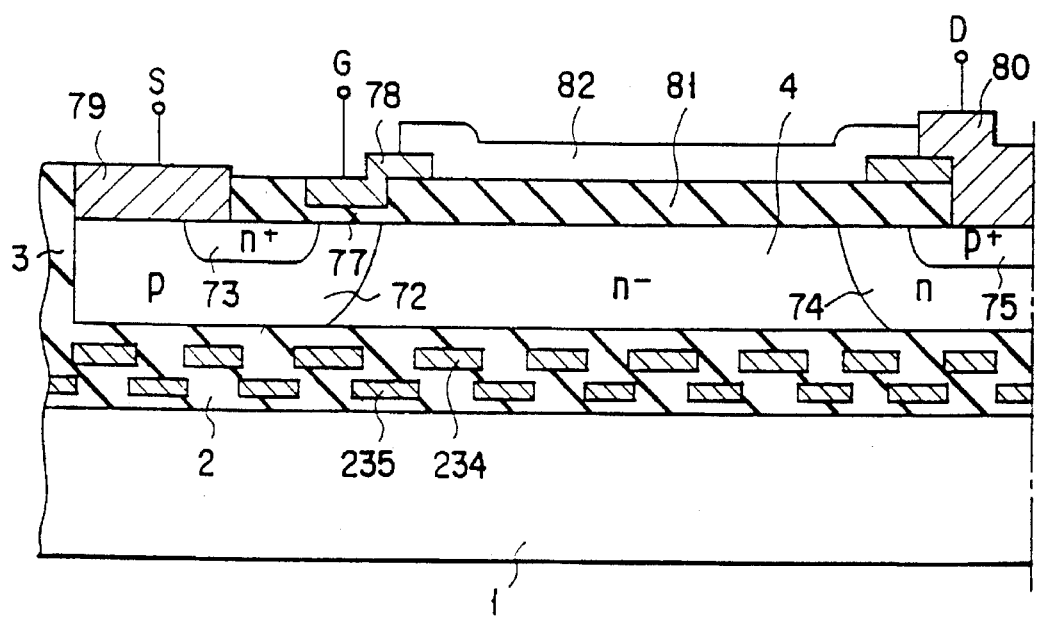
F I G. 16

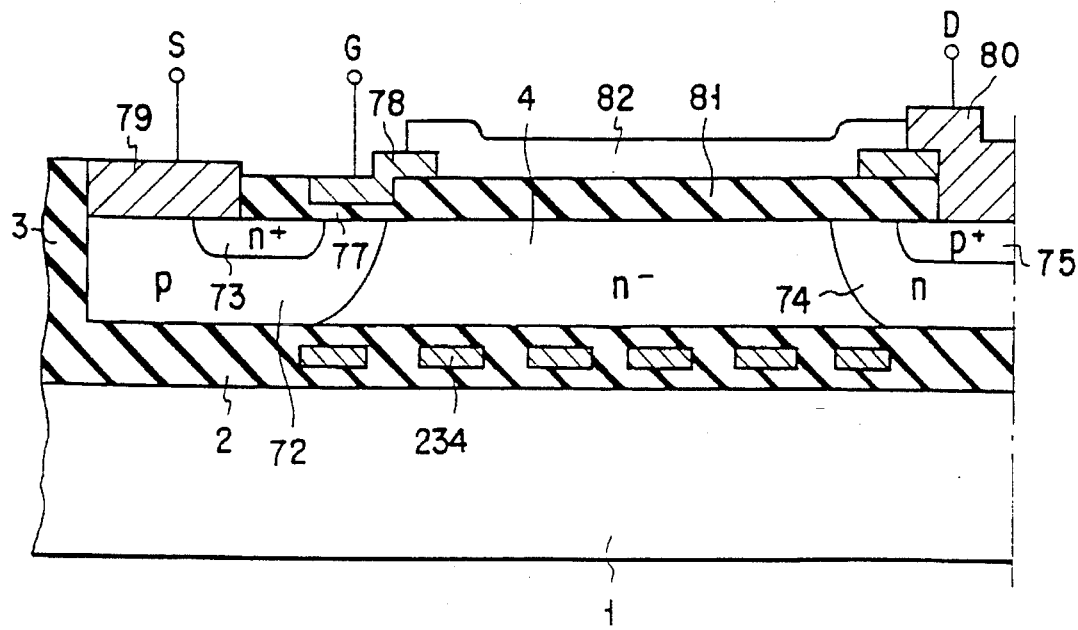
F I G. 18
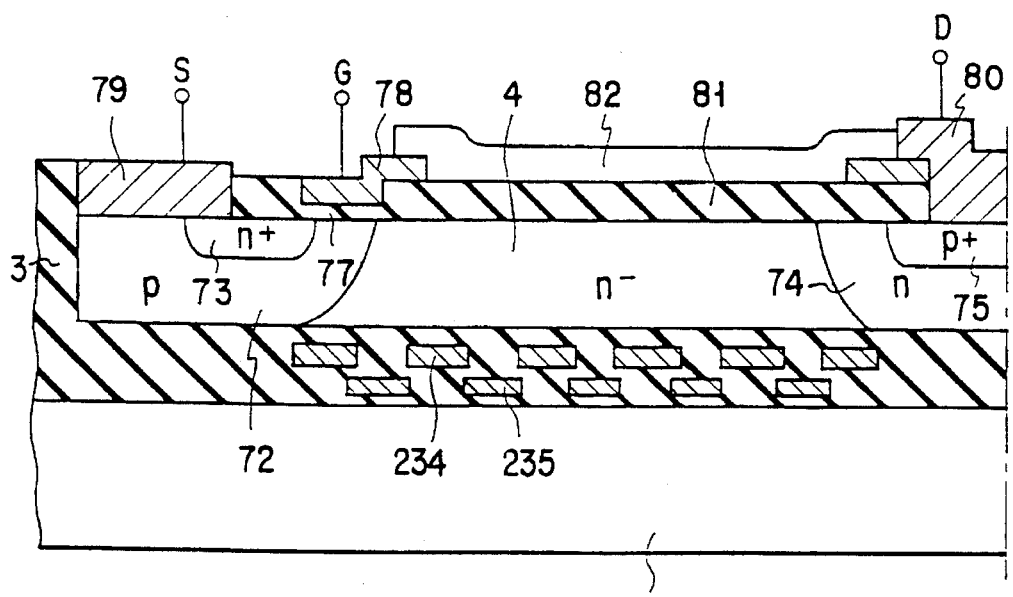
F I G. 19

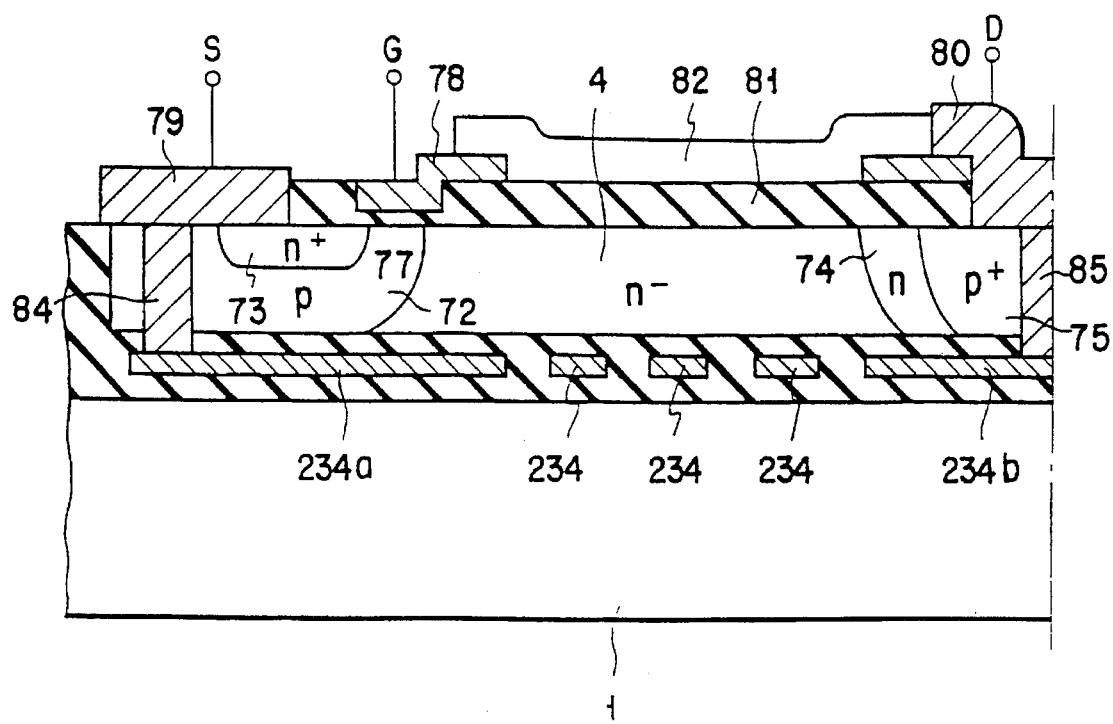
F I G. 20
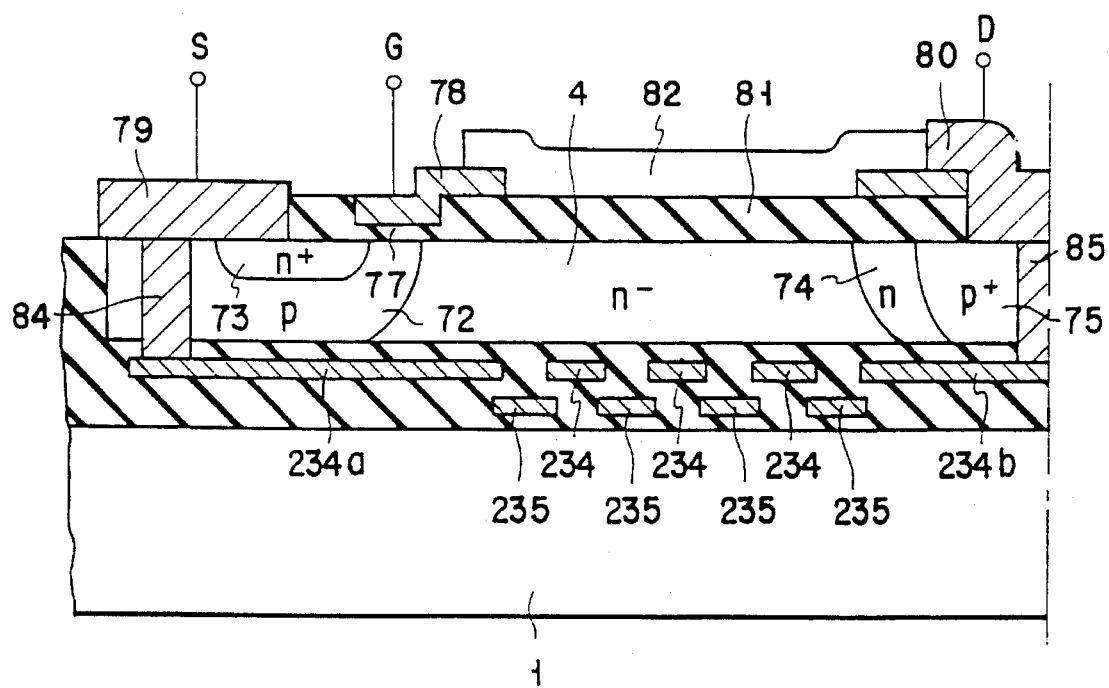
F I G. 21

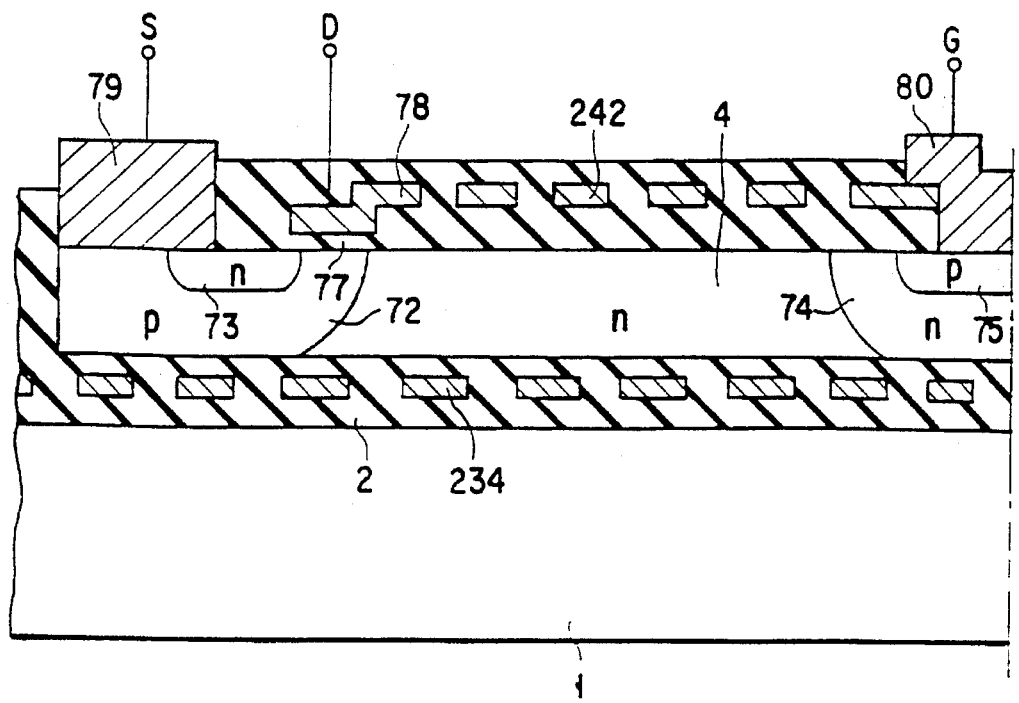
F I G. 24
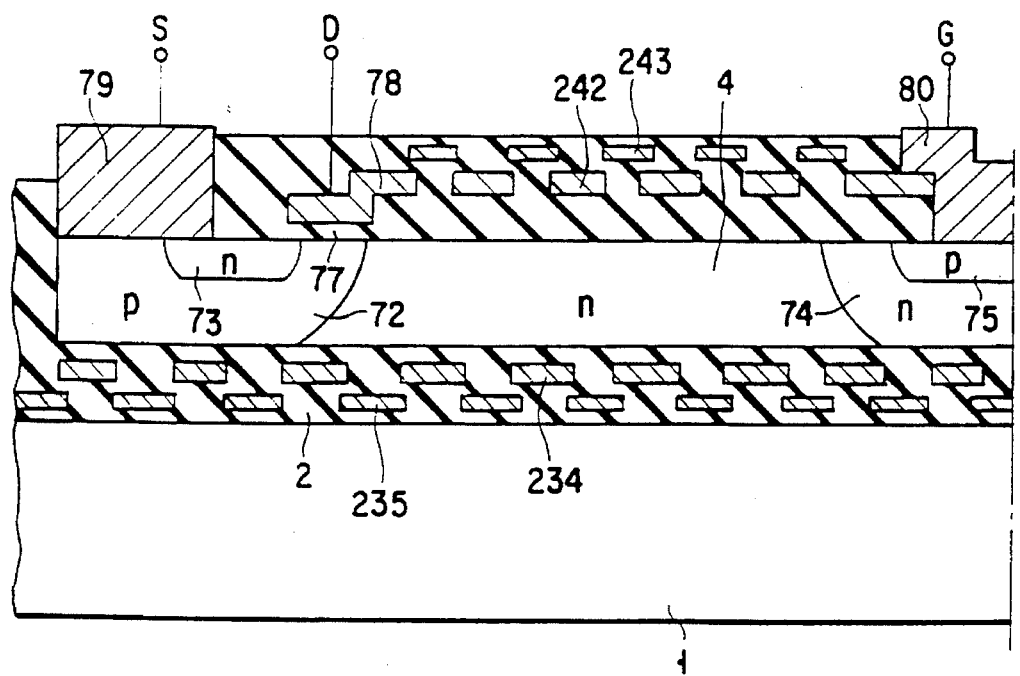
F I G. 25

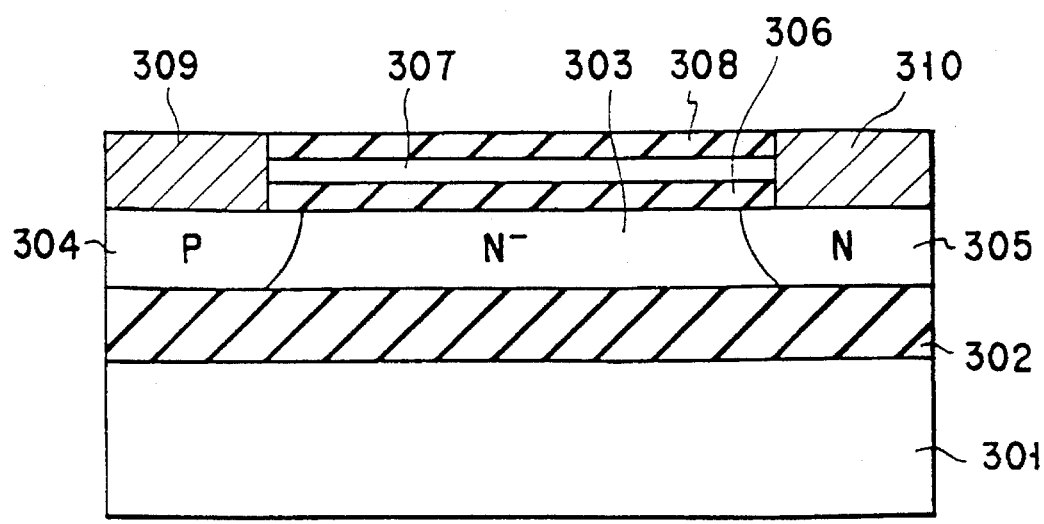
F I G. 26
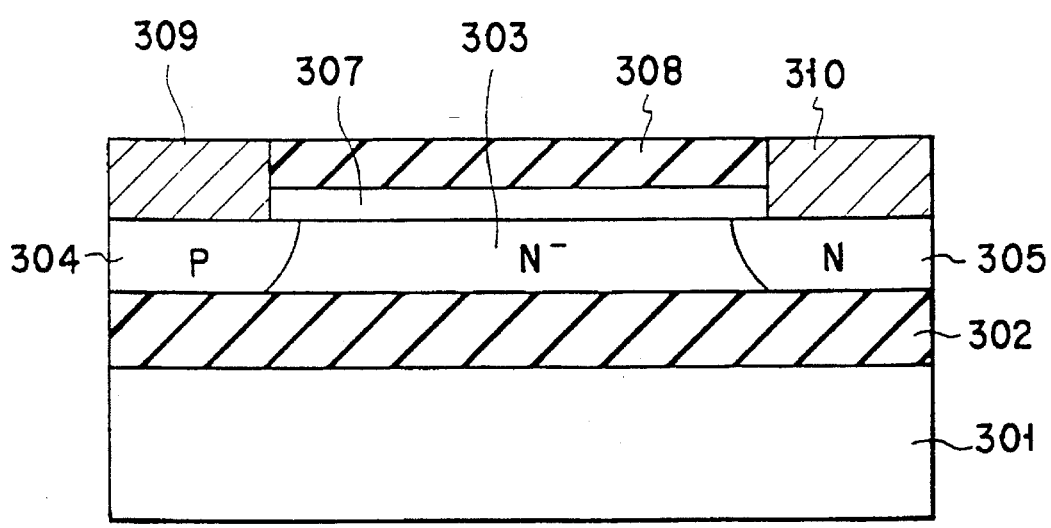
F I G. 27

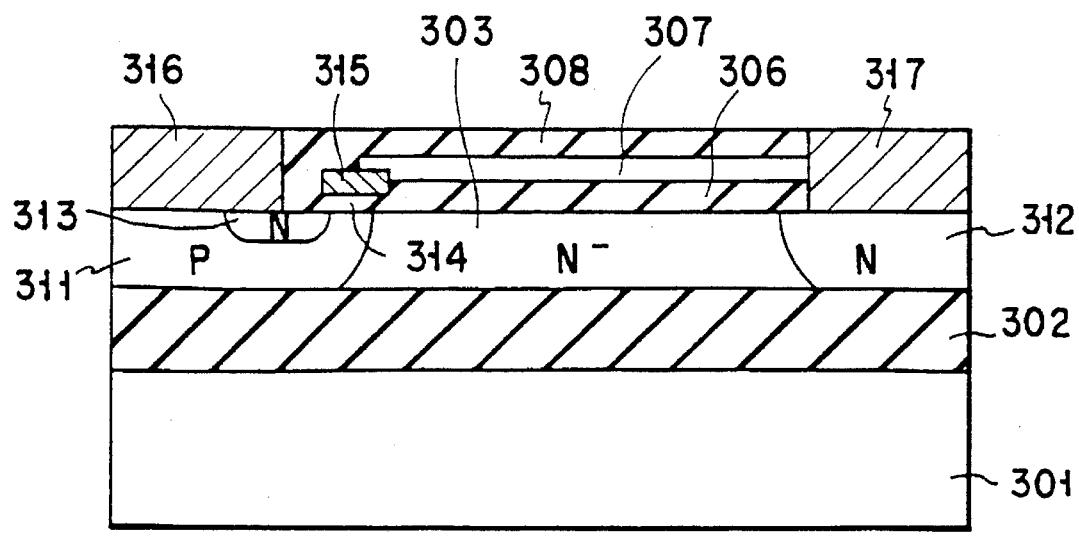
F I G. 28
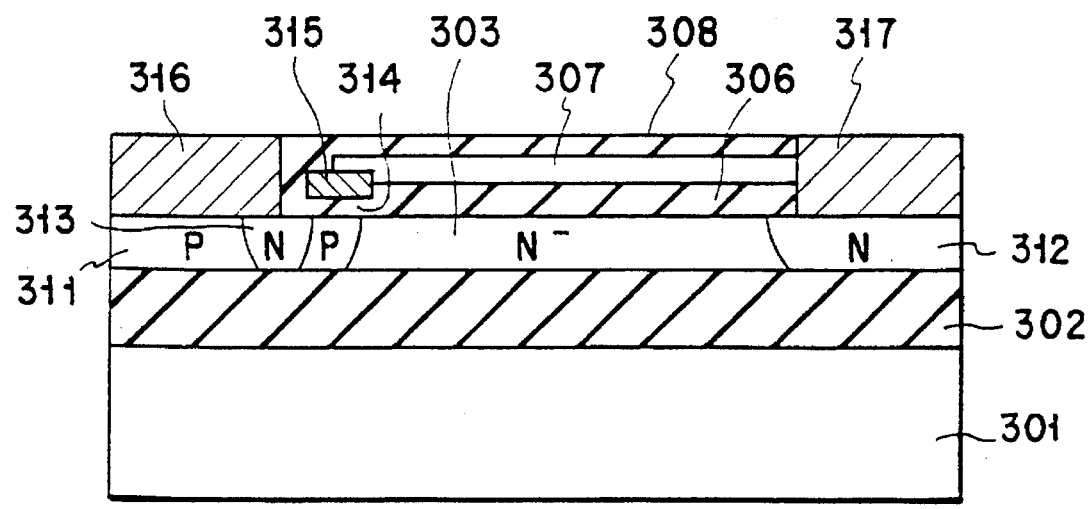
F I G. 29

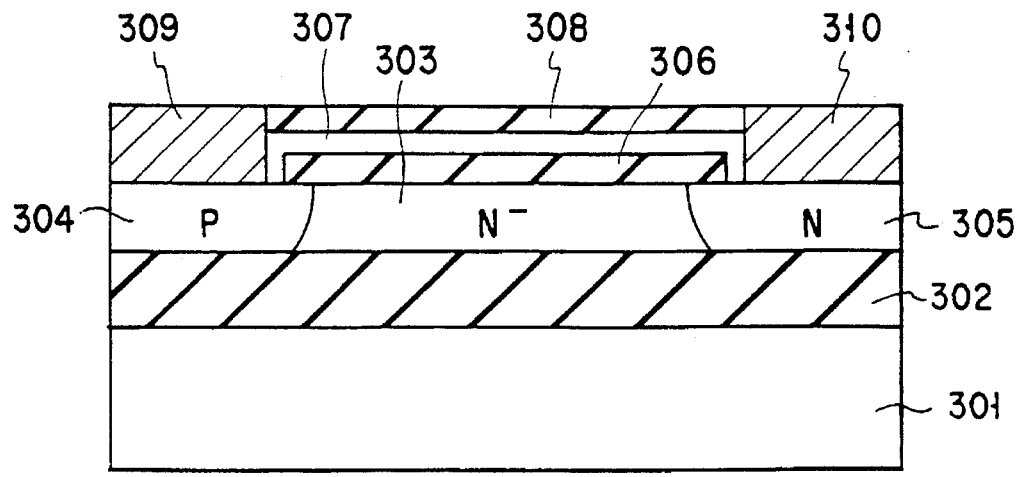
F I G. 36
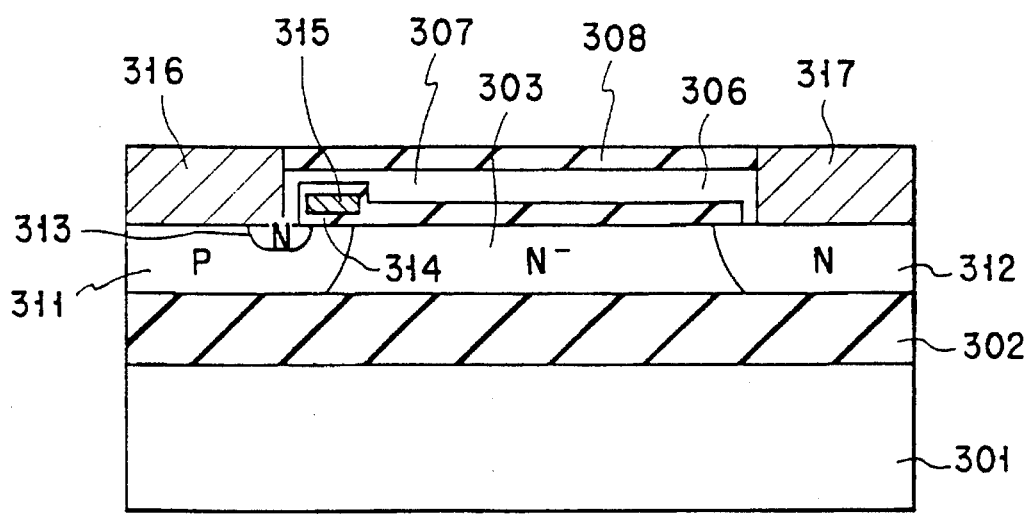
F I G. 37

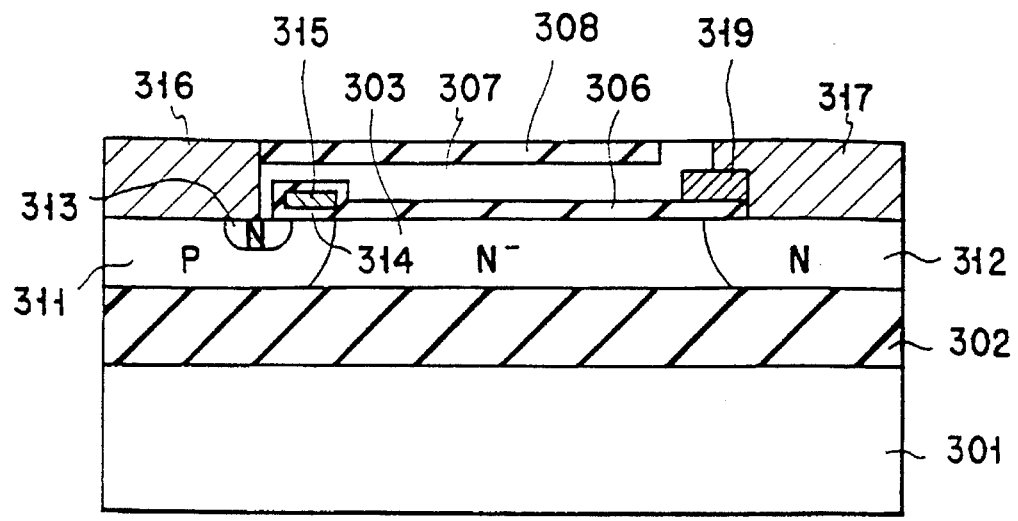
F I G. 38
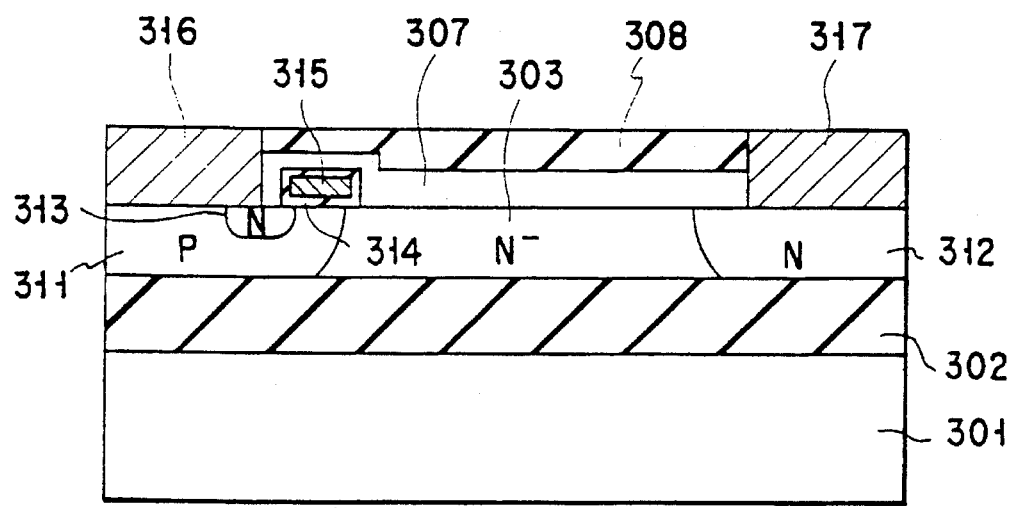
F I G. 39

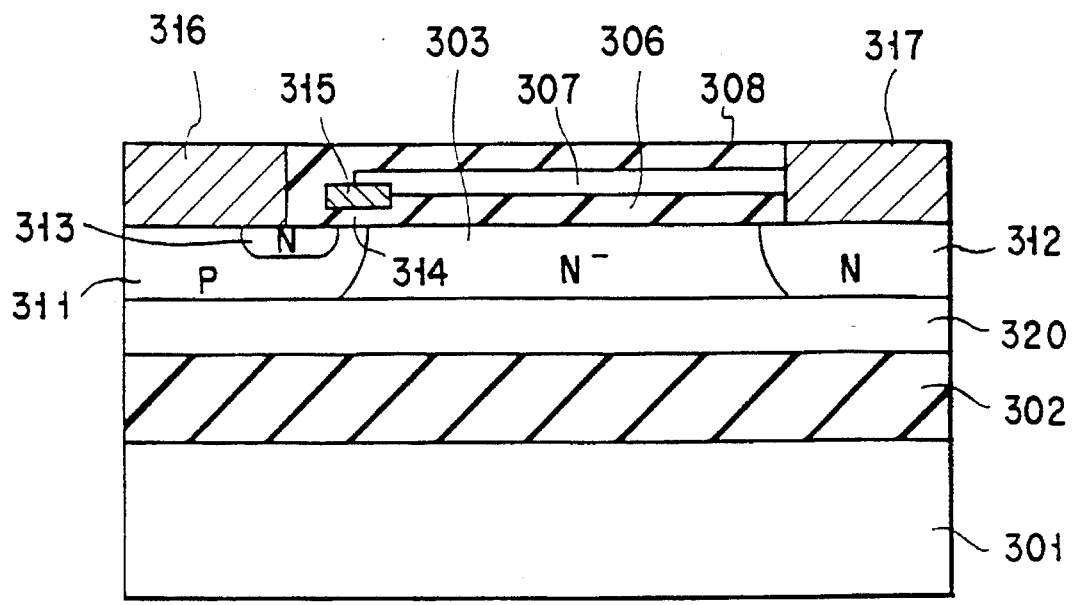
F I G. 42
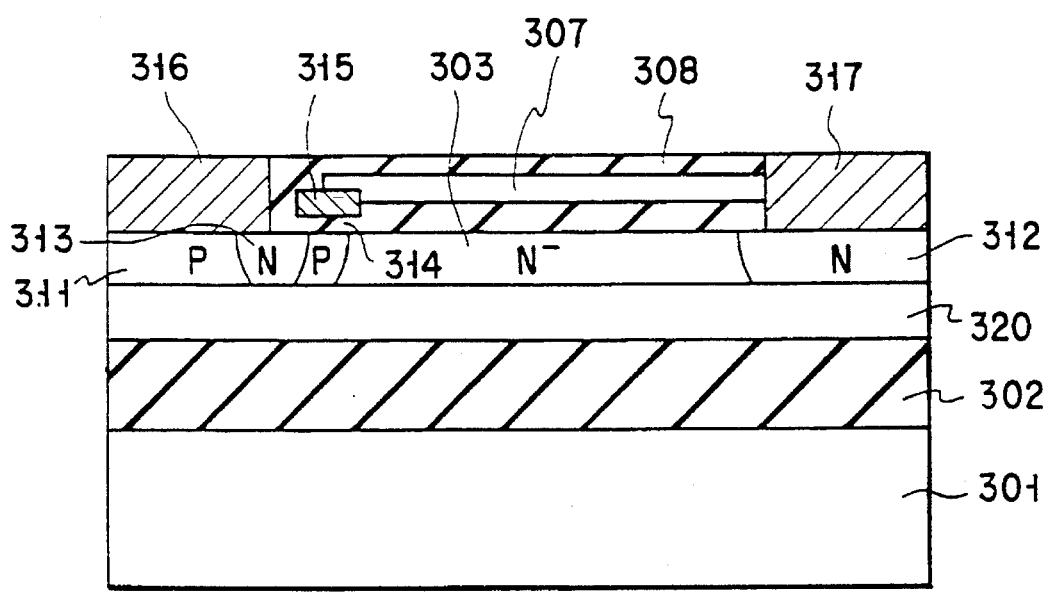
F I G. 43

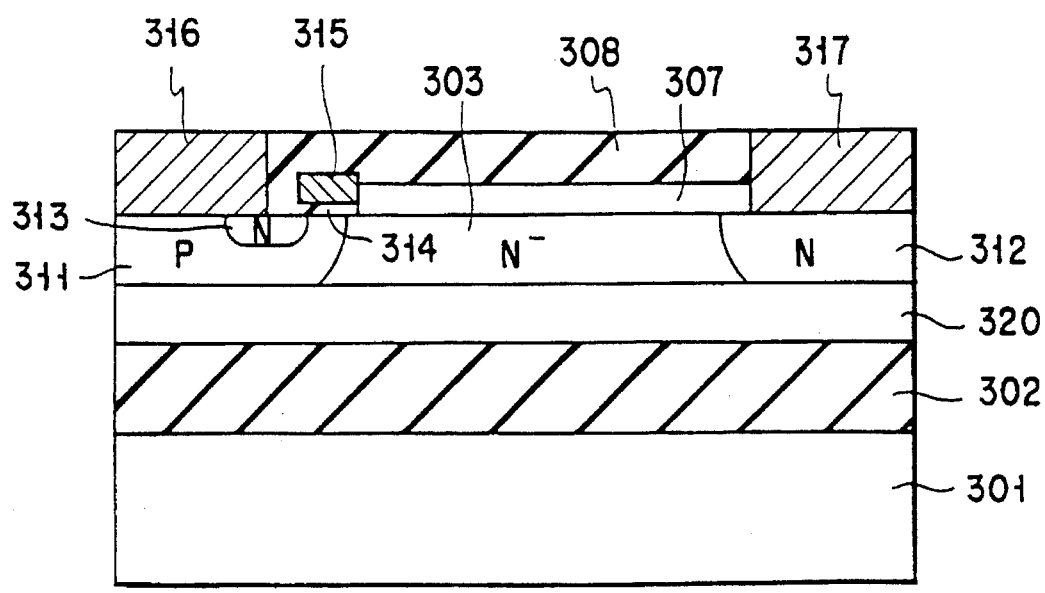
F I G. 44
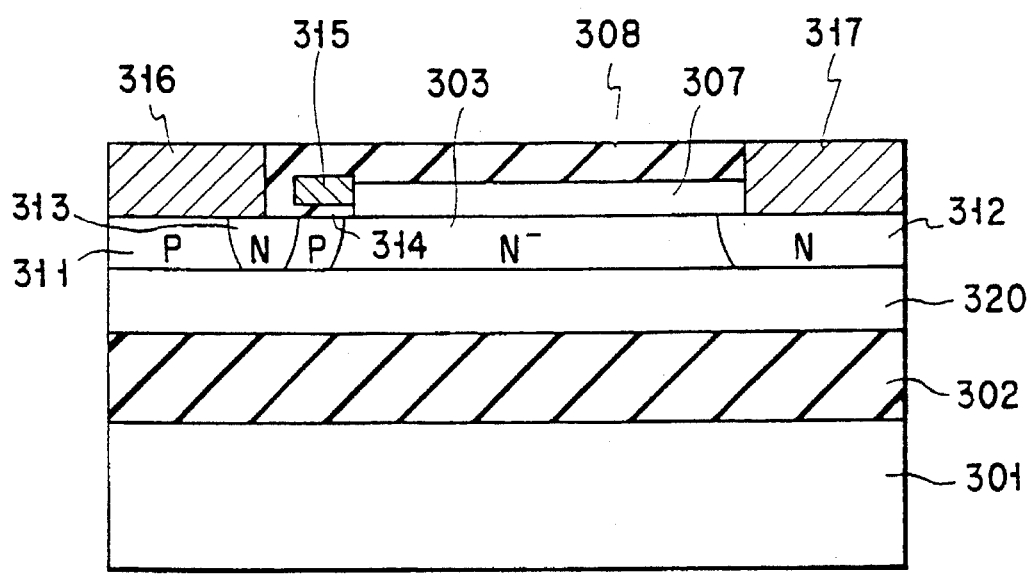
F I G. 45

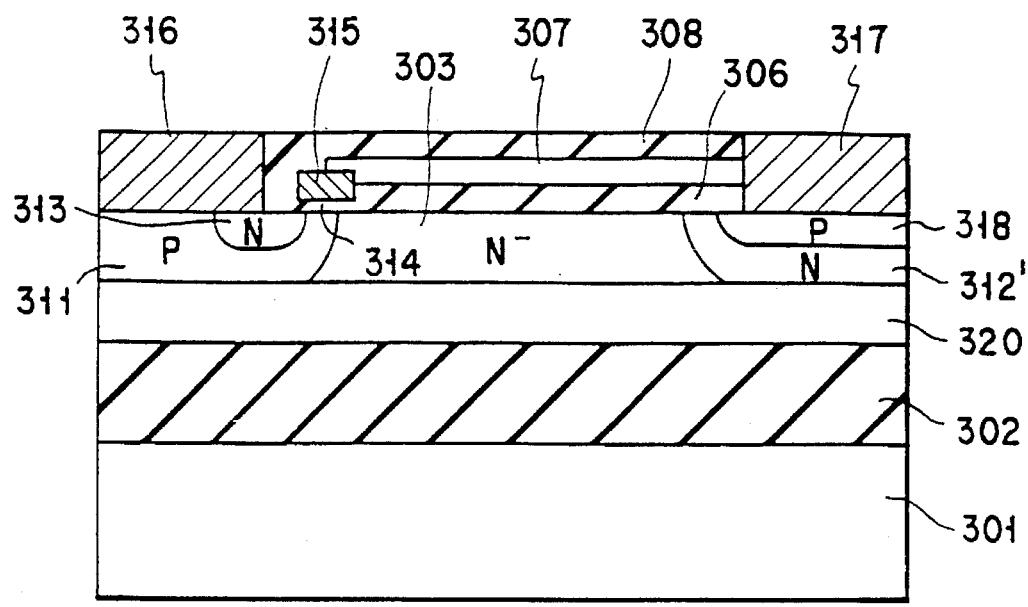
F I G. 46
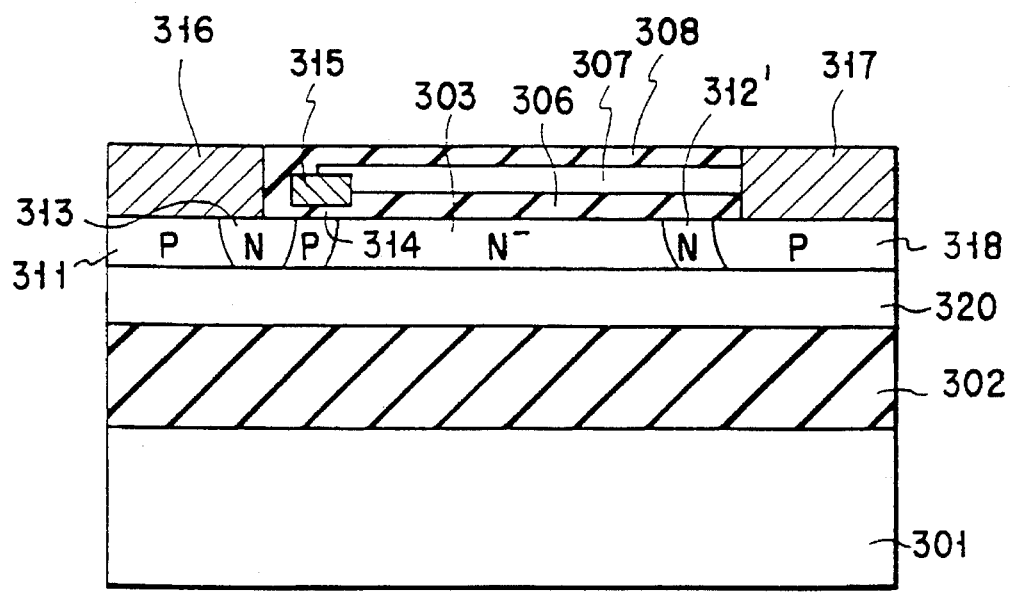
F I G. 47

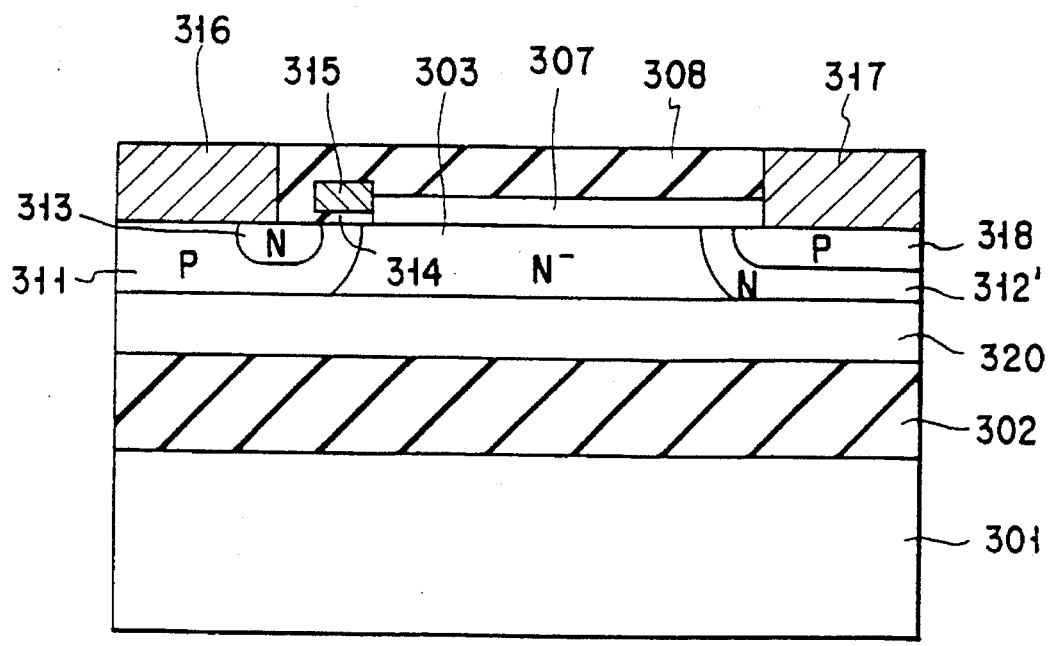
F I G. 48
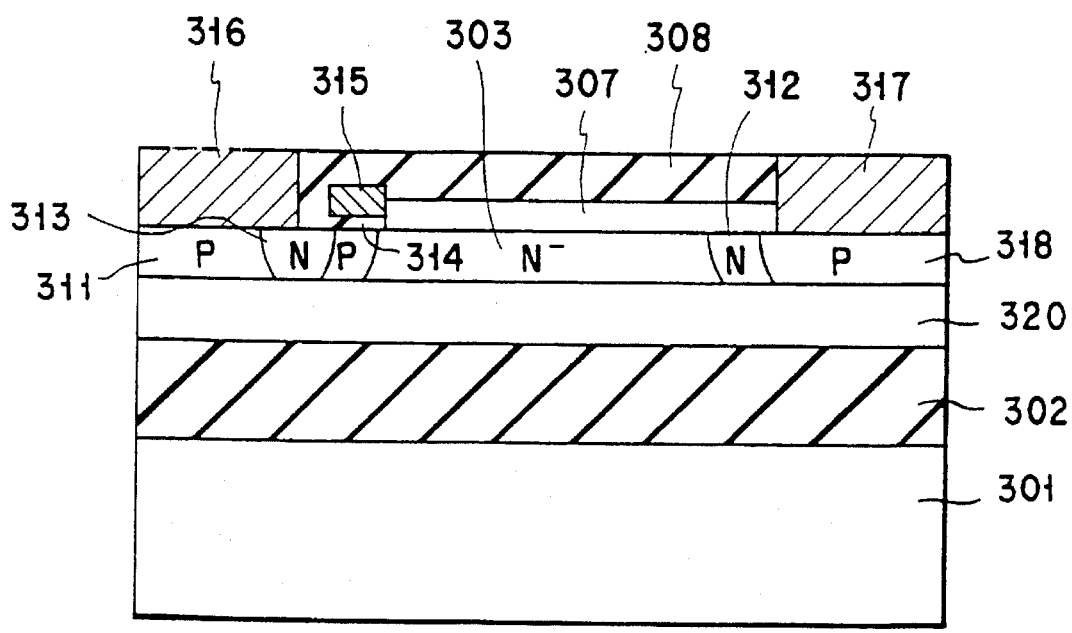
F I G. 49

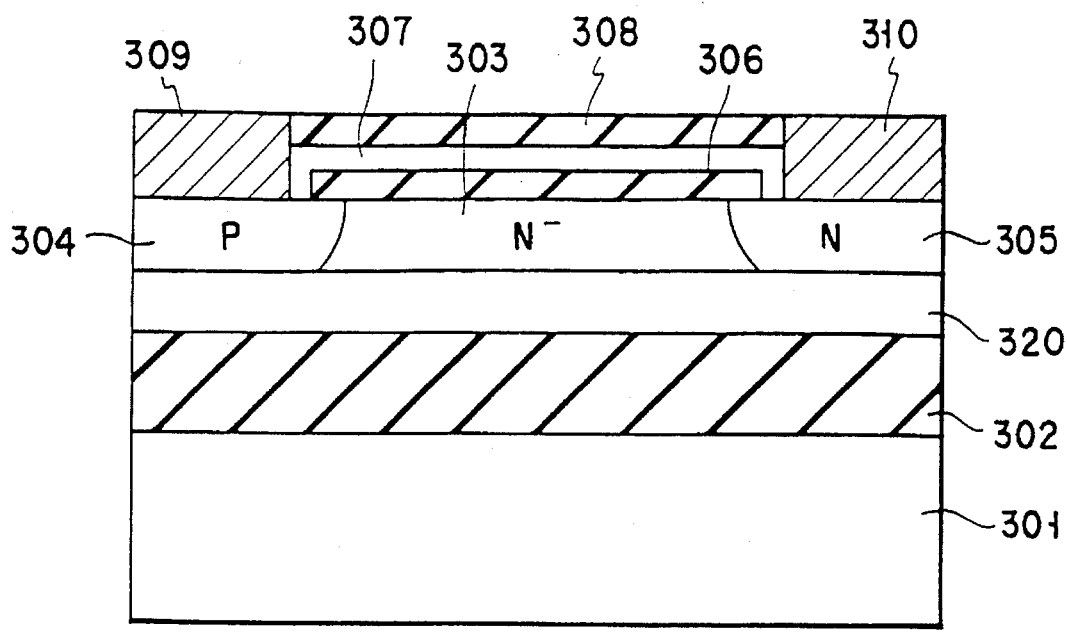
F I G. 50
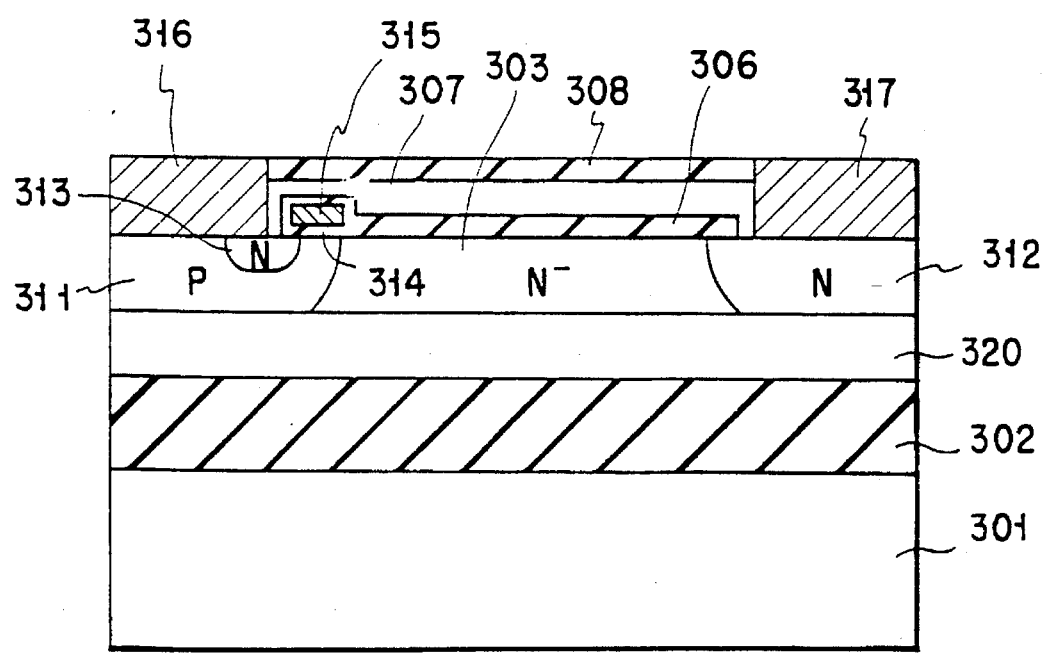
F I G. 51

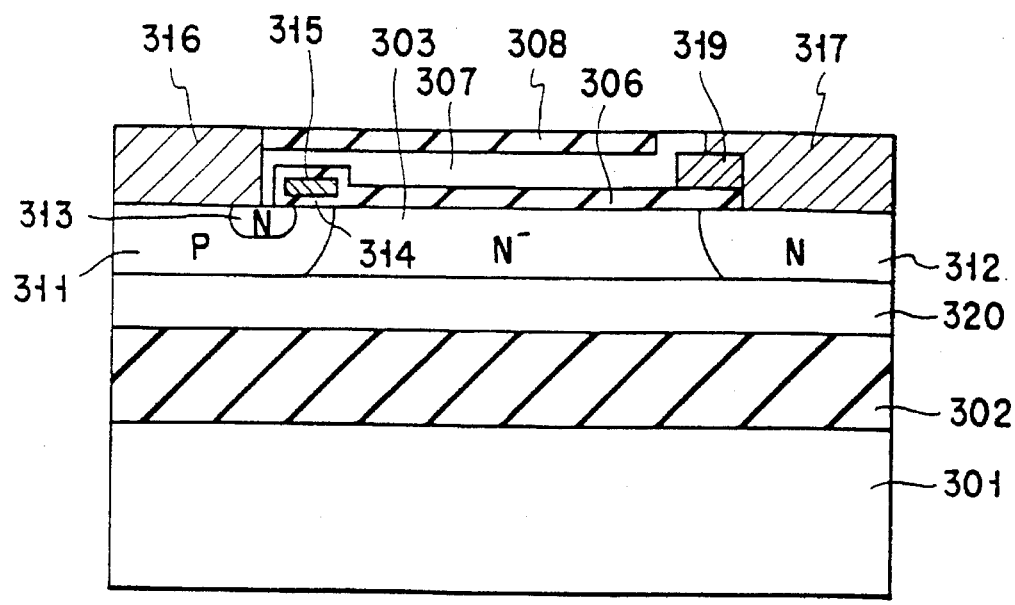
F I G. 52
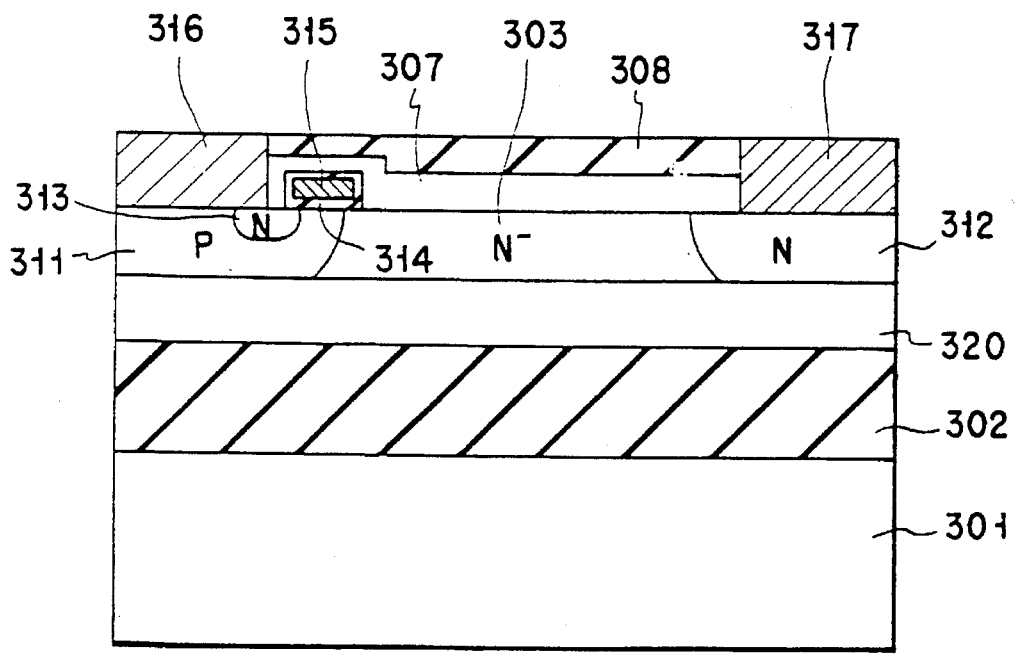
F I G. 53

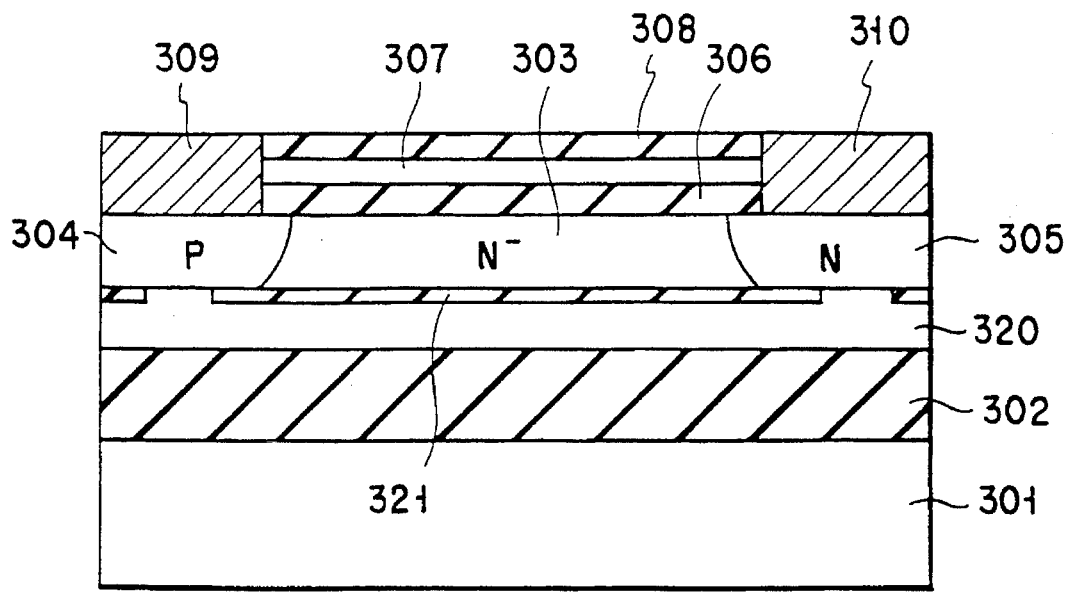
F I G. 54
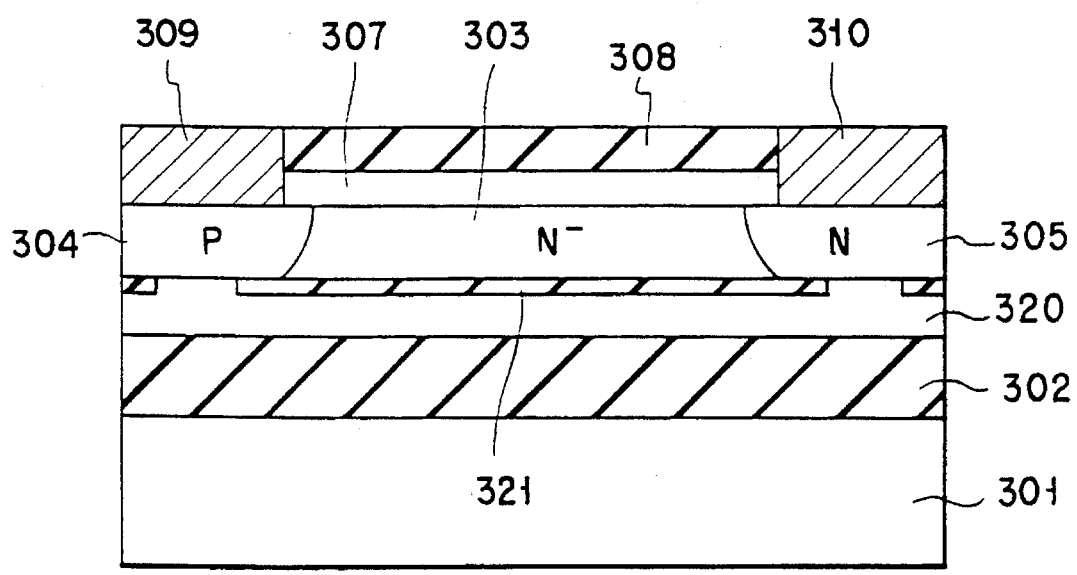
F I G. 55

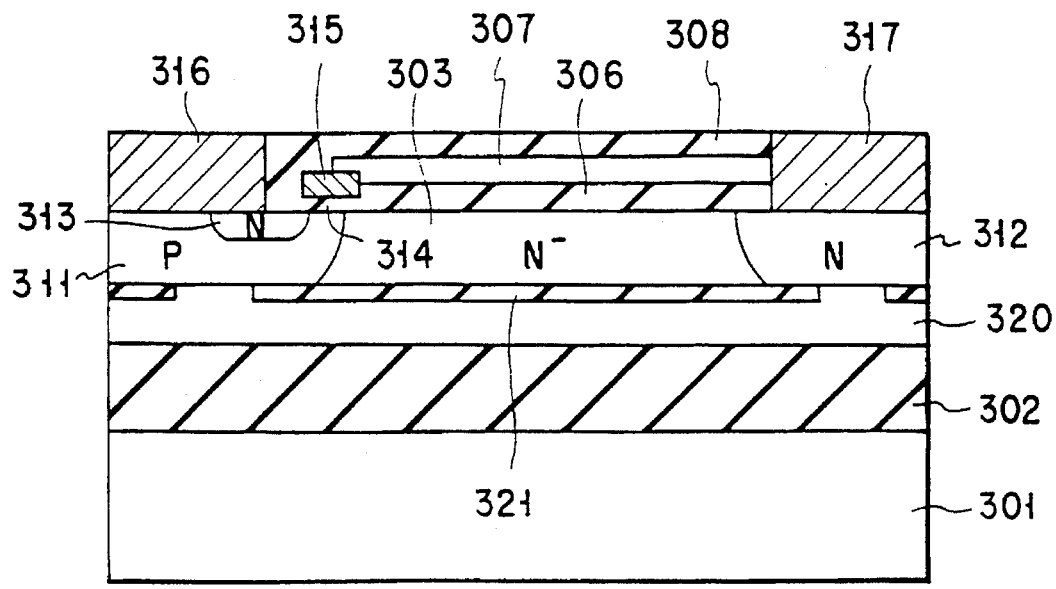
F I G. 56
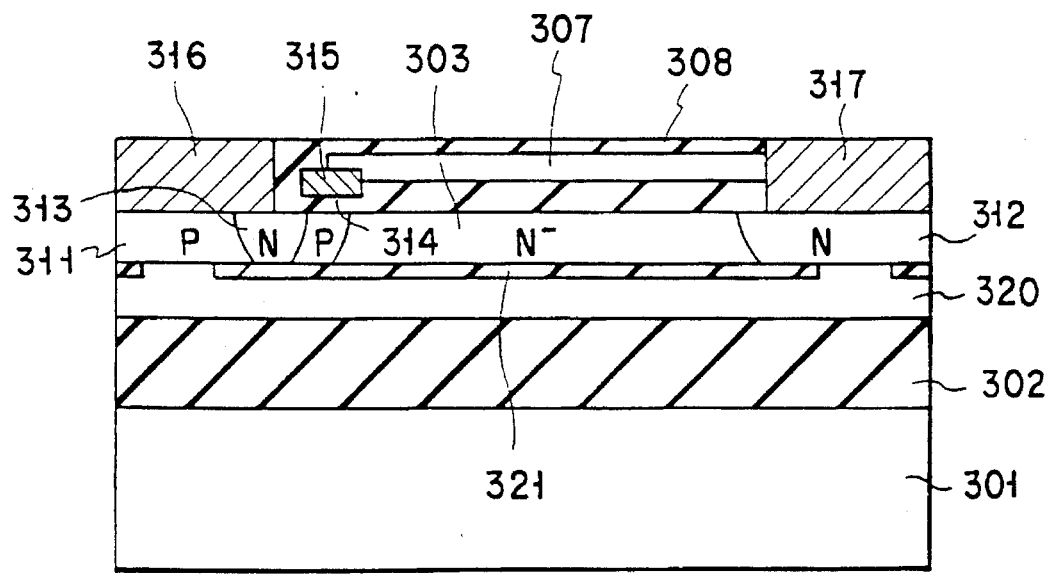
F I G. 57

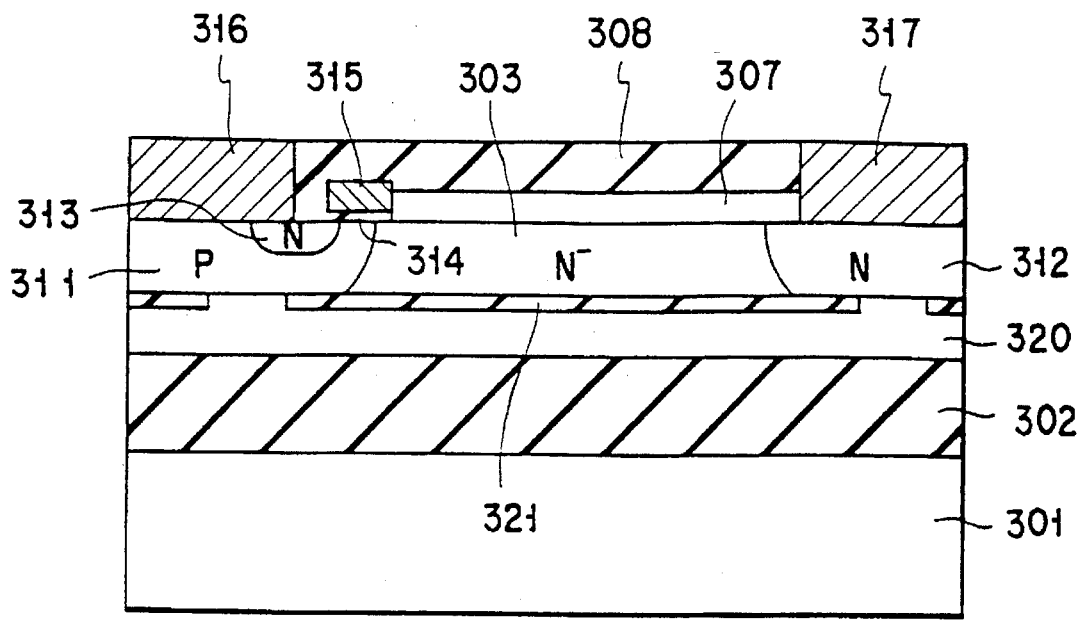
F I G. 58
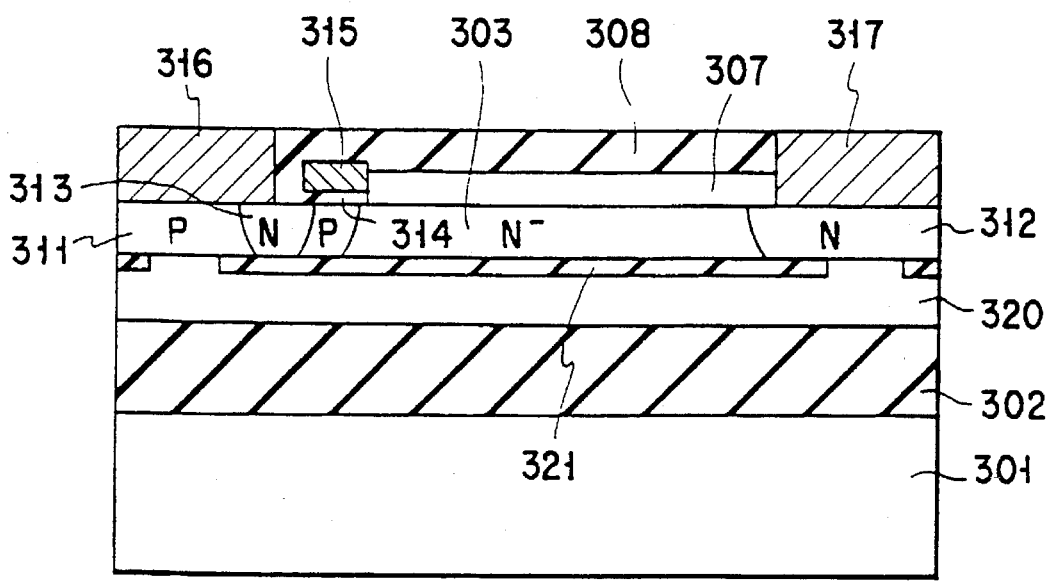
F I G. 59

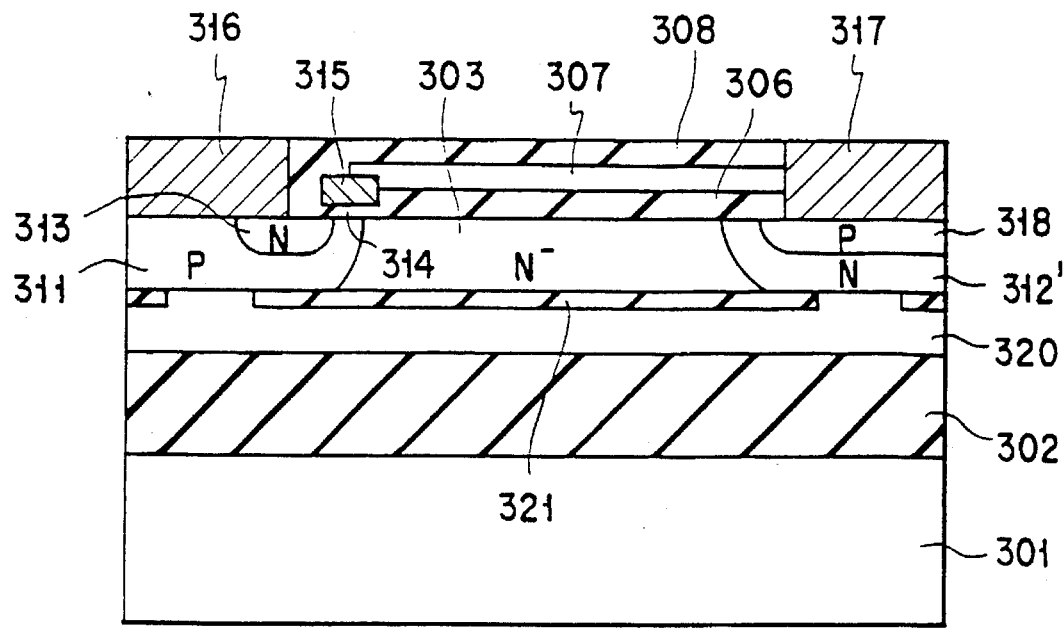
F I G. 60
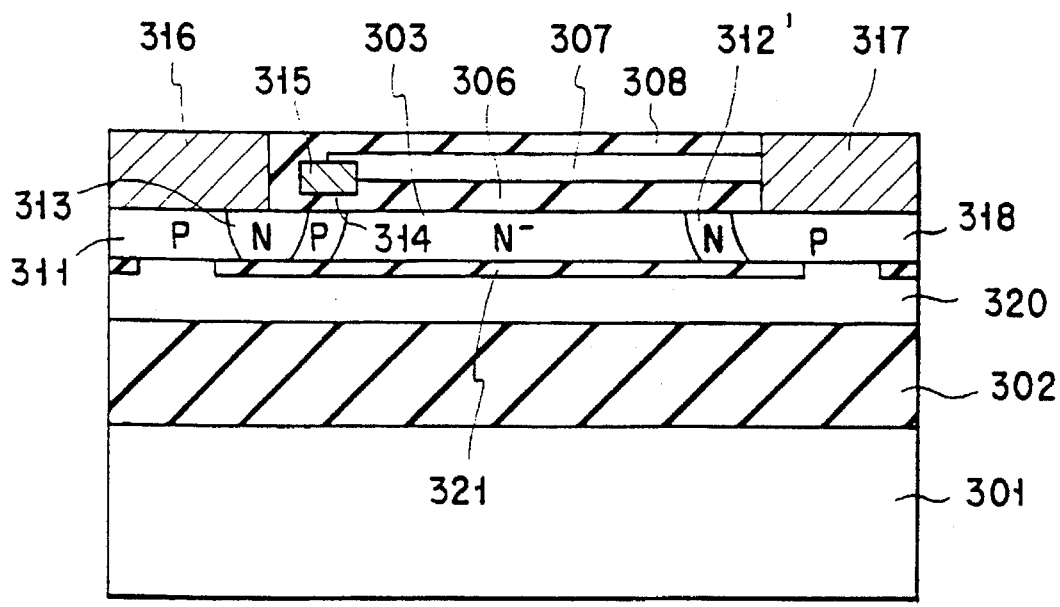
F I G. 61

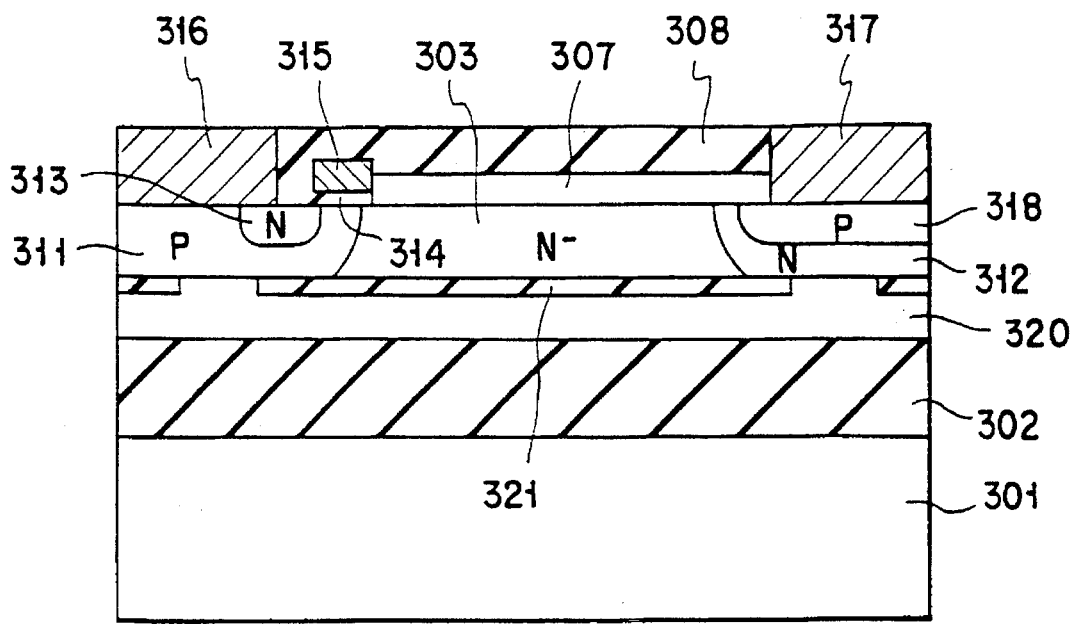
F I G. 62
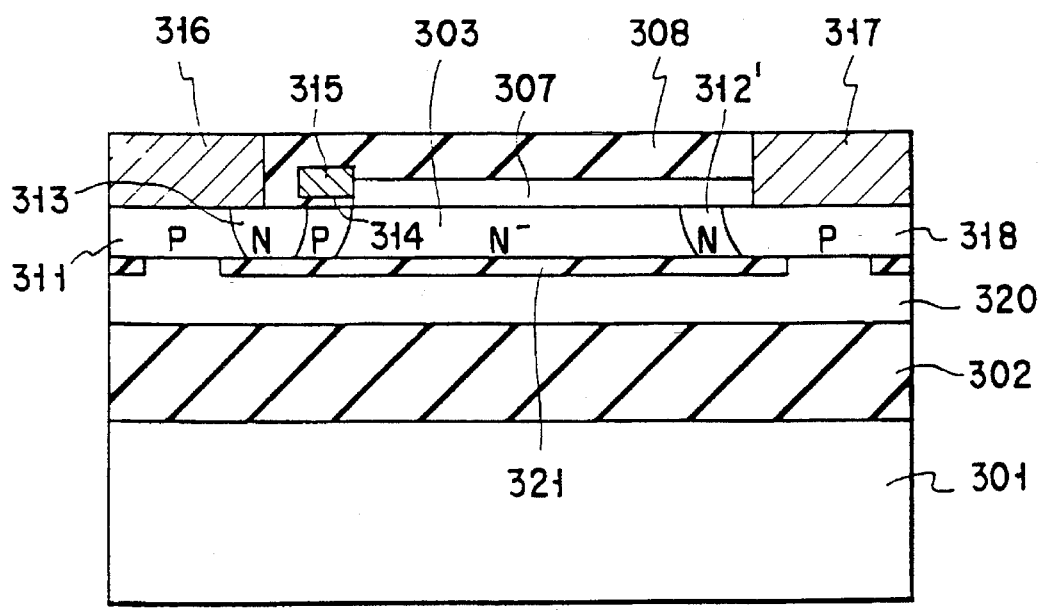
F I G. 63

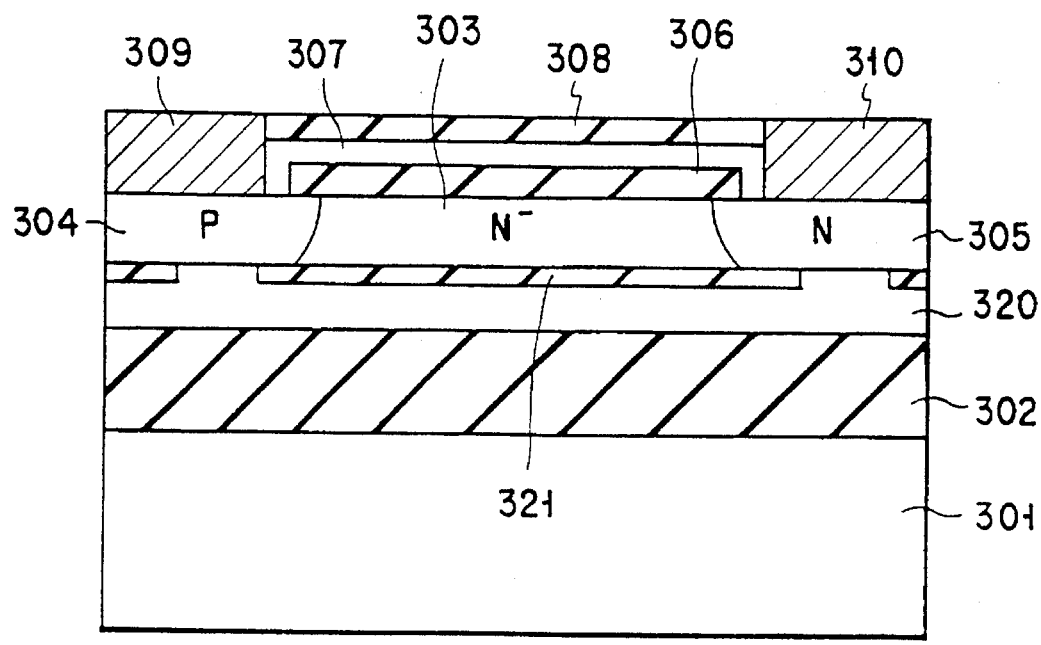
F I G. 64
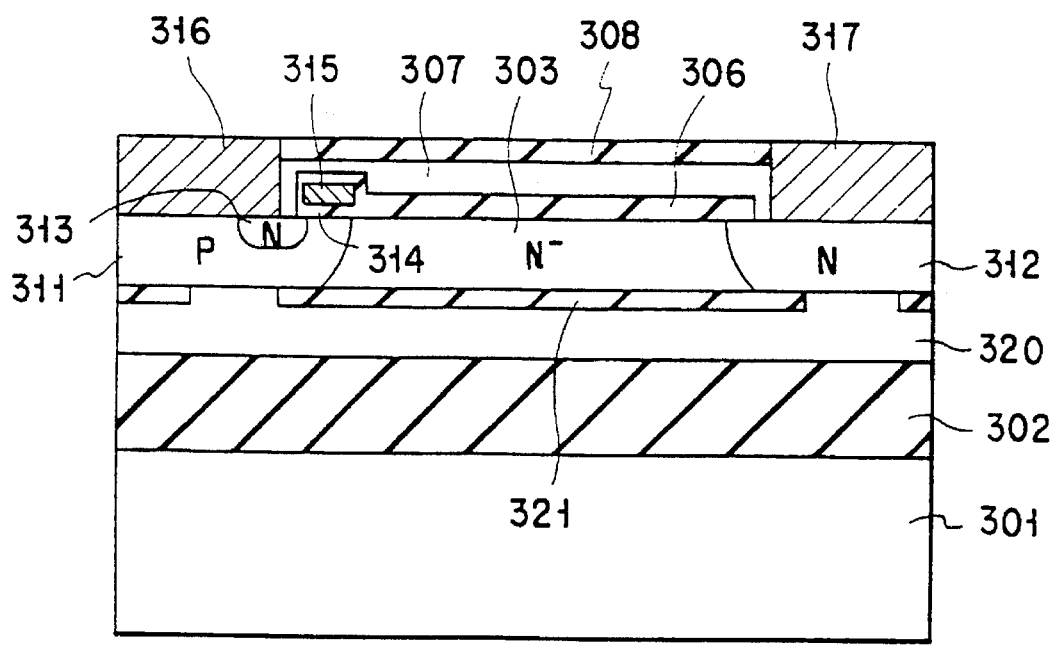
F I G. 65

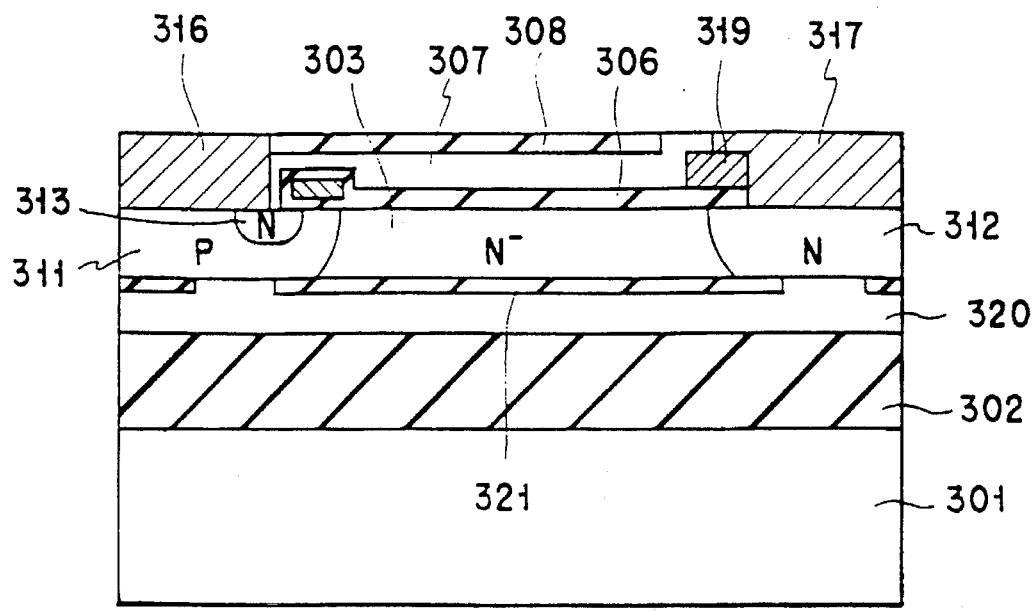
F I G. 66
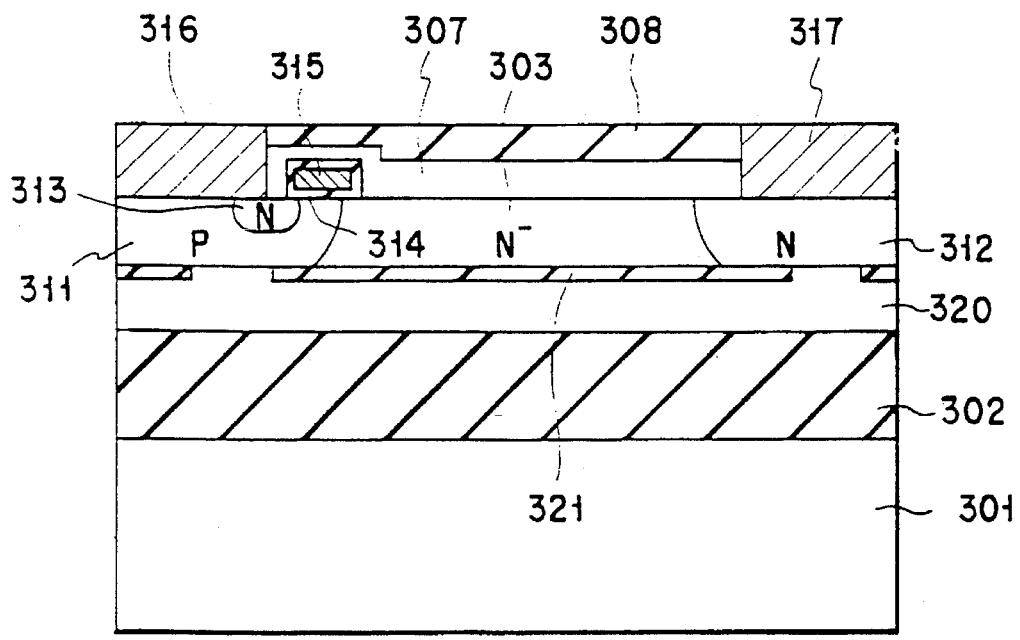
F I G. 67

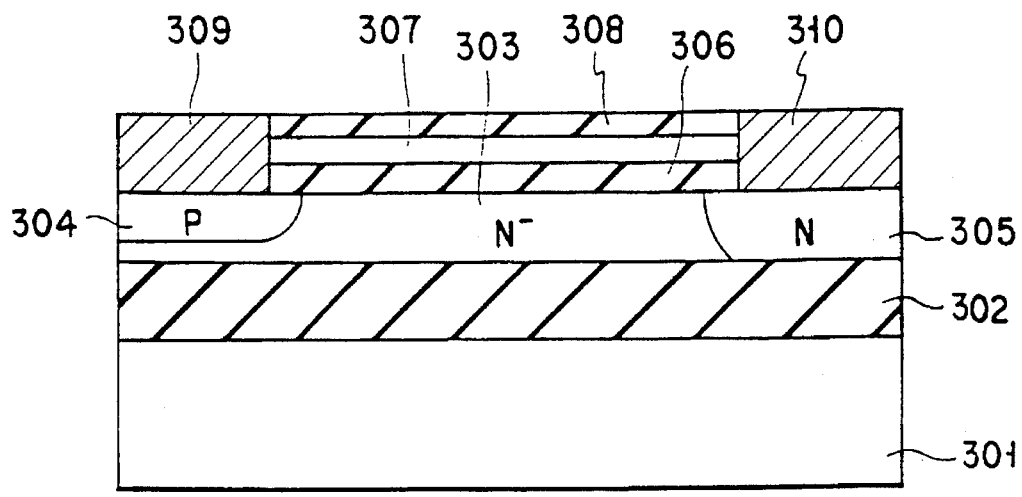
F I G. 68
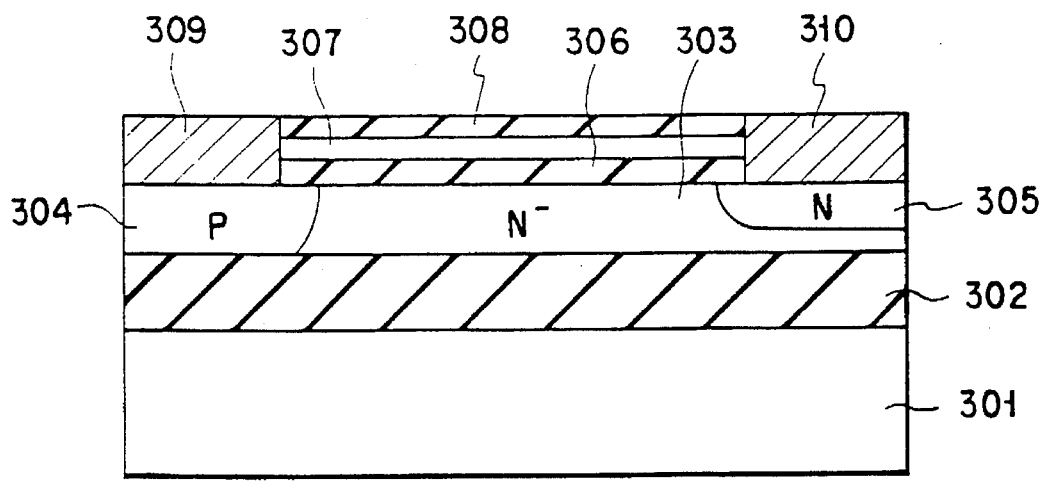
F I G. 69

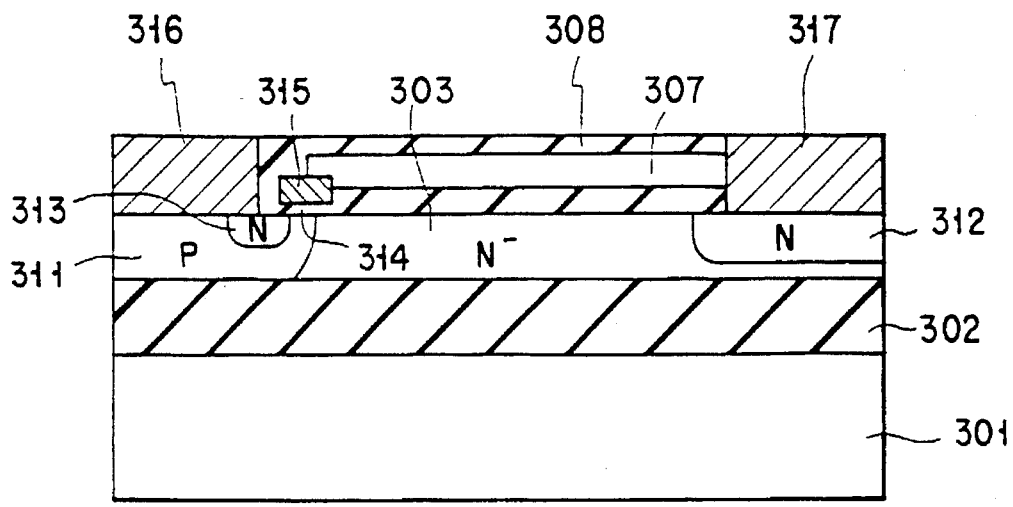
F I G. 70
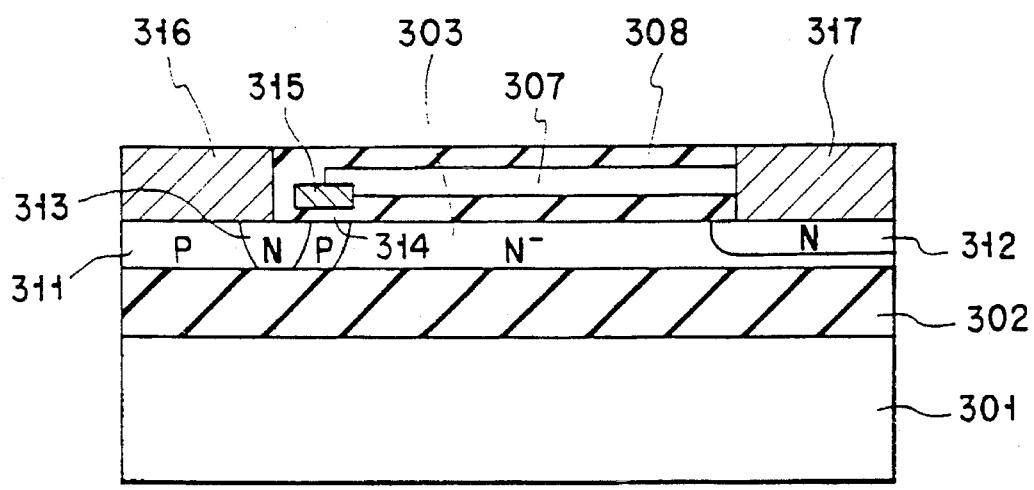
F I G. 71

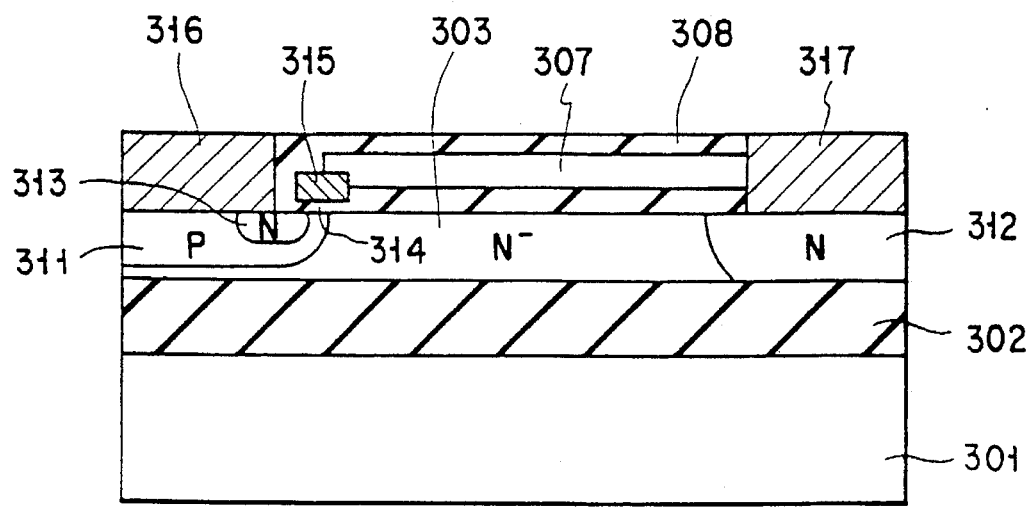
F I G. 72
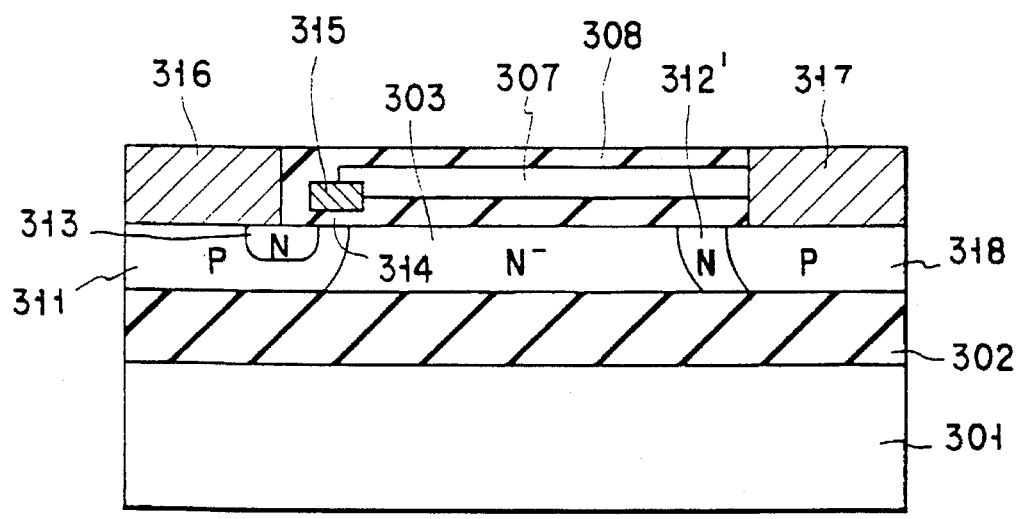
F I G. 73

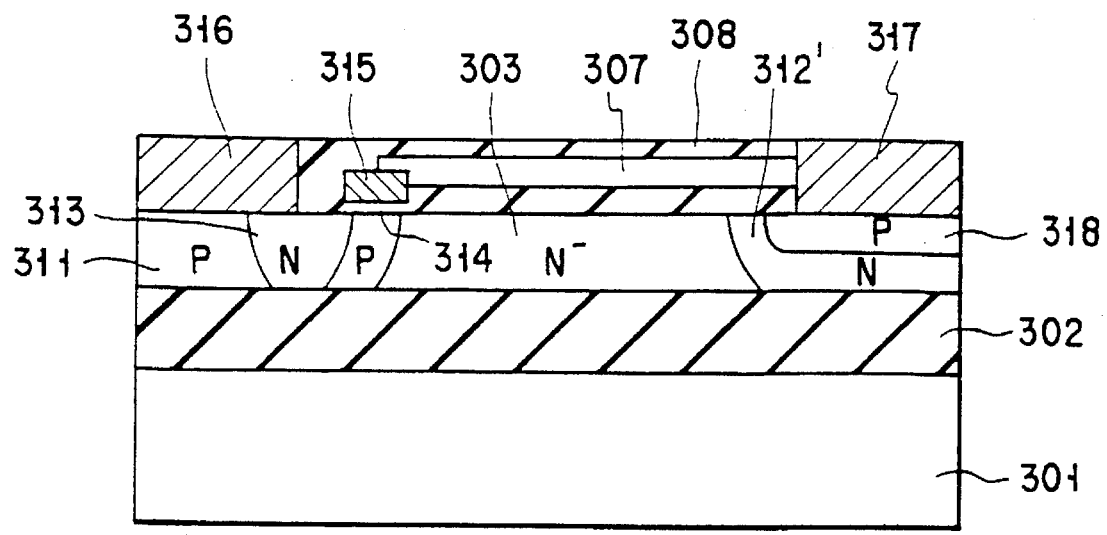
F I G. 74
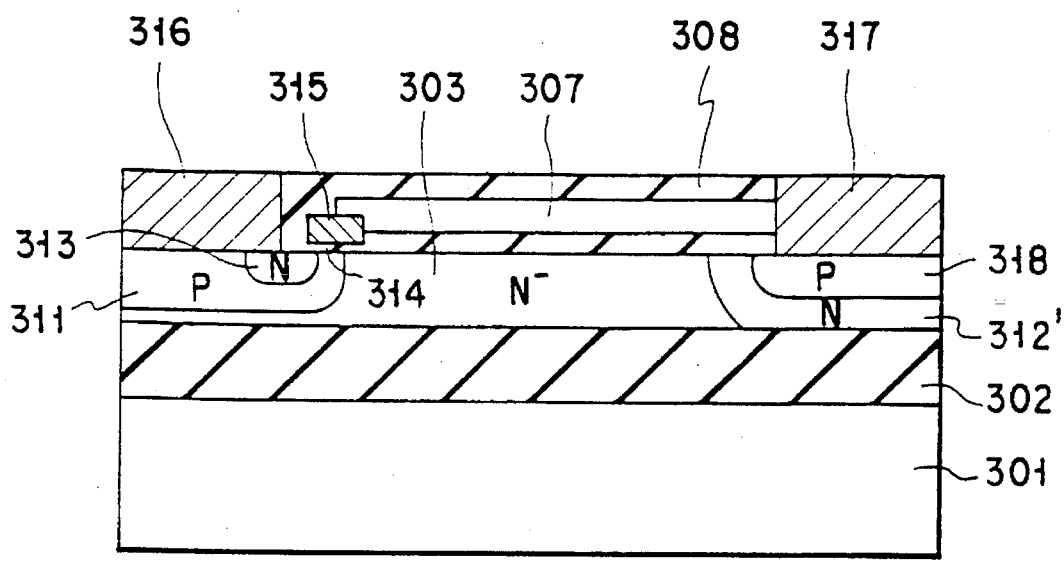
F I G. 75

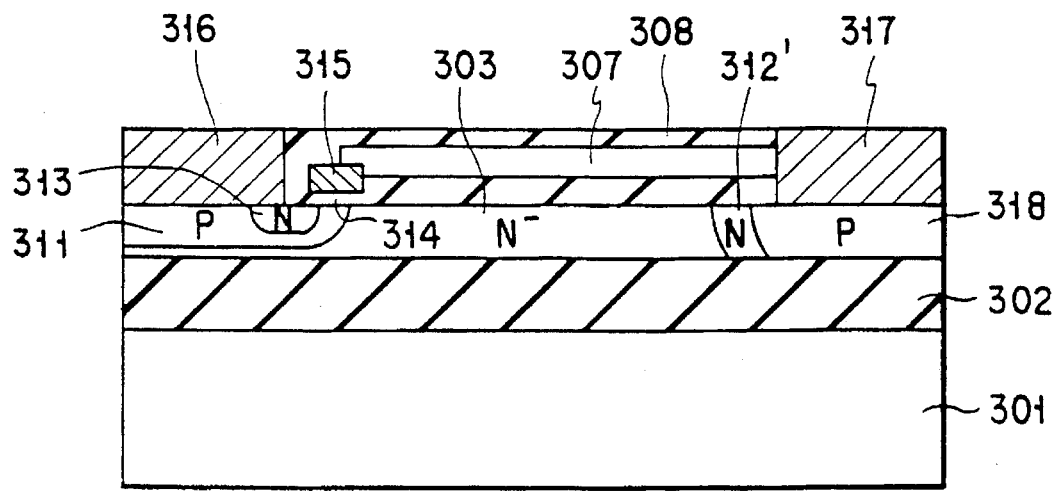
F I G. 76
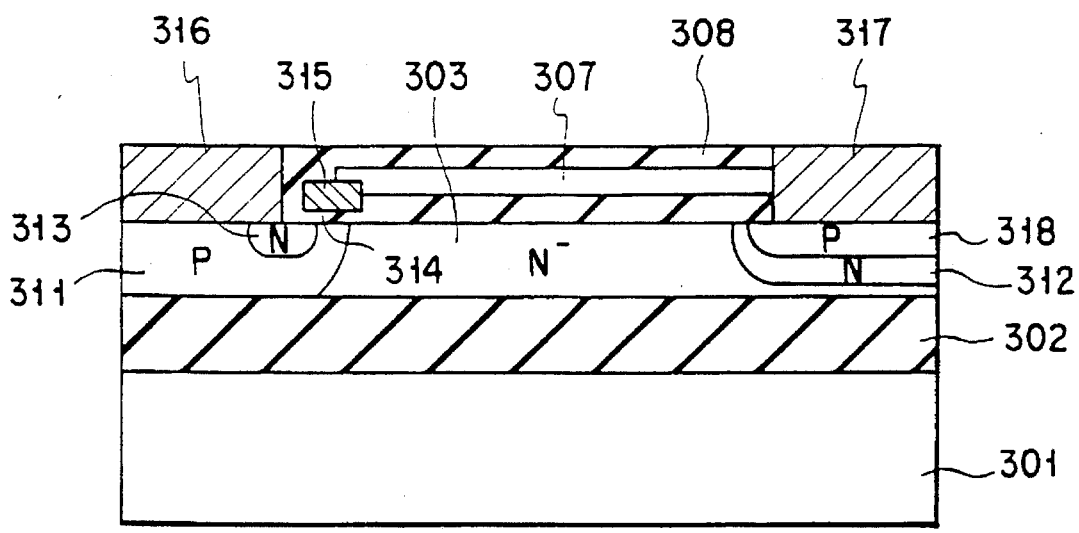
F I G. 77

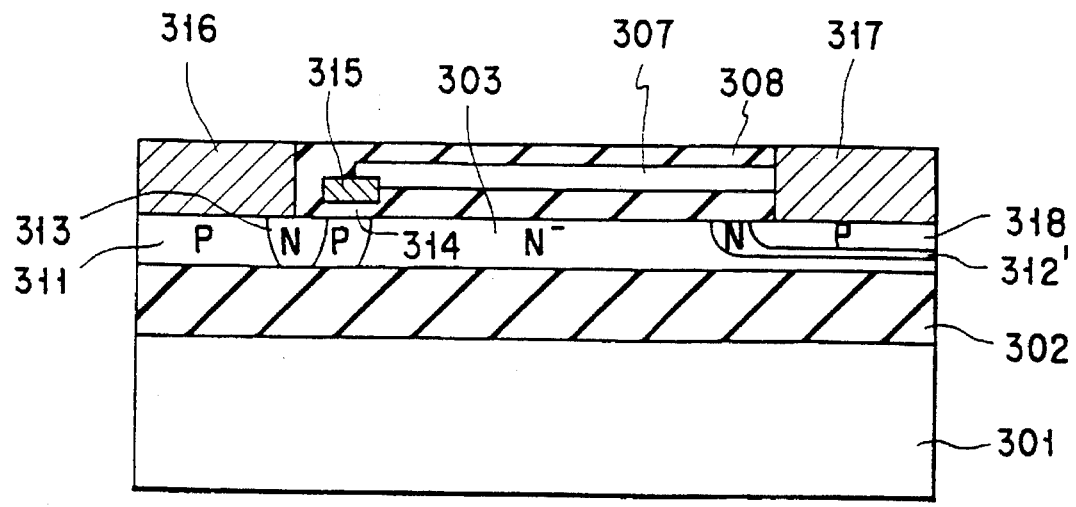
F I G. 78
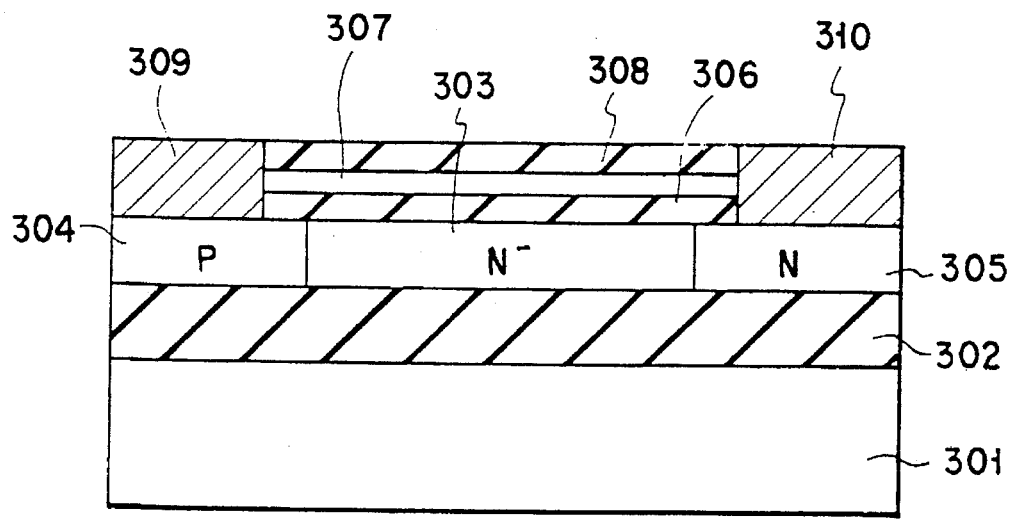
F I G. 79

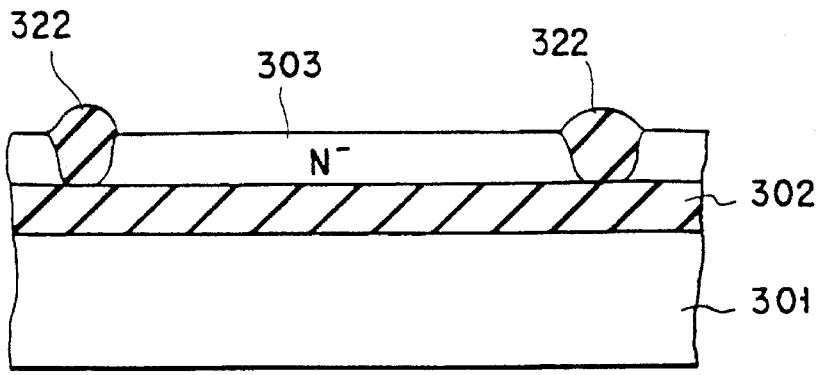
F I G. 80A
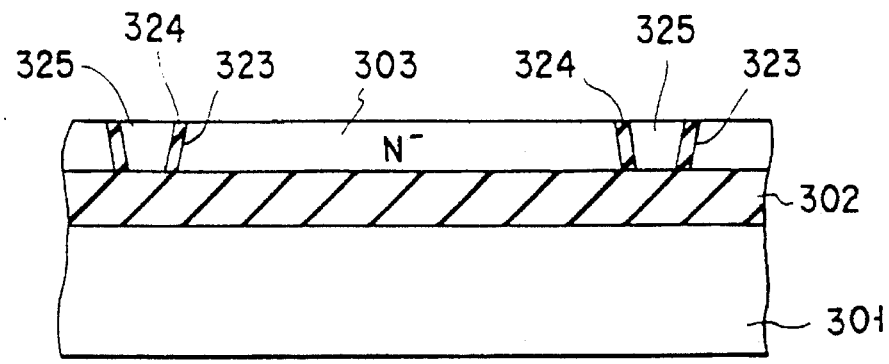
F I G. 80B
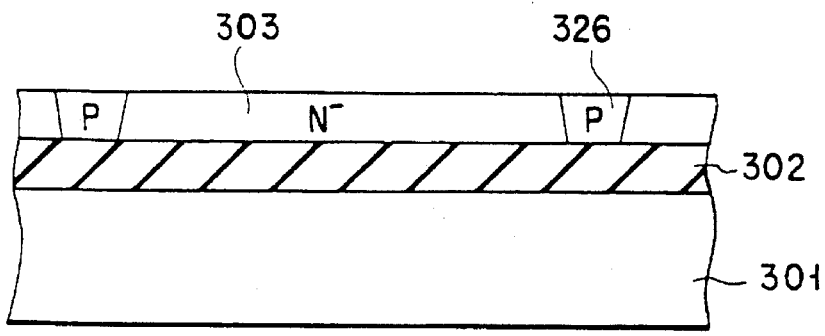
F I G. 80C

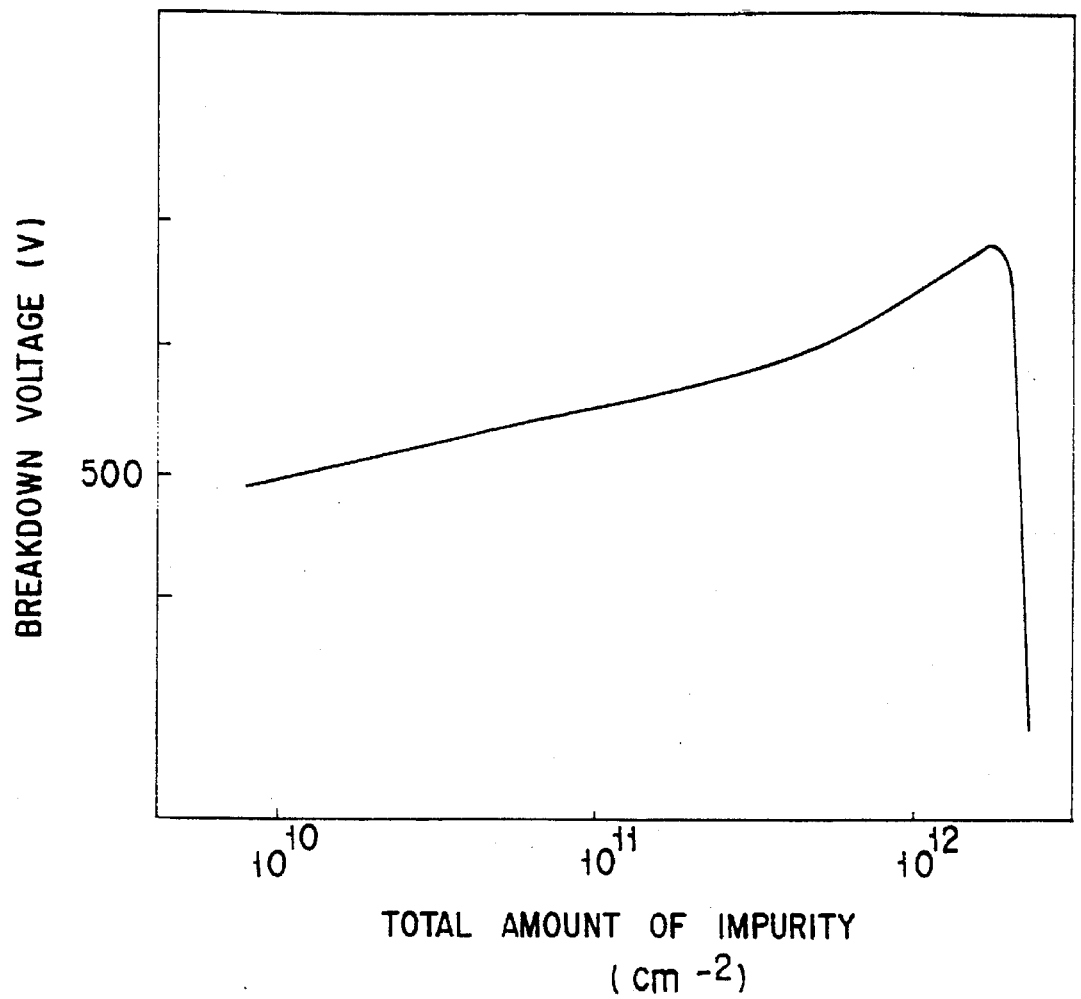
F I G. 81

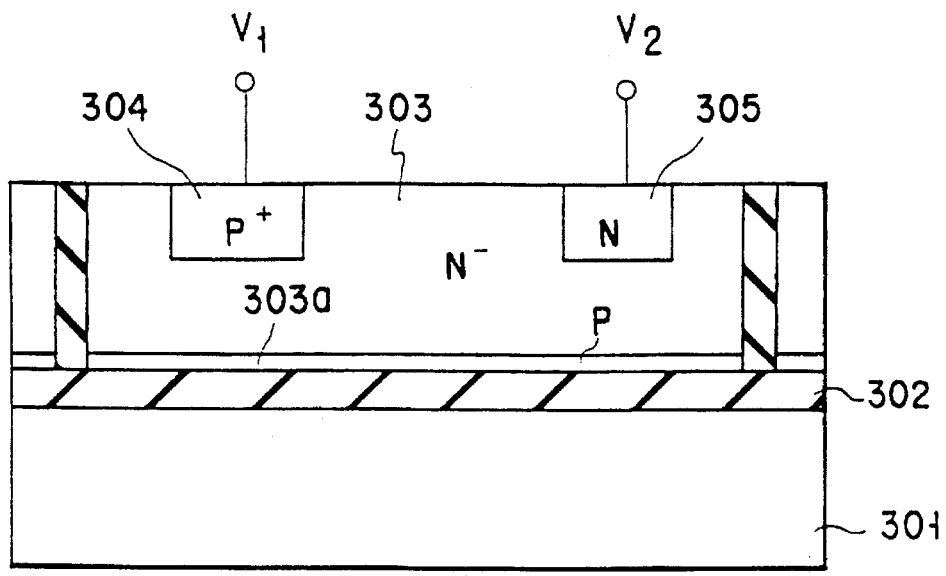
F I G. 84
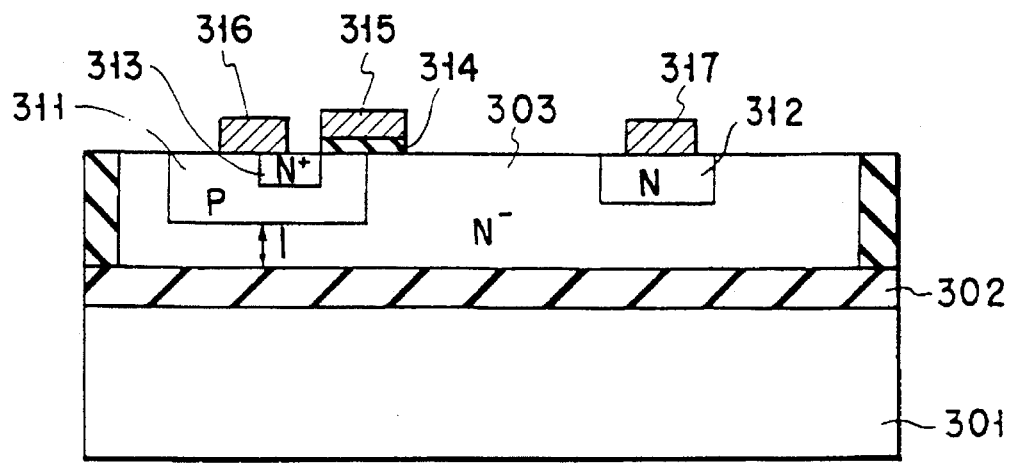
F I G. 85

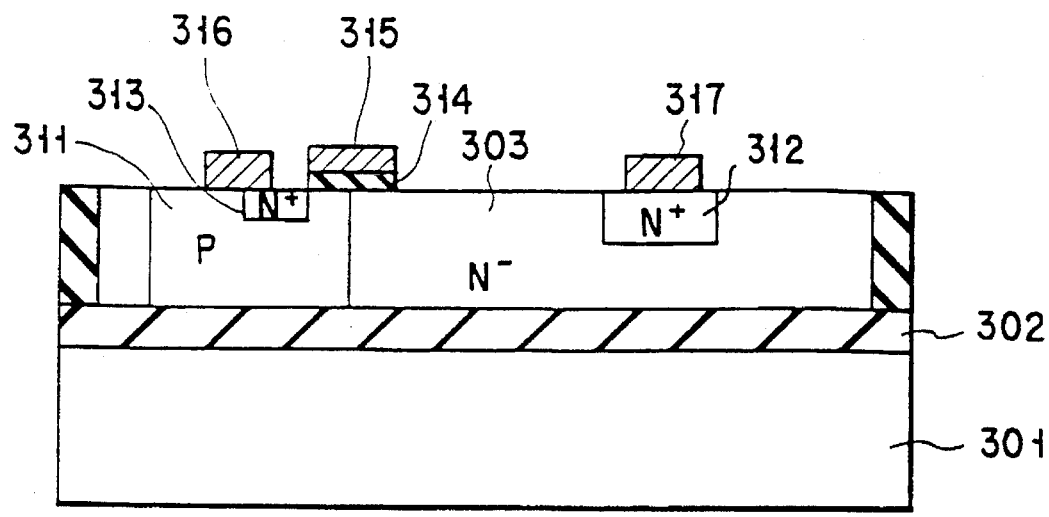
F I G. 86
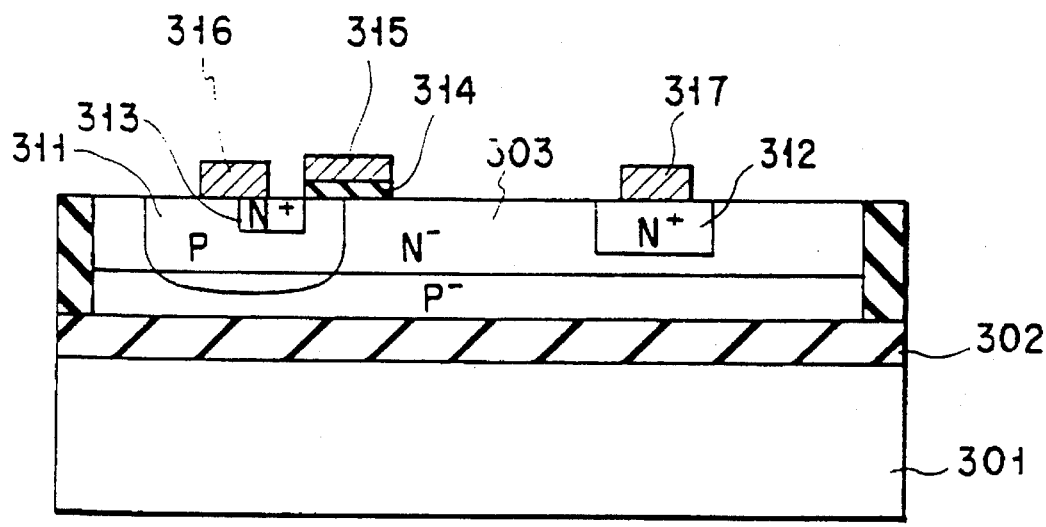
F I G. 87

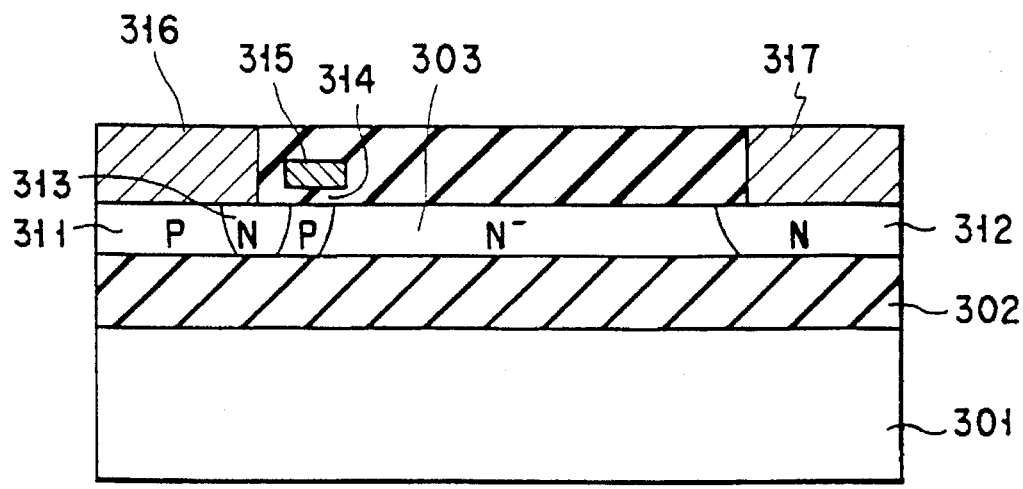
F I G. 90
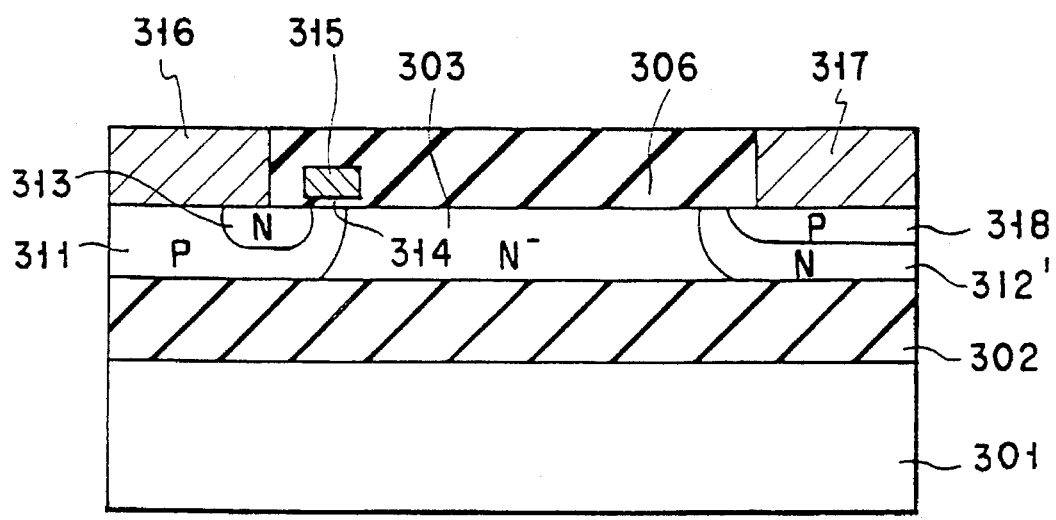
F I G. 91

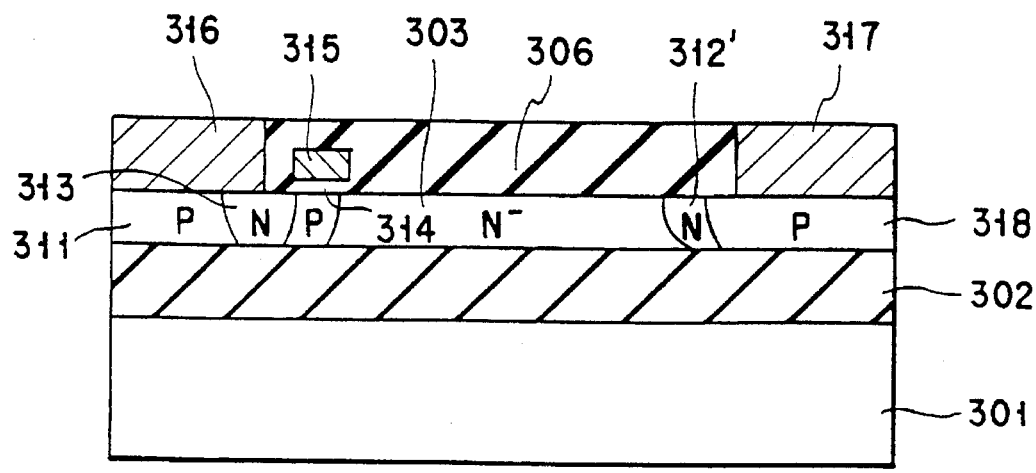
F I G. 92
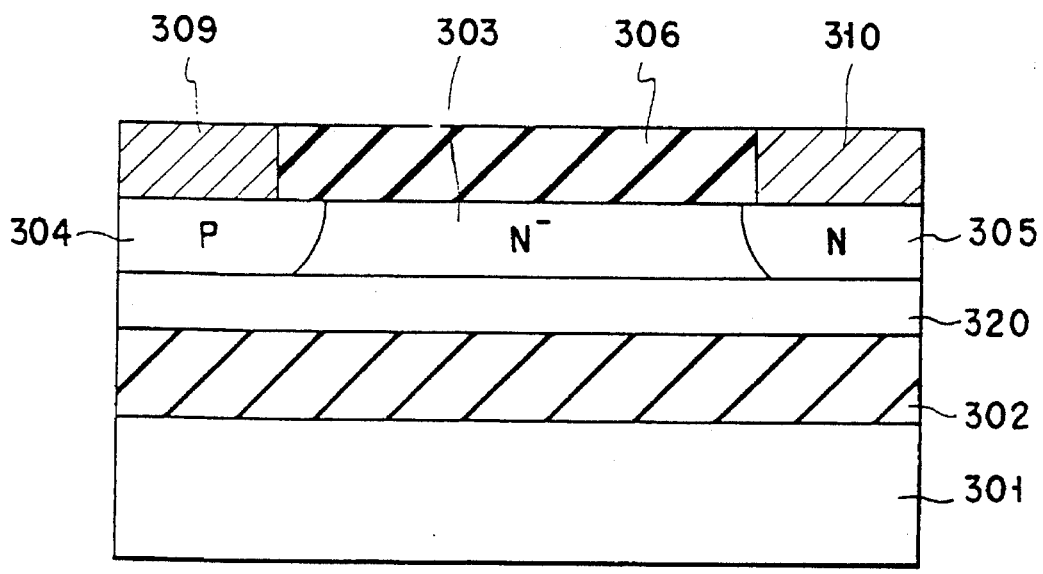
F I G. 93

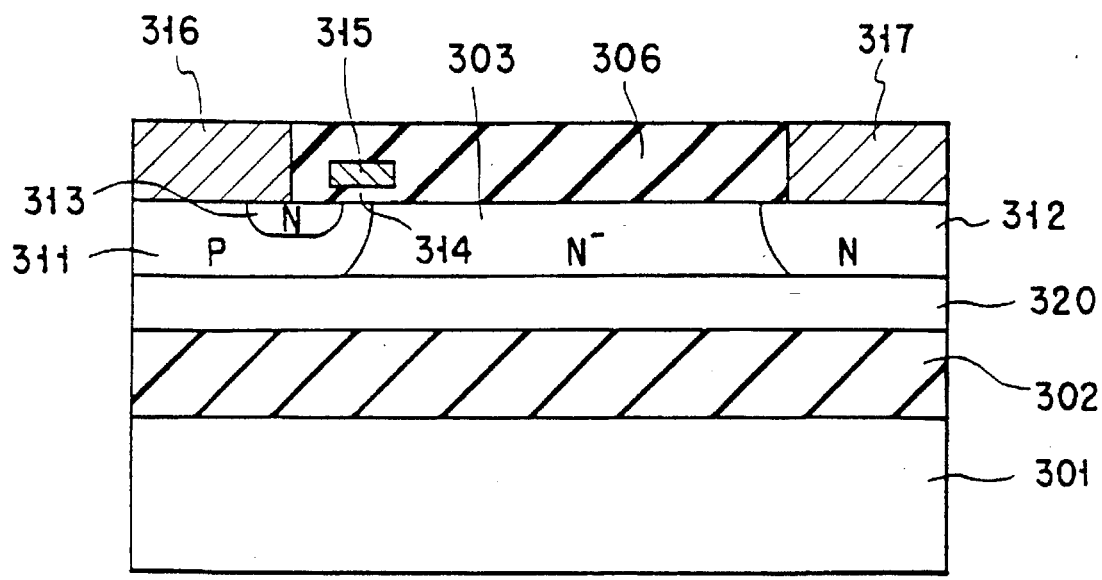
F I G. 94
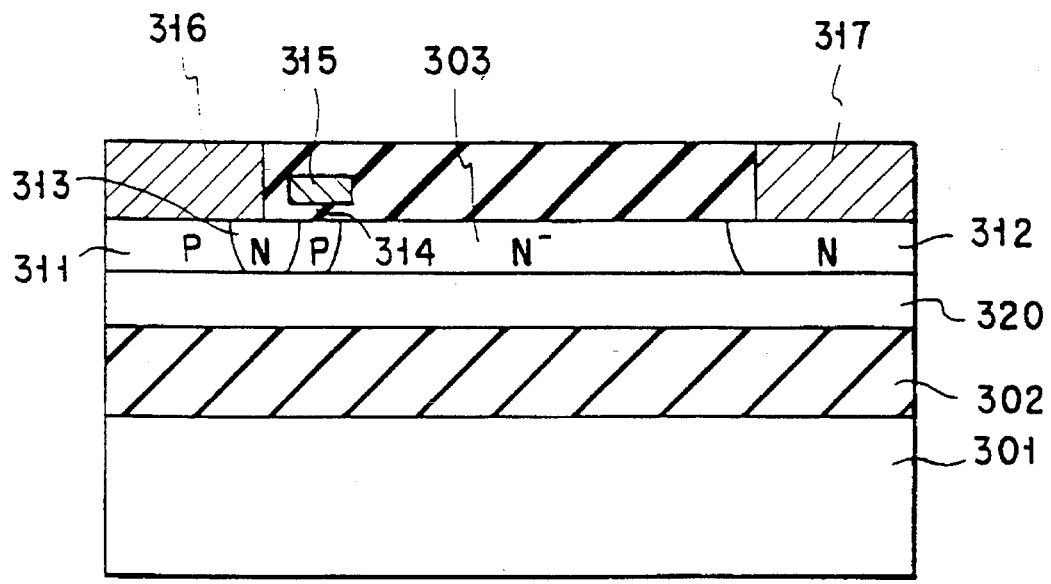
F I G. 95

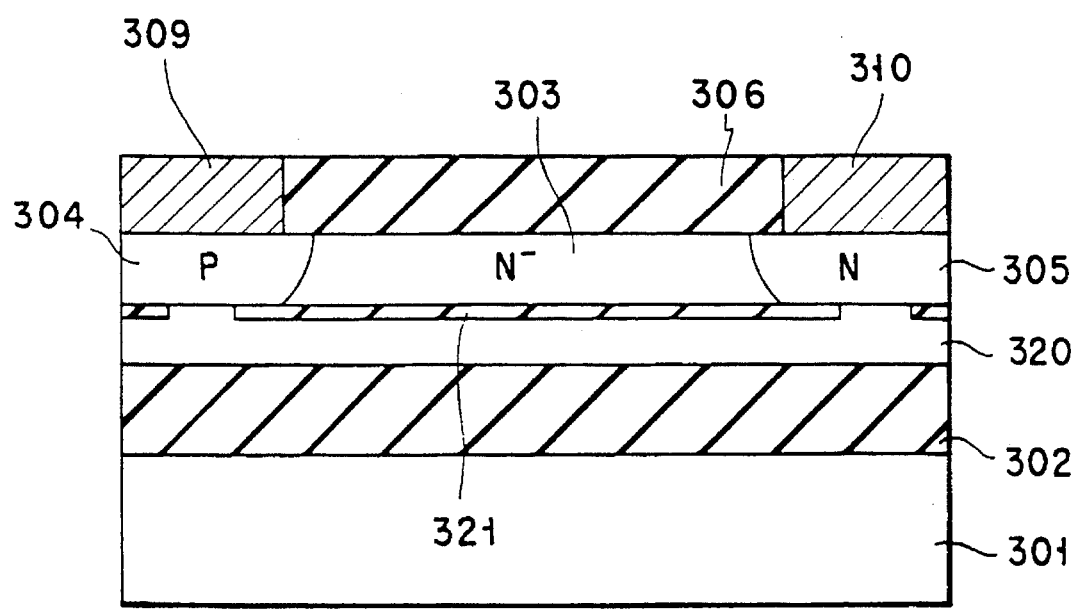
F I G. 96

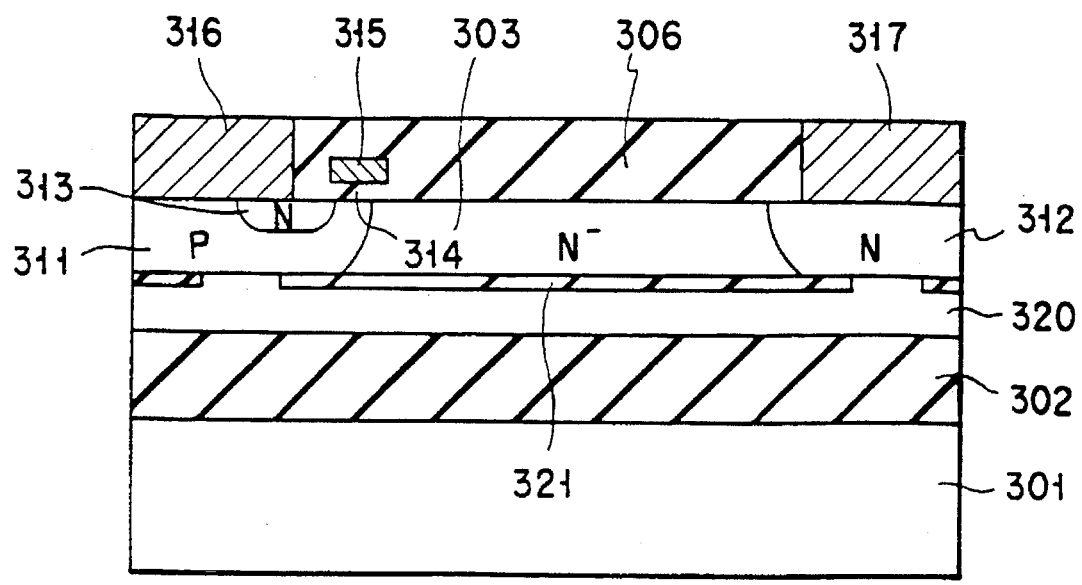
F I G. 97
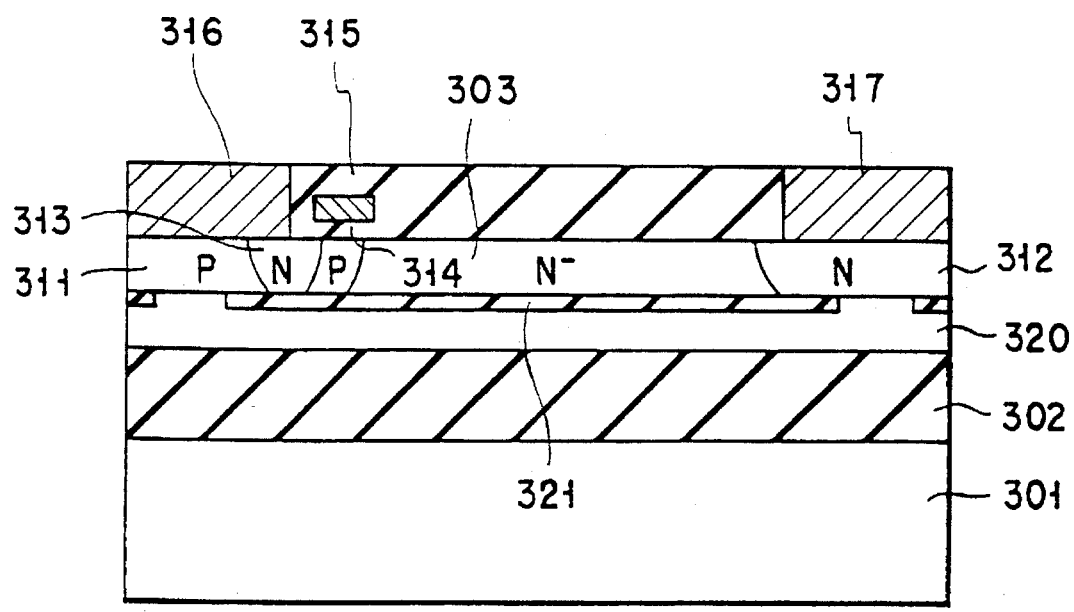
F I G. 98

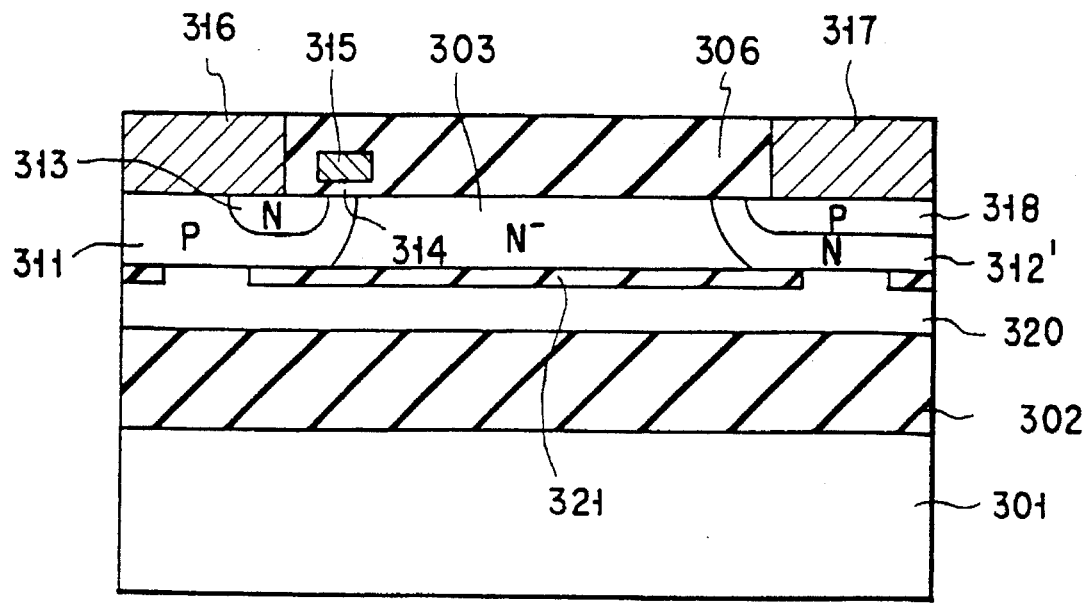
F I G. 99
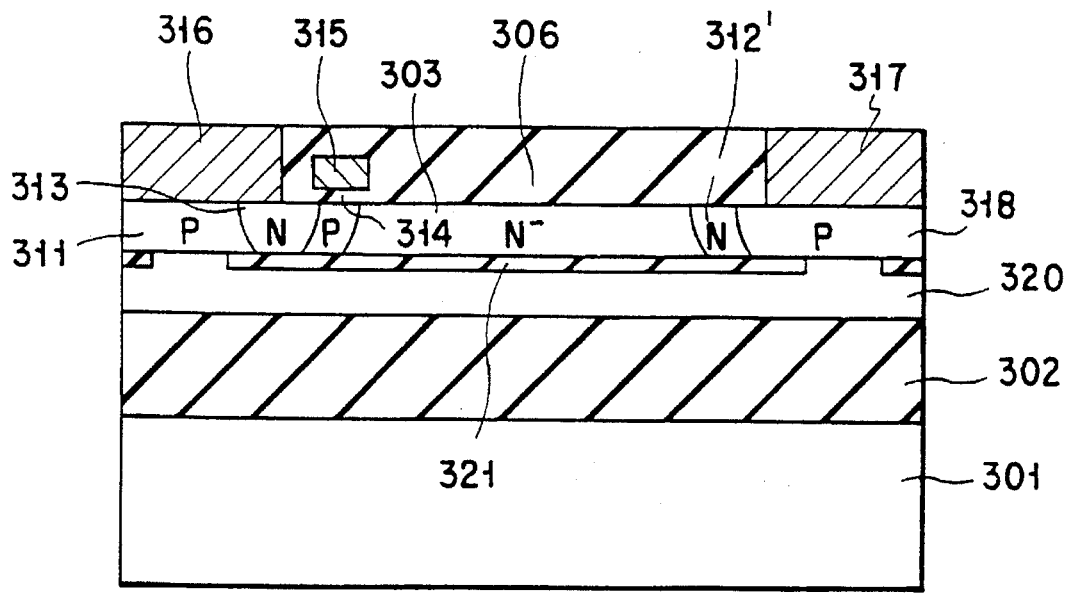
F I G. 100

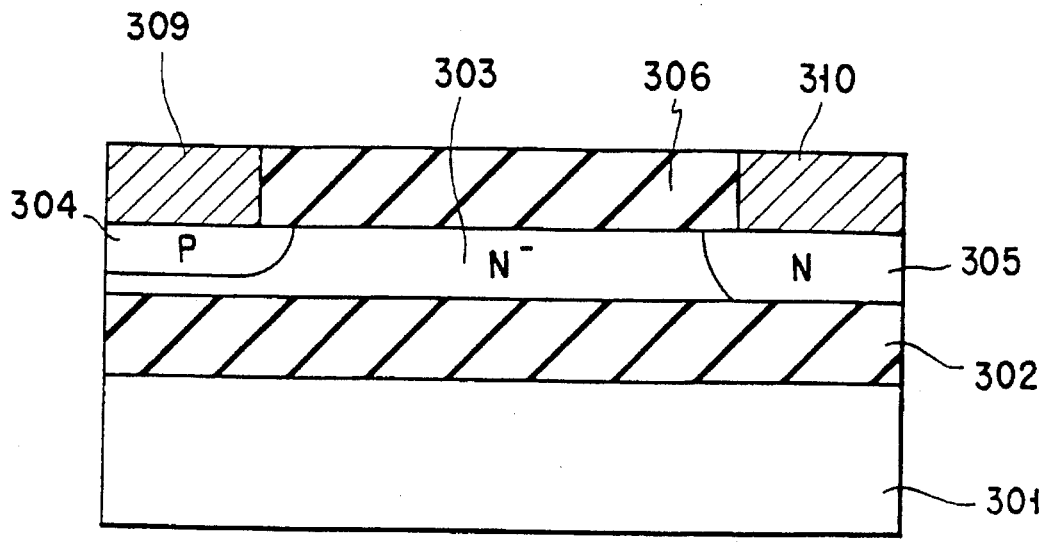
F I G. 101
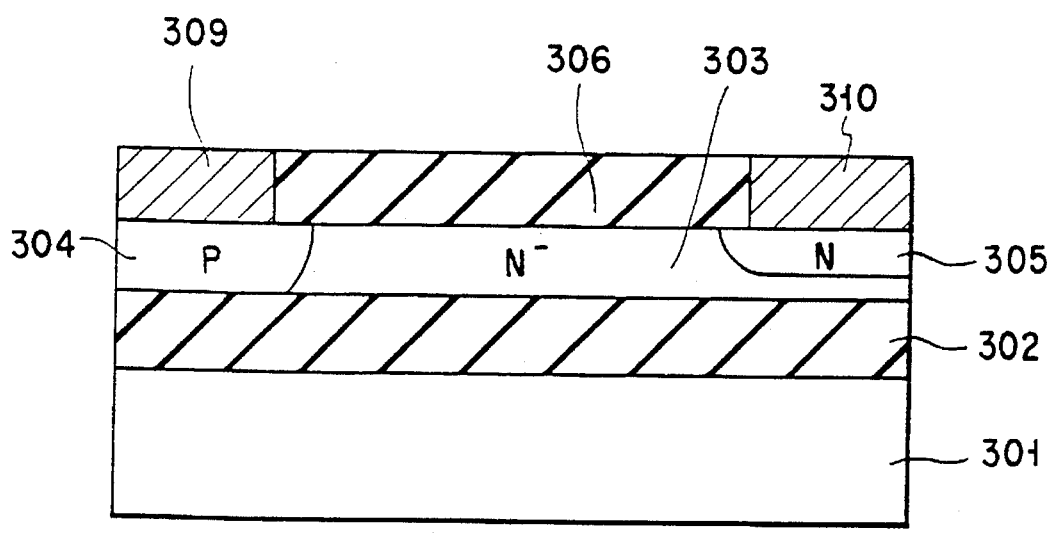
F I G. 102

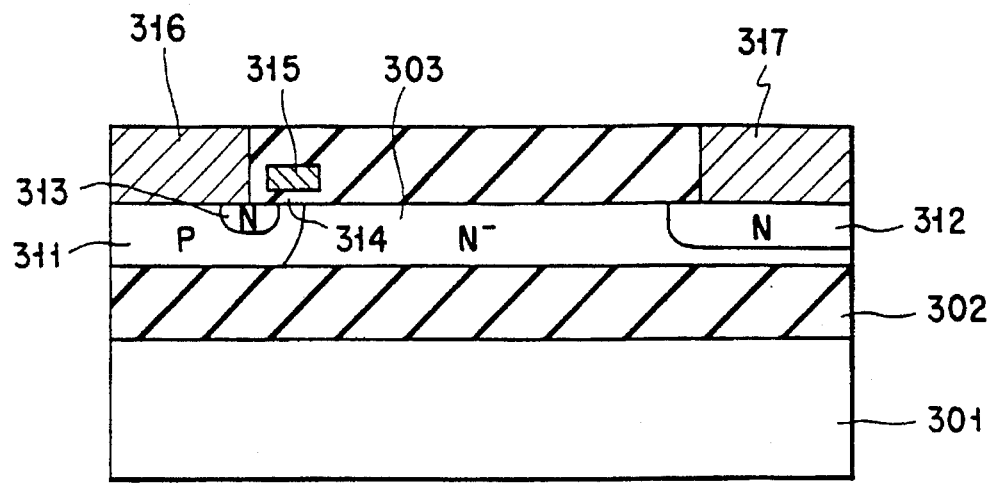
F I G. 103
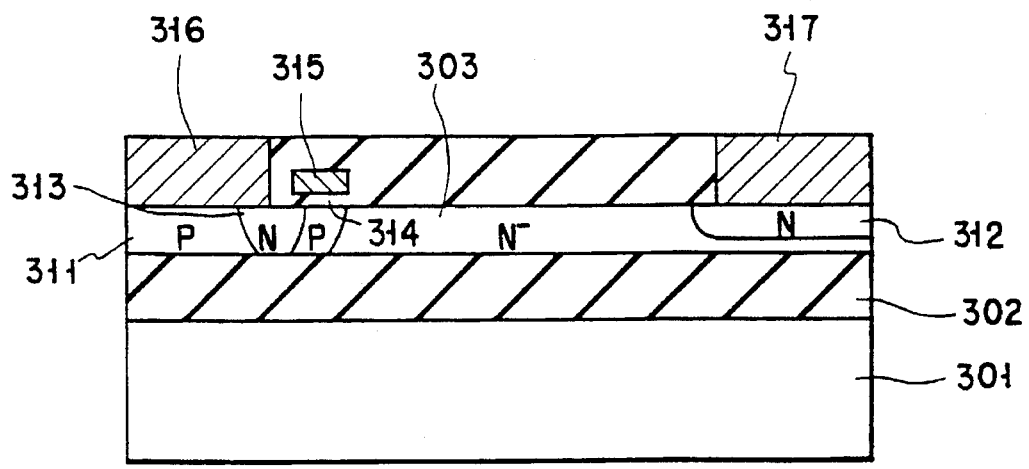
F I G. 104

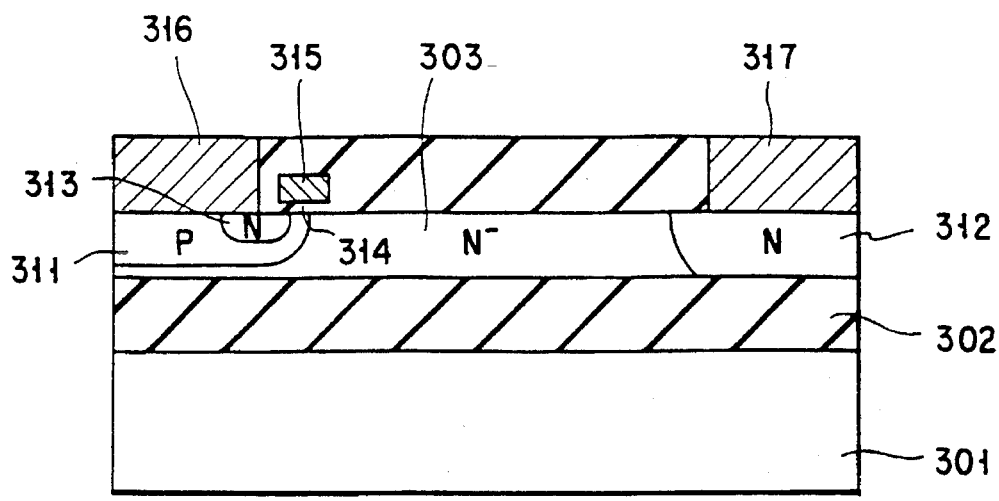
F I G. 105
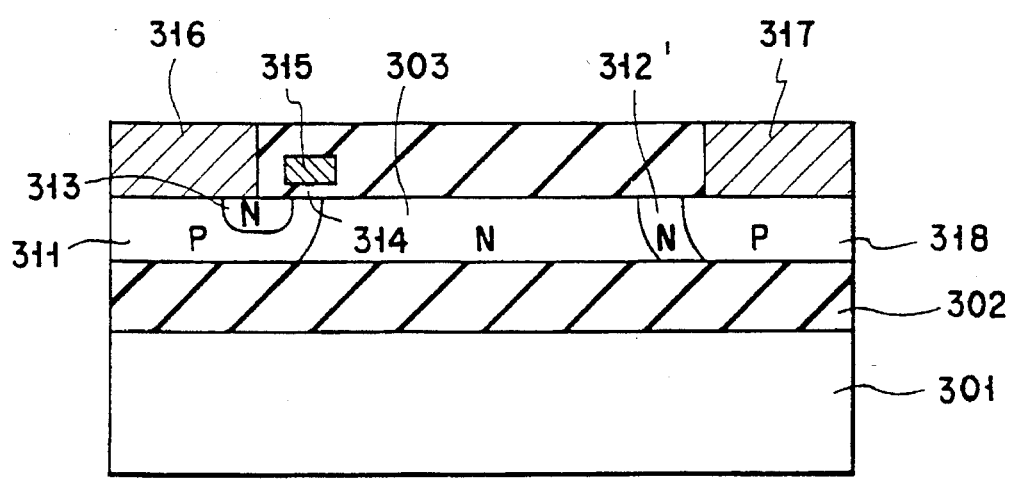
F I G. 106

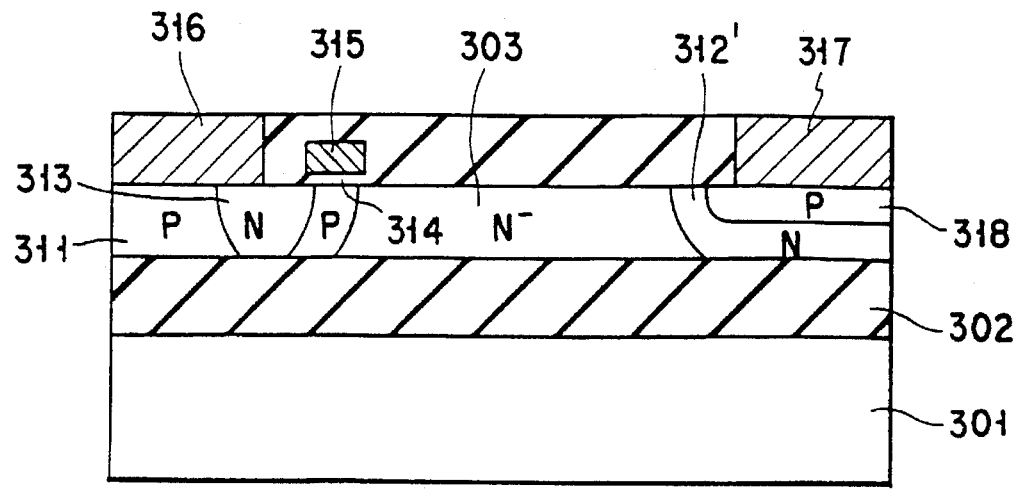
F I G. 107
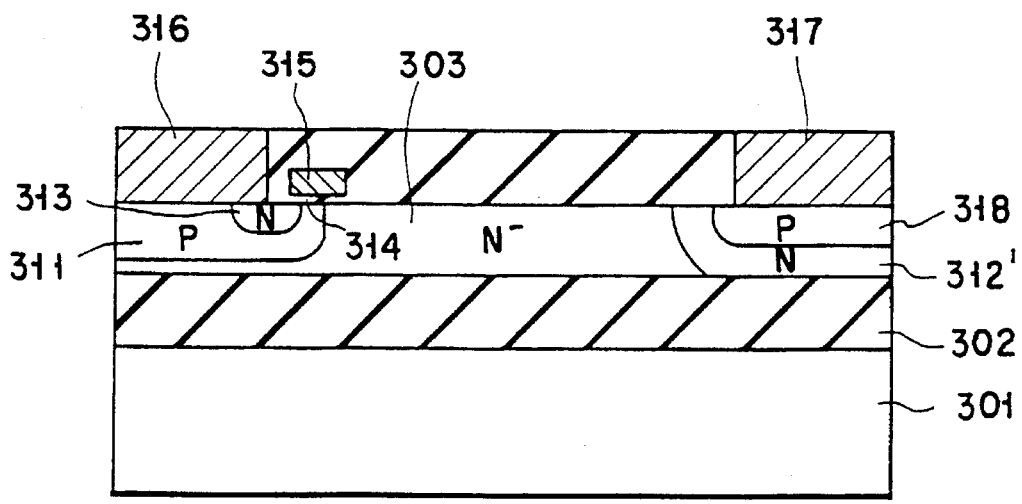
F I G. 108

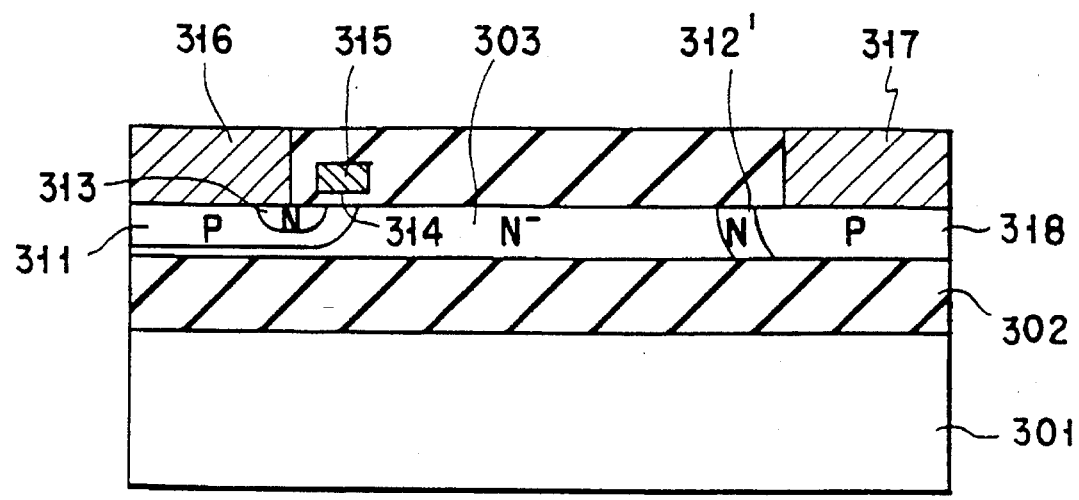
F I G. 109
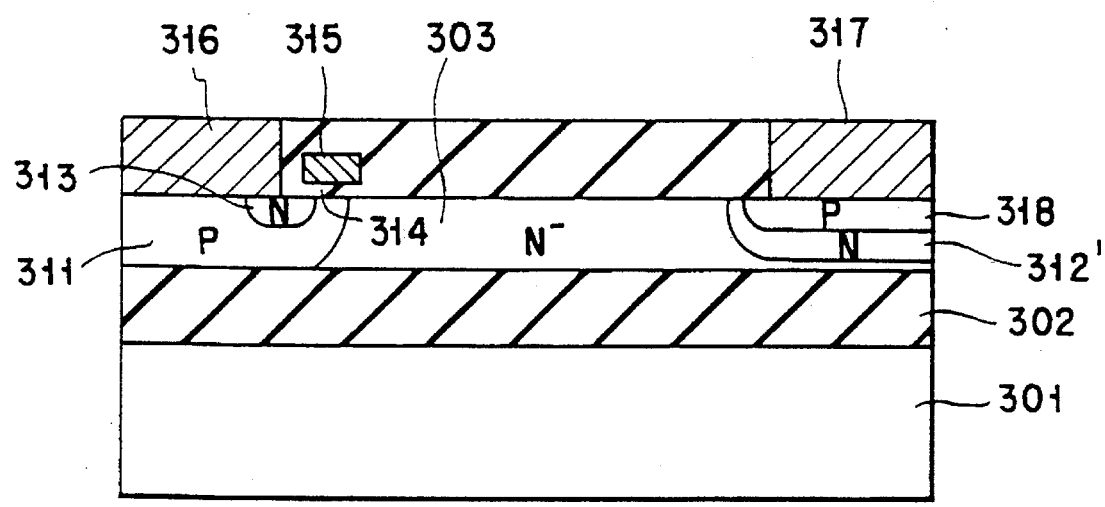
F I G. 110

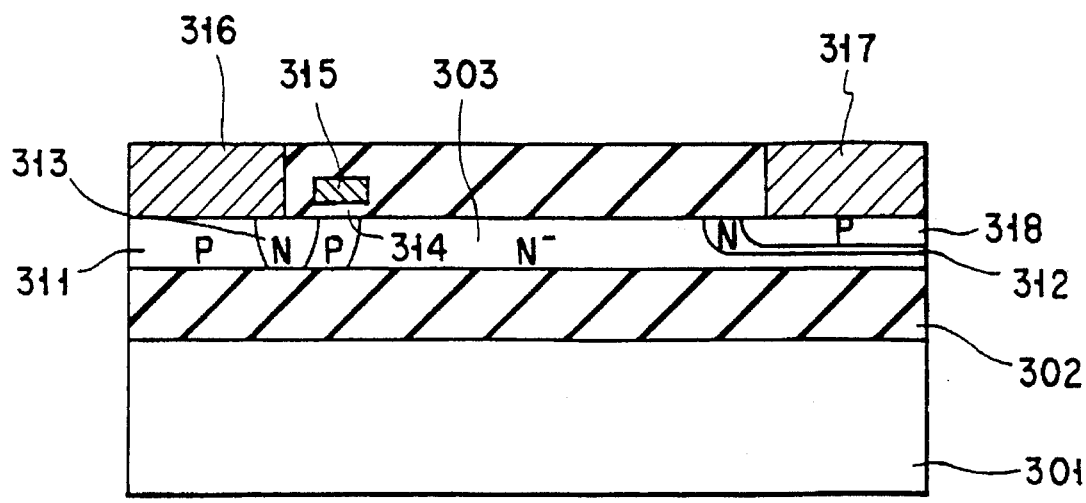
F I G. 111
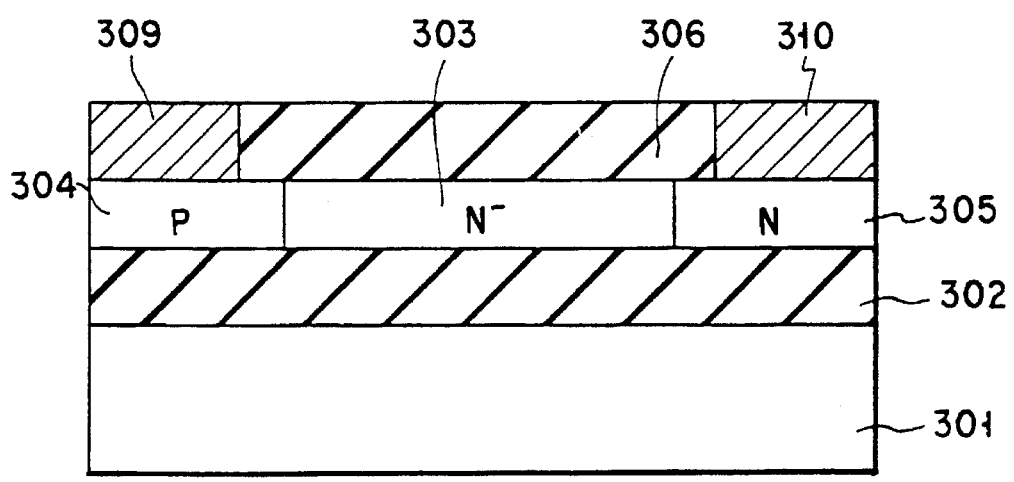
F I G. 112

HIGH BREAKDOWN VOLTAGE SEMICONDUCTOR DEVICE

CROSS-REFERENCE TO THE RELATED APPLICATION

This is a Continuation of application Ser. No. 08/220,283 filed on Mar. 30, 1994 now U.S. Pat. No. 5,434,444, which is a continuation of application Ser. No. 07/829,214, filed on Jan. 31, 1992, now U.S. Pat. No. 5,343,067; which is a continuation-in-part of application Ser. No. 07/642,565, filed on Jan. 18, 1991, now U.S. Pat. No. 5,241,210; which is a continuation-in-part of application Ser. No. 07/236,746, filed on Aug. 26, 1988, now abandoned, which is a continuation-in-part of application Ser. No. 07/161,102, filed on Feb. 26, 1988, now abandoned.

BACKGROUND OF THE INVENTION

1. Field of the Invention

The present invention relates to a high breakdown voltage semiconductor device.

2. Description of the Related Art

In a high breakdown voltage semiconductor device, dielectric isolation method is known as an effective method of isolating each element.

FIG. 1 shows a conventional high breakdown voltage diode obtained by using such a dielectric isolation method. Reference numeral 101 denotes a $p^+$ type silicon substrate, and there is formed a substrate wafer in which the $p^+$ type silicon substrate and an $n^-$ (or $p^-$) type silicon substrate are bonded to each other by a direct bonding method. Reference numeral 102 is an oxide film of a bonding interface. The $n^-$ type substrate of the substrate wafer is selectively etched up to the depth reaching the oxide film 102, so that a groove is formed. Thereby, an $n^-$ type layer 103, which is an island element region, is formed. In the groove, an oxide film 104 is formed inside and a polycrystalline silicon film 105 is buried therein. An $n^+$ type layer 106, serving as a cathode region, is formed in the central surface portion of the island $n^-$ type layer 103 isolated from other portions by the oxide films 102 and 104. Then, $p^+$ type layer 107, serving as an anode region, is formed in the peripheral surface portion. As a result, a diode is formed. $P^+$ layers 108 and 109 are formed along the oxide films 102 and 104 so as to enclose the surroundings of the island $n^-$ type layer 103. The $p^+$ type layers 108 and 109 are formed so as to allow large current to flow. A cathode electrode 110 and an anode electrode 111 are formed on the $n^+$ type layer 106 and $p^+$ type layer 107, respectively.

In the above diode, if reverse bias is applied to the portion between the anode and the cathode and a depletion layer extends to the $n^-$ type layer 103, and all applied voltages are applied between the $n^+$ type layer 106 of the surface portion and the $p^+$ type layer 108 of the bottom portion. Therefore, in order to obtain a diode having sufficient high breakdown voltage, it is required that a distance d between the $n^+$ type layer 106 and the $p^+$ type layer 108 be sufficiently largely made. More specifically, in order to obtain voltage of 600 V, d=45 µm is needed.

If the thickness of the $n^-$ type layer 103 is made larger so as to ensure the above-mentioned distance d, the groove for the element isolation in a lateral direction must be deepened in accordance with the thickness of the $n^-$ type layer 103. This makes it extremely difficult to perform the element isolation in the lateral direction.

As mentioned above, according to the semiconductor device having the conventional dielectric isolation structure, it is necessary to make the thickness of the high resistance semiconductor layer whose depletion layer extends sufficiently large so as to obtain a sufficient high breakdown voltage. Due to this, there is a problem that the element isolation becomes difficult to be performed.

The following explains the other examples of the semiconductor device having the conventional dielectric isolation structure.

FIG. 2 shows a conventional lateral type diode having the conventional dielectric isolation structure. An $n^-$ type silicon layer (active layer) 33 is formed on a semiconductor substrate 31 via an insulating film 32 for isolation. An $n^+$ type layer 34 having a high impurity concentration is formed in the bottom portion of the active layer 33. A p-type anode layer 135 is formed in the active layer 33 and an n-type cathode layer 36 is formed in a portion which is away from the p-type anode layer 35 with a predetermined distance, and an anode electrode 37 and a cathode electrode 38 are formed on the anode layer 35 and the cathode layer 36, respectively.

In the above-mentioned lateral type diode, for example, considering a reverse bias state in which the anode electrode 37 and the substrate 31 are grounded and a positive voltage is applied to the cathode electrode 38, the voltage to be applied to the cathode is applied to the depletion layer extending to the active layer under the p-type anode layer 35, and the insulating film 32 for isolation.

Due to this, if the thickness of the active layer 33 under n-type cathode layer 36 is thin, a large electric field is shared at this portion, and an electric field concentration occurs in the vicinity of the curved portion of the bottom of the n-type cathode layer 36, and avalanche breakdown is generated at a low applied voltage. In order to avoid the above problem and realize the sufficient high breakdown voltage, the thickness of the active layer 33 is conventionally set to be 40 µm or more.

However, if the thickness of the active layer is large, a deep isolation groove is needed for the element isolation in the lateral direction by a V-groove, and an area of the isolation groove region becomes large. Due to this, work processing becomes difficult and an effective area of the element becomes small, so that the cost of an integrated circuit having the high breakdown voltage element increases.

As mentioned above, in the high breakdown voltage semiconductor device having the conventional dielectric isolation structure, if the active layer is thin, a sufficient breakdown voltage cannot be obtained. Moreover, if the active layer is thick, the element isolation in the lateral direction becomes difficult.

SUMMARY OF THE INVENTION

In order to solve the above-mentioned problems, an object of the present invention is to provide a semiconductor device having high breakdown voltage using the dielectric isolation structure wherein a sufficiently high breakdown voltage can be obtained even if a relative thin high resistance semiconductor layer is used.

According to the first aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, and a second low resistance region of a second conductivity type formed in a peripheral surface portion of the element region, wherein the dose of impurities in the element region is set such that a portion of the element region between the first low resistance region and the second low resistance region is completely depleted when voltage is applied between the first and second low resistance regions.

According to the second aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction from the isolation region, a first low resistance region of a first conductivity type formed in a region extending from a surface of the element region to the insulating layer, and a second low resistance region of a second conductivity type formed in a region extending from a surface of the element region to the insulating layer, wherein the dose of impurities in the element region is set such that a portion of the element region between the first low resistance region and the second low resistance region is completely depleted when voltage is applied between the first and second low resistance regions.

According to the third embodiment of the present invention, there is provided a lateral type insulated gate bipolar transistor comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, a second low resistance region of a second conductivity type formed in a peripheral surface portion of the element region, a drain region of a second conductivity type formed in the first low resistance region, and a source region of a first conductivity type formed in the second low resistance region, wherein the dose of impurities in the element region is set such that a portion of the element region between the source region and the drain region is completely depleted when voltage is applied between the source region and the drain region.

According to the fourth aspect of the present invention, there is provided a high breakdown voltage semiconductor device comprising a semiconductor substrate, an insulating layer formed on the semiconductor substrate, a high resistance semiconductor layer formed on the insulating layer, an isolation region formed in the high resistance semiconductor layer, an element region formed in the high resistance semiconductor layer isolated by the isolation region in a lateral direction, a first low resistance region of a first conductivity type formed in a central surface portion of the element region, and a second low resistance region of a second conductivity type formed in a surface portion of the element region to be separated from the first low resistance region, wherein when voltage is applied between the first low resistance region and the second low resistance region and both the potential of the first low resistance region and that of the second low resistance region are higher than the potential of the semiconductor substrate, a channel region of a second conductive type is formed in the bottom portion of the element region, whereby influence of potential of the semiconductor substrate is shielded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross sectional view showing a diode of an embodiment in which each conductivity type of each portion of FIG. 3 is reversed;

FIG. 8 is a cross sectional view showing an IGBT of an embodiment in which the structure of FIG. 6 is modified;

FIG. 9 is a cross sectional view showing an IGBT of an embodiment in which the structure of FIG. 7 is modified;

FIG. 15 is a cross sectional view showing an embodiment in which the IGBT of the embodiment of FIG. 6 is partially modified;

FIG. 16 is a cross section view showing an embodiment of FIG. 6 is partially modified;

FIG. 18 is a cross sectional view showing an embodiment in which the embodiment of FIG. 15 is partially modified;

FIG. 19 is a cross sectional view showing an embodiment in which the embodiment of FIG. 16 is partially modified;

FIG. 20 is a cross sectional view showing an embodiment in which the embodiment of FIG. 15 is partially modified;

FIG. 21 is a cross sectional view showing an embodiment in which the embodiment of FIG. 20 is partially modified;

FIG. 24 is a cross sectional view showing an embodiment in which the embodiment of FIG. 15 is partially modified;

FIG. 25 is a cross sectional view showing an embodiment in which the embodiment of FIG. 24 is partially modified;

FIG. 26 is a view showing an embodiment in which the present invention is applied to the lateral type diode;

FIG. 27 is a view showing a diode of an embodiment in which the structure of FIG. 26 is slightly modified;

FIG. 28 is a view showing an embodiment in which the present invention is applied to the MOSFET;

FIG. 29 is a view showing a MOSFET of an embodiment in which the structure of FIG. 28 is modified;

FIG. 36 is a view showing a diode of an embodiment in which the structure of FIG. 26 is modified;

FIG. 37 is a view showing a MOSFET of an embodiment in which the structure of FIG. 28 is modified;

FIG. 38 is a view showing a MOSFET of an embodiment in which the structure of FIG. 37 is modified;

FIG. 39 is a view showing a MOSFET of an embodiment in which the structure of FIG. 35 is modified;

FIG. 42 is a view showing a MOSFET of an embodiment in which a base high resistance film is added to the in structure of FIG. 28;

FIG. 43 is a view showing a MOSFET of an embodiment in which a base high resistance film is added to the structure of FIG. 29;

FIG. 44 is a view showing a MOSFET of an embodiment in which a base high resistance film is added to the structure of FIG. 30;

FIG. 45 is a view showing a MOSFET of an embodiment in which a base high resistance film is added to the structure of FIG. 31;

FIG. 46 is a view showing an IGBT of an embodiment in which a base high resistance film is added to the structure of FIG. 32;

FIG. 47 is a view showing an IGBT of an embodiment in which a base high resistance film is added to the structure of FIG. 33;

FIG. 48 is a view showing an IGBT of an embodiment in which a base high resistance film is added to the structure of FIG. 34;

FIG. 49 is a view showing an IGBT of an embodiment in which a base high resistance film is added to the structure of FIG. 35;

FIG. 50 is a view showing a diode of an embodiment in which a base high resistance film is added to the structure of FIG. 36;

FIG. 51 is a view showing a MOSFET of an embodiment in which a base high resistance film is added to the structure of FIG. 37;

FIG. 52 is a view showing a MOSFET of an embodiment in which a base high resistance film is added to the structure of FIG. 38;

FIG. 53 is a view showing a MOSFET of an embodiment in which a base high resistance film is added to the structure of FIG. 39;

FIG. 54 is a view showing a diode of an embodiment in which the structure of FIG. 40 is modified;

FIG. 55 is a view showing a diode of an embodiment in which the structure of FIG. 41 is modified;

FIG. 56 is a view showing a MOSFET of an embodiment in which the structure of FIG. 42 is modified;

FIG. 57 is a view showing a MOSFET of an embodiment in which the structure of FIG. 43 is modified;

FIG. 58 is a view showing a MOSFET of an embodiment in which the structure of FIG. 44 is modified;

FIG. 59 is a view showing a MOSFET of an embodiment in which the structure of FIG. 45 is modified;

FIG. 60 is a view showing an IGBT of an embodiment in which the structure of FIG. 46 is modified;

FIG. 61 is a view showing an IGBT of an embodiment in which the structure of FIG. 47 is modified;

FIG. 62 is a view showing an IGBT of an embodiment in which the structure of FIG. 48 is modified;

FIG. 63 is a view showing an IGBT of an embodiment in which the structure of FIG. 49 is modified;

FIG. 64 is a view showing a diode of an embodiment in which the structure of FIG. 50 is modified;

FIG. 65 is a view showing a MOSFET of an embodiment in which the structure of FIG. 51 is modified;

FIG. 66 is a view showing a MOSFET of an embodiment in which the structure of FIG. 52 is modified;

FIG. 67 is a view showing a MOSFET of an embodiment in which the structure of FIG. 53 is modified;

FIG. 68 is a view showing a diode of an embodiment in which the structure of FIG. 26 is modified;

FIG. 69 is a view showing a diode of an embodiment in which the structure of FIG. 26 is modified;

FIG. 70 is a view showing a MOSFET of an embodiment in which the structure of FIG. 28 is modified;

FIG. 71 is a view showing a MOSFET of an embodiment in which the structure of FIG. 29 is modified;

FIG. 72 is a view showing a MOSFET of an embodiment in which the structure of FIG. 28 is modified;

FIG. 73 is a view showing an IGBT of an embodiment in which the structure of FIG. 32 is modified;

FIG. 74 is a view showing an IGBT of an embodiment in which the structure of FIG. 32 is modified;

FIG. 75 is a view showing an IGBT of an embodiment in which the structure of FIG. 32 is modified;

FIG. 76 is a view showing an IGBT of an embodiment in which the structure of FIG. 32 is modified;

FIG. 77 is a view showing an IGBT of an embodiment in which the structure of FIG. 32 is modified;

FIG. 78 is a view showing all IGBT of an embodiment in which the structure of FIG. 32 is modified;

FIG. 79 is a view showing a diode of an embodiment in which the structure of FIG. 26 is modified;

FIGS. 80A to 80C are views showing an example of the structure of the lateral isolation of the device of the present invention;

FIG. 81 is a view showing the relationship between the total amount of impurities of an active layer and breakdown voltage in the embodiment of FIG. 26;

FIG. 84 is a view showing a diode relating to the other embodiment of the present invention;

FIG. 85 is a view showing an IGBT relating to the other embodiment of the present invention;

FIG. 86 is a view showing an IGBT of an embodiment in which the structure of FIG. 85 is modified;

FIG. 87 is a view showing an IGBT of an embodiment in which the structure of FIG. 85 is modified; and FIGS. 88 to 112 are views showing a diode or an IGBT of an embodiment in which a high resistance film is removed in the embodiments of FIGS. 26 to 79.

DETAILED DESCRIPTION OF THE PREFERRED EMBODIMENTS

Figure 1:
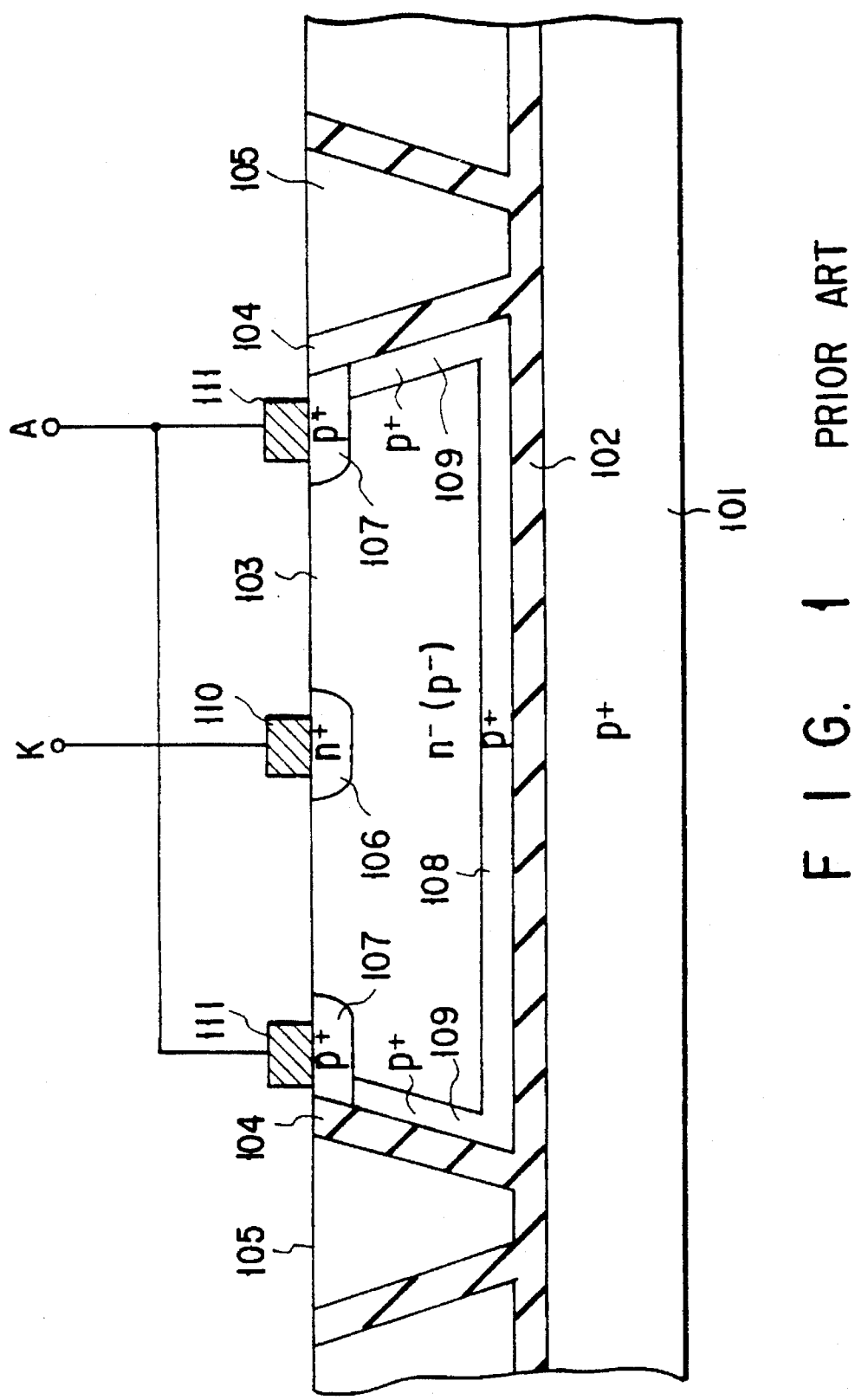
FIGS. 1 and 2 are cross sectional views showing a conventional high breakdown voltage diode.
Figure 2:
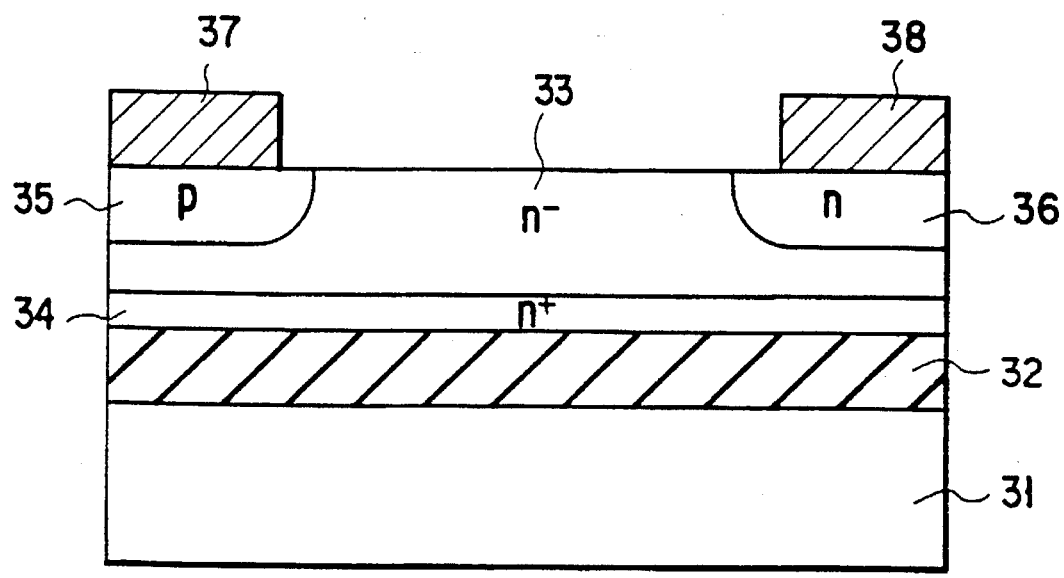

According to a first high breakdown voltage semiconductor device relating to the present invention, for example, it is assumed that reverse bias voltage is applied between first and second low resistance regions in a state that the first low resistance region is set to be a high potential and the second low resistance region is set to be a ground potential. At this time, the applied voltage is impressed to the high resistance semiconductor layer in a deep direction at the same time with the lateral direction. This is because a base semiconductor substrate is normally set to be a ground potential. Then, a depletion layer extends to the high resistance semiconductor layer from a pn junction around the first or second low resistance region. When the applied voltage runs up to a certain value, the depletion layer reaches up to a first insulating film on the base semiconductor substrate, and the voltage in the deep direction is shared by the high resistance semiconductor layer and the first insulating film.

In order to prevent the avalanche breakdown in such a high voltage applying state, it is better that that portion of the applied voltage, which is shared by the first insulating film, is set to be larger. Moreover, since a dielectric flux density is continuous at the boundary surface between the high resistance semiconductor layer and the first insulating film, it is better that the electric field in the first insulating film is set to be small not to strengthen the electric field in the vertical direction in the high resistance semiconductor layer.

In the first high breakdown voltage semiconductor device relating to the present invention, since the thickness of the first insulating film is 1 μm or more, the electric field in the first insulating film is relatively small even in a state that the depletion layer extends as mentioned above. Due to this, the vertical electric field of the high resistance semiconductor layer is controlled to be small. Moreover, since the applied voltage is mainly shared by the first insulating film, the applied voltage to be applied in the deep direction of the high resistance semiconductor layer is controlled to be small. As mentioned above, according to the semiconductor device relating to the present invention, even if the high resistance semiconductor is formed relatively thin, a high breakdown voltage characteristic can be sufficiently obtained.

According to the first high breakdown voltage semiconductor device relating to the present invention, particularly, if in the bottom portion of the high resistance layer, there is formed a buffer layer having low impurity concentration such that a total amount of impurity per a unit area is set to be $3 \times 10^{12}/cm^2$ or less, preferably 0.5 to $2.0 \times 10^{12}/cm^2$, much higher breakdown voltage can be obtained. This is because space charge having high concentration occurs from the high resistance semiconductor layer if the buffer layer is completely depleted at the time of reverse bias application. If a vertical component of the electric field at the boundary surface between the buffer layer and the first insulating film is Es on the semiconductor layer side, Ei on the insulating film side, a dielectric constant of the semiconductor layer is $\epsilon s$, and a dielectric constant of the insulating film is $\epsilon i$, an equation of $Es=(\epsilon i/\epsilon s) Ei$ can be obtained. Due to this, as the electric field in the first insulating film becomes larger, the electric field in the semiconductor layer becomes large in accordance with this. However, the space charge occurred in the buffer layer acts to relax the electric field on the semiconductor layer side. Therefore, by providing such a buffer layer, it is possible to make the electric field of the first insulating film larger as the electric field of the semiconductor layer is maintained small, thereby the high breakdown voltage can be obtained.

According to a second high breakdown voltage semiconductor device relating to the present invention, the element isolation in the vertical direction is made by not the insulating film but the pn junction. Other than that, the structure of the second semiconductor device is the same as that of the first semiconductor device. Therefore, the second semiconductor device is a relatively thin high resistance semiconductor layer and can obtain a sufficient high breakdown voltage characteristic.

In the first high breakdown voltage semiconductor device, there is considered a case in which a third low resistance region of a first conductivity type is formed in the boundary surface portion between the second insulating film (isolating region) and the high resistance semiconductor layer of the element region. This structure cannot be avoided in a case in which a low resistance region of the first conductivity type is formed on the groove side wall of the adjacent element region. This is because it is difficult to selectively diffuse a low resistance region in only one side of the groove side walls. According to this structure, there is a problem in breakdown occurring between the second and third low resistance regions when reverse bias is applied. First, if reverse bias is applied, the depletion layer extends to the high resistance semiconductor layer from the surroundings of the second low resistance region and the upper surface of the first insulating film. Where the first and third low resistance regions are connected through a neutral region, the potential of the third low resistance region follows the potential of the first low resistance region. When breakdown voltage of the pn junction between the second and third low resistance regions is $V_B$ and reverse bias voltage reaches to $V_B$ while the first and third low resistance regions regions are connected through the neutral region, breakdown is generated. If the thickness of the high resistance semiconductor layer and impurity concentration thereof are set such that the applied voltage at the time when the depletion layer under the second low resistance region reaches to the first insulating film is lower than $V_B$, the first and third low resistance regions is separated from each other by the depletion layer before breakdown occurs. As mentioned above, if the third low resistance region is separated from the first low resistance region by the depletion layer, the potential difference between the second low resistance region and the third low resistance region does not increase and breakdown between these low resistance regions is prevented.

According to a third high breakdown voltage semiconductor device, the second low resistance region is formed up to the depth reaching the first insulating film, so that the first and third low resistance regions are separated from each other. Therefore, the potential of the third low resistance region does not increase in accordance with the first low resistance region, and breakdown does not occur in the pn junction between the second and the third low resistance regions. Due this, high breakdown voltage characteristic can be improved even if there is the third low resistance region.

According to a fourth high breakdown voltage semiconductor device relating to the present invention, a high resistance film formed on the boundary surface between the first insulating film and the high resistance semiconductor layer acts to shield influence of the potential of the base semiconductor substrate, thereby excellent high breakdown voltage characteristic can be obtained.

Various embodiments of the present invention will be explained with reference to the drawings as follows.

Figure 3:
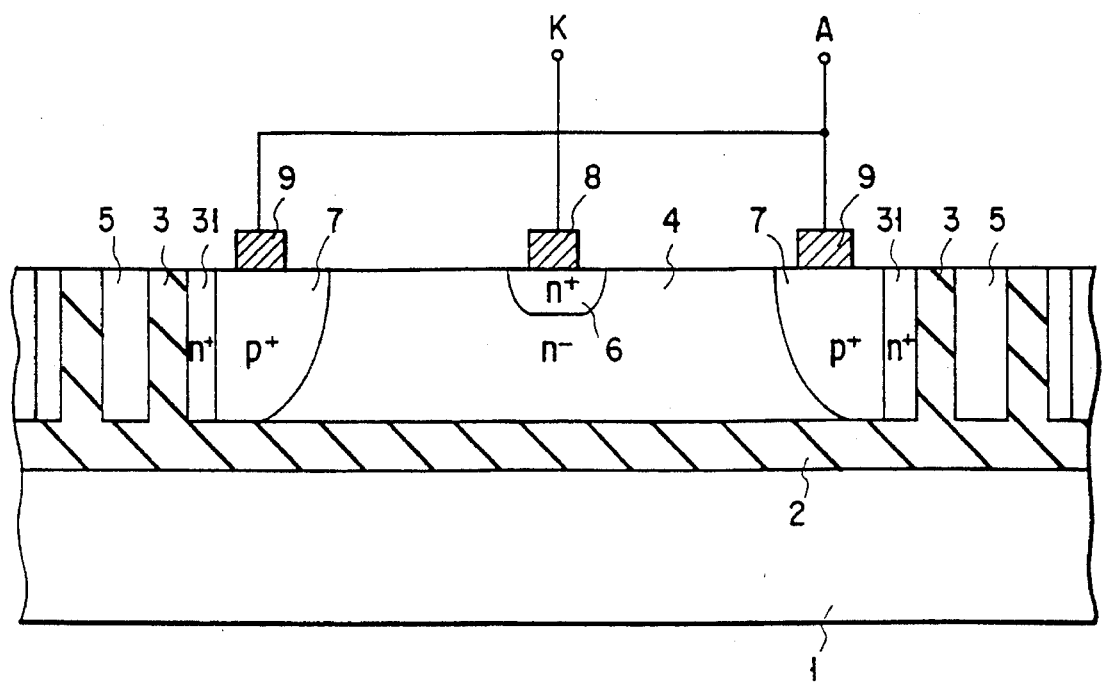
FIG. 3 is a cross sectional view showing a diode of an embodiment in which a second low resistance region is deeply formed by impurity diffusion.

FIG. 3 is an embodiment in which the $p^+$ type layer 7, serving as an anode region of, is formed in the peripheral portion up to the depth reaching to the oxide film 2 of the base.

According to the structure of this embodiment, the $n^+$ type layer 6 formed in the central portion of the device and the $n^+$ type layer 31 formed in the peripheral side portion of the device are electrically separated, and are not connected to each other at the neutral region unlike the embodiment of FIG. 16. Due to this, breakdown voltage of the pn junction between the $p^+$ type layer 7 and the $n^+$ type layer 31 has no influence on the breakdown voltage characteristic of the device, and high breakdown voltage characteristic can be obtained.

Figure 4:
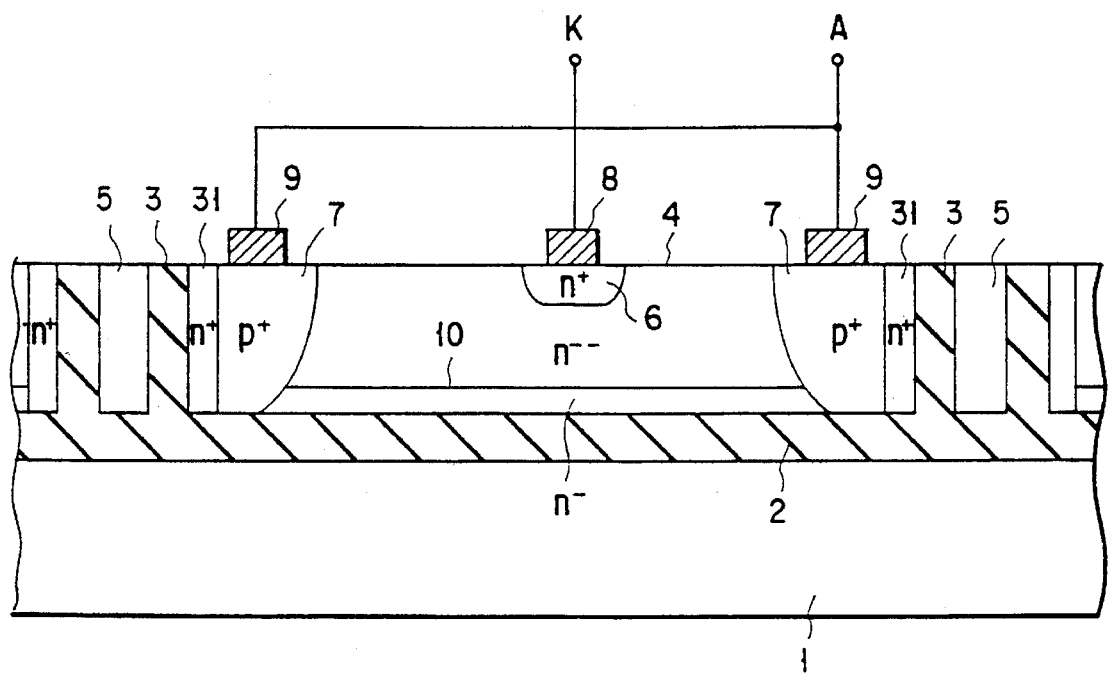
FIG. 4 is a cross sectional view showing a diode of an embodiment in which the buffer layer is formed in the bottom portion of the device of FIG. 3.

FIG. 4 is an embodiment in which the $n^-$ type buffer layer 10 is formed in the bottom portion of the high resistance silicon layer 4 so as to obtain further high breakdown voltage.

FIG. 5 is an embodiment in which the $n^+$ type layer 23 in the peripheral portion is formed up to the depth reaching to the oxide film 2. In other words, this is the embodiment in which the conductivity type of each portion of FIG. 4 is reversed. This embodiment also shows that high breakdown voltage characteristic can be obtained.

Figure 6:
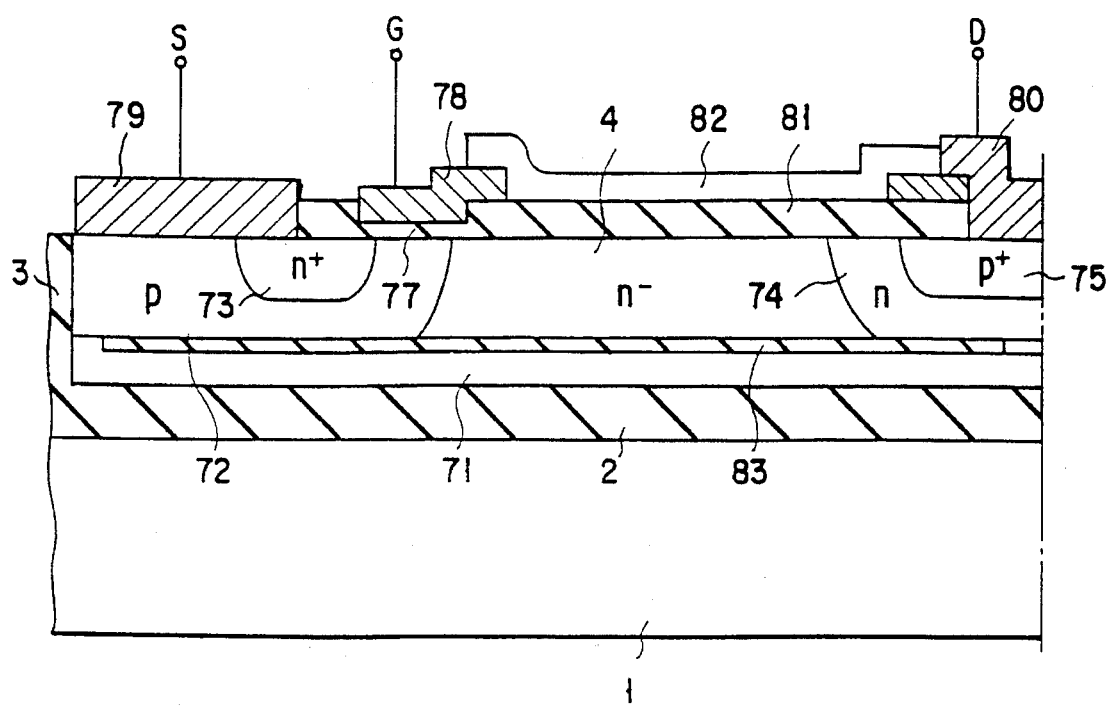
FIG. 6 is a cross sectional view showing an embodiment in which the present invention is applied to a IGBT.

FIG. 6 is an embodiment of IGBT. According to this embodiment, an oxide film 83 is formed between the high resistance silicon layer 4 and the high resistance film 71. The oxide film 83 has an opening under the source region and the drain region. Due to this, one end of the high resistance film 71 is set to be source potential through the p type base layer 72, and the other end is set to be drain potential through the n type base layer 74. Since the portion therebetween is insulated from the high resistance silicon layer 4 by the oxide film 83, potential gradient generated in the high resistance film 71 is more equalized than that of FIG. 6.

In order to prepare such IGBT, the oxide film 83 is formed on the surface of the substrate, serving as the high resistance silicon layer 4, an opening for contact is formed, and the high resistance film 71 such as SIPOS is deposited thereon. An oxide film is formed on either the surface of the high resistance film 71 or that of the base substrate 1 or both surfaces by CVD or thermal oxidation, and these substrates are directly bonded. The base substrate may be formed by depositing polycrystalline silicon in place of the bonding. The method of performing the element isolation due to the trench groove thereafter is the same as that of FIG. 43. Moreover, similar to the embodiment of FIG. 44, since the thickness of the high resistance silicon layer is set to be about 1 μm to 5 μm, the p type base layer 72 and the n type base layer 74 reach to the high resistance film 71.

According to this embodiment, the high resistance film 71 of the bottom portion of the high resistance silicon layer 4 shields influence of the potential of the substrate. As the same time, similar to the upper high resistance film 8, the high resistance film 71 serves as a field plate. Due to this, this embodiment also shows that the sufficiently high breakdown voltage characteristic can be obtained.

Figure 7:
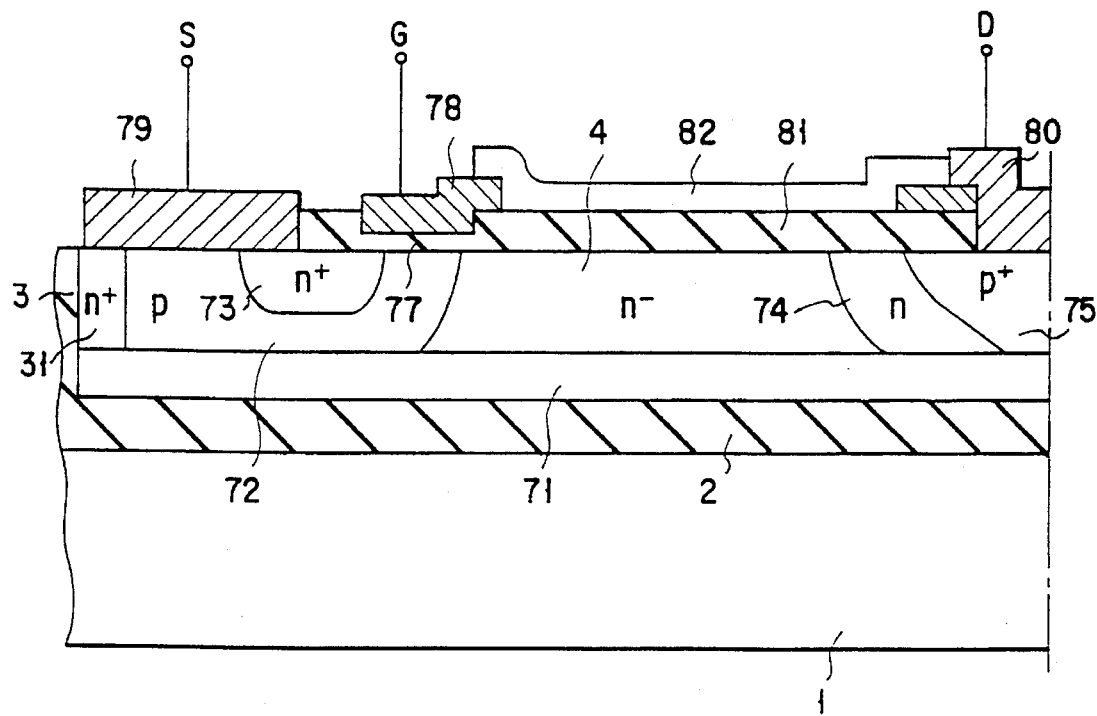
FIG. 7 is a cross sectional view showing an IGBT of an embodiment in which the structure of FIG. 6 is modified.

FIG. 7 is an embodiment of IGBT in which the embodiment of FIG. 6 is modified. The drain layer 75 reaches up to the high resistance film 71. The $n^+$ type layer 31 is formed in the side portion of the high resistance silicon layer 4. Due to this, the high resistance voltage characteristic can be also obtained according to this embodiment.

FIG. 8 is an embodiment of IGBT in which the connection method of the high resistance film 82 is changed based on the embodiment of FIG. 7. One end of the high resistance film 82 is connected to the surface of the $n^+$ type source layer 73, and the other end is connected to the $p^+$ type drain layer 75 and the drain electrode 80. On the drain side, the high resistance film 82 and the drain electrode 80 may be separated from each other. Moreover, the source side end of the high resistance film 82 may be connected to the source electrode 79.

FIG. 9 is an embodiment of IGBT in which the embodiment of FIG. 6 is modified. The drain layer 75 is formed to reach the high resistance film 71. Conductive members 84 and 85 such as metallic wires are connected to the source electrode 79, the drain electrode 80 and the high resistance film 71, thereby further high breakdown voltage can be obtained.

The formation of the high resistance film such as SIPOS in the bottom portion of the element as explained in the embodiments of FIGS. 6 to 9 is useful to the embodiments previously shown.

Since the high resistance silicon layer 4 is thin in the embodiments of FIGS. 6 to 9, the oxide film reaching to the high resistance film 71 from the surface can be easily formed. Due to this, the element isolation can be performed by an LOCOS method in place of the formation of the element isolation groove.

Figure 10:
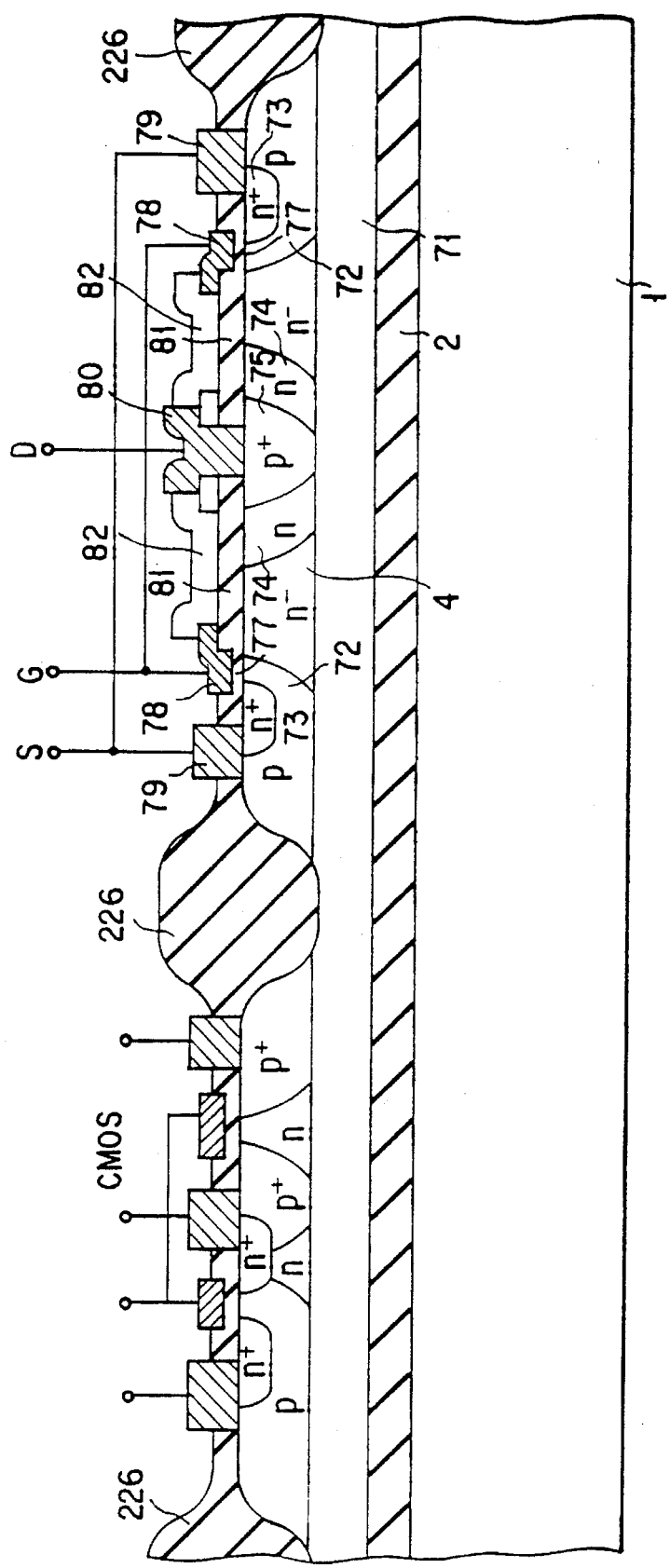
FIG. 10 is a cross sectional view showing an embodiment in which the lateral element isolation of the element of FIG. 7 is performed by LOCOS method.

FIG. 10 is an embodiment in which the element isolation is performed by the LOCOS method. There is locally formed an oxide film 226 reaching to the high resistance film 71 from the surface of the high resistance silicon layer 4, thereby the element isolation in the lateral direction is performed. According to this embodiment, IGBT shown in FIG. 46 is formed in one of the regions separated by the oxide film 226, and a CMOS circuit, serving as a logic circuit, is formed in the other region. It is noted that the n⁺ type layer 31 of FIG. 46 is formed on the side surface of the trench and is not shown in FIG. 46. An n⁺ type layer corresponding to the n⁺ type layer 31 may be formed under the source electrode 79 of IGBT to reach to the high resistance film 71. Thereby, the electrical connection between the source electrode 79 and the high resistance film 71 can be much improved.

Figure 11:
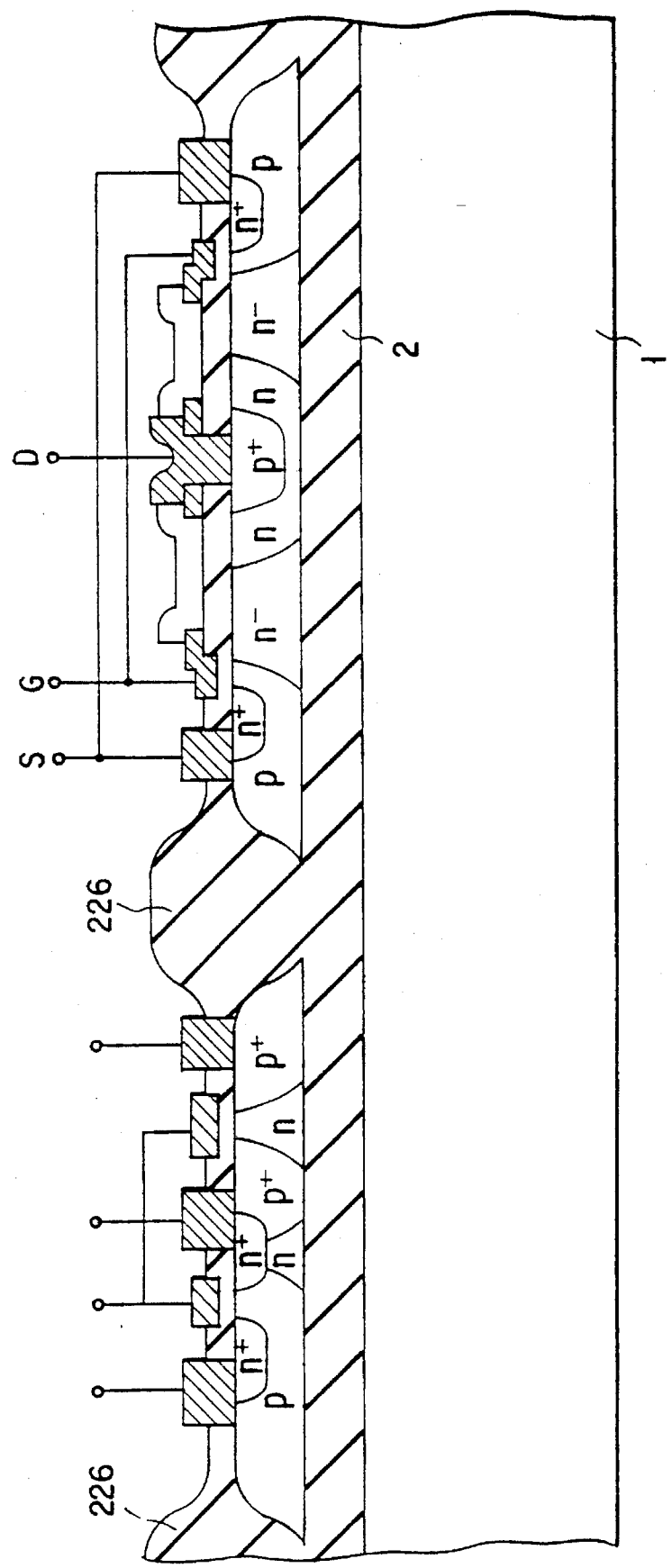
FIG. 11 is a cross sectional view showing an embodiment in which the structure of FIG. 10 is partially modified.

FIG. 11 is an embodiment in which no high resistance film 71 of FIG. 10 is formed. In place of the high resistance film 71, the thickness of the oxide film 2 is set to be 2μ or more, thereby the high breakdown voltage characteristic can be obtained.

Figure 12:
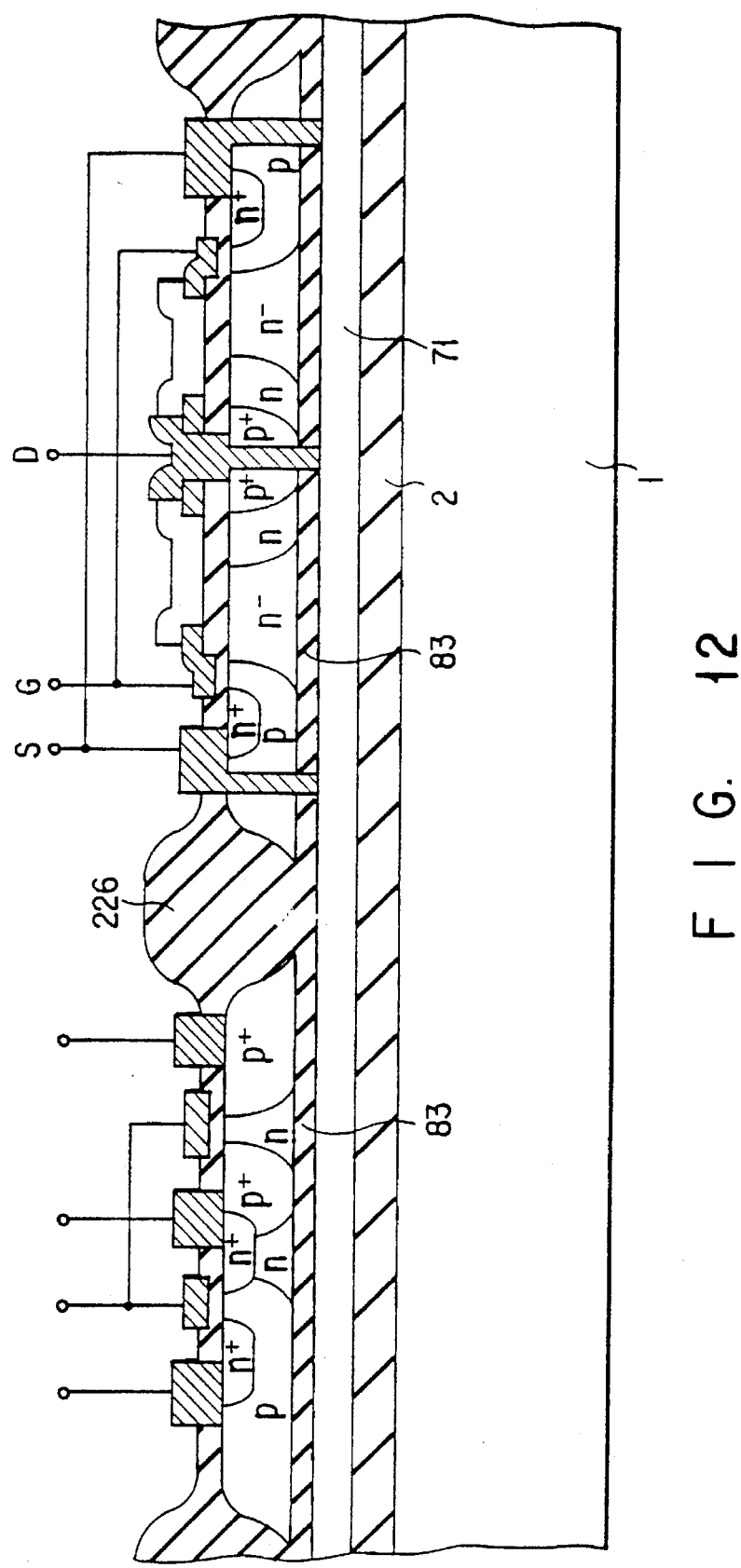
FIG. 12 is a cross sectional view showing an embodiment in which the element isolation due to LOCOS method is applied to the embodiment of FIG. 9.

FIG. 12 is an embodiment in which the element isolation by the LOCOS method is applied to the embodiment of FIG. 9. The LOCOS oxide film 226 is formed so as to reach the oxide film 83 from the surface of the high resistance silicon layer 4.

Figure 13:
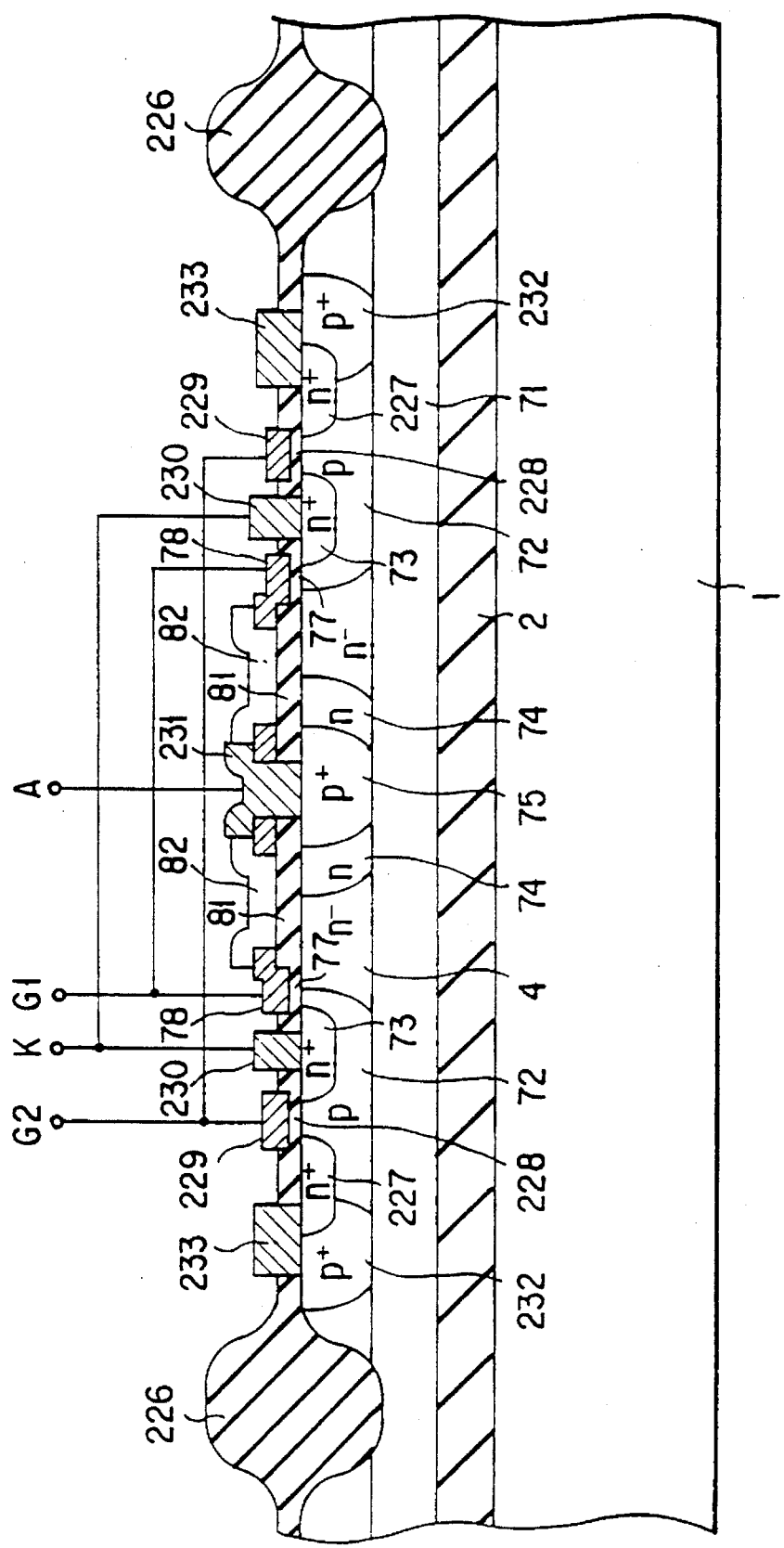
FIG. 13 is a cross sectional view showing an embodiment in which an MCT is formed in the region isolated by the LOCOS.

FIG. 13 is an embodiment in which MCT is formed in the region separated by the LOCOS method. The MCT is formed by partially modifying IGBT of the embodiment of FIG. 10. An n⁺ type region 227 is formed in the p type region 72 to be parallel to the n⁺ type region 73. On the surface portion of the p type region 72 sandwiched between the n⁺ region 73 and the n⁺ region 227, there is formed a second gate electrode 229 through the gate insulating film 228. A cathode electrode 230 is formed on the n⁺ type region 73, and an anode electrode 231 is formed on the p⁺ type region 75. A p⁺ type region 232 is formed adjacent to the n⁺ type region 227 so as to improve contact with the p type region. An electrode 233 is formed over the n⁺ type region 227 and the p⁺ region 232. It is noted that the electrode 233 may not be formed in this case.

The element of this embodiment is driven to be on 10 by the first gate electrode 78, and off by the second gate electrode 229.

Figure 14:
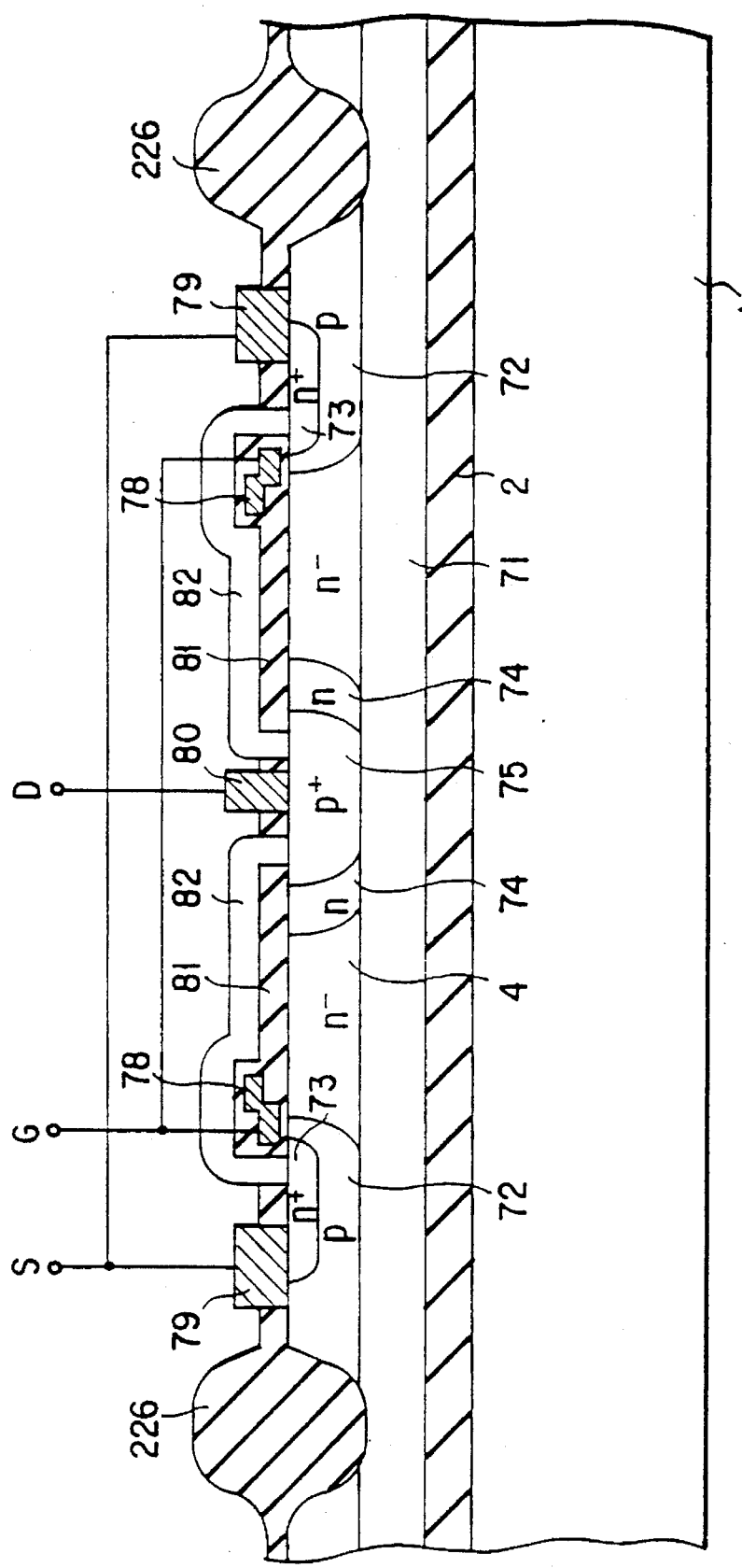
FIG. 14 is a cross sectional view showing an embodiment an which IGBT of the embodiment of FIG. 10 is partially modified.

FIG. 14 is an embodiment in which the IGBT of the embodiment of FIG. 10 is partially modified. Ends of the high resistance film 82 are connected to the surface of the n⁺ type source layer 73 and the surface of the p⁺ type drain layer 75, respectively. The source side end may be connected to the source electrode 79.

FIG. 15 is an embodiment in which the IGBT of the embodiment of FIG. 10 is partially modified. In place of the high resistance film 71, a polycrystalline silicon film 234 is buried in the oxide film 2. The polycrystalline silicon film 234 is set to have a predetermined resistivity by an ion implantation, and patterned in a strip form or a mesh form with a suitable space. The polycrystalline silicon film 234 serves as a field plate, and the element having the high voltage characteristic can be realized.

FIG. 16 is an embodiment in which a polycrystalline silicon film 235, which is similar to the polycrystalline silicon film 234, under the polycrystalline silicon film 234 based on the element of the embodiment of FIG. 15. These two-layered polycrystalline silicon layers 234 and 235 are alternately arranged such that the spaces thereof do not correspond to each other. More specifically, these films are patterned such that the polycrystalline silicon film 235 is surely arranged under the space of the polycrystalline silicon film 234. By such an arrangement of the polycrystalline silicon films, influence of the potential of the substrate 1 on the element is effectively shielded.

Figure 17A:
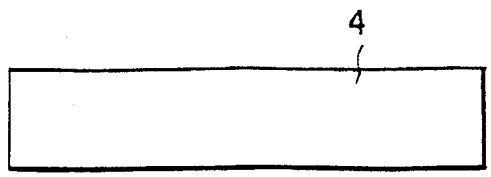
FIGS. 17A to 17P are cross sectional views showing a manufacture process of the device substrate of the embodiment of FIG. 16.
Figure 17B:
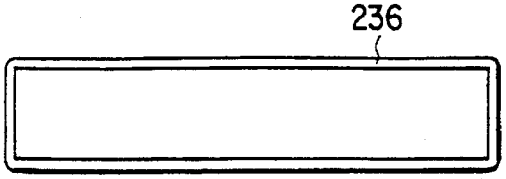
Figure 17C:
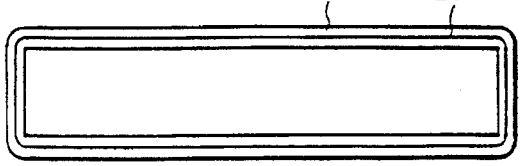
Figure 17D:
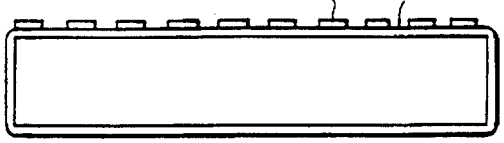
Figure 17E:
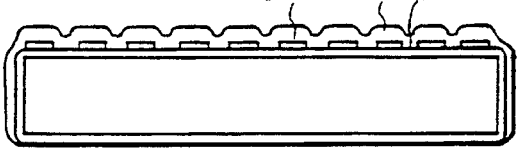
Figure 17F:
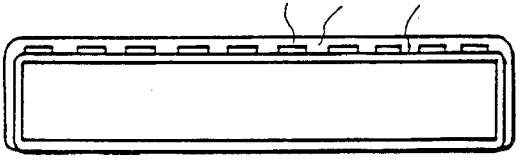
Figure 17G:
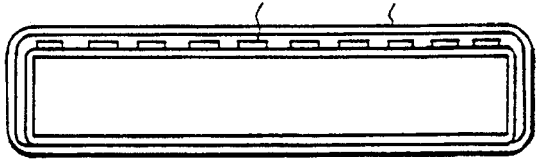
Figure 17H:
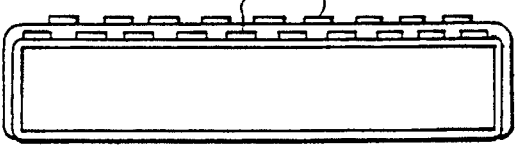
Figure 17:
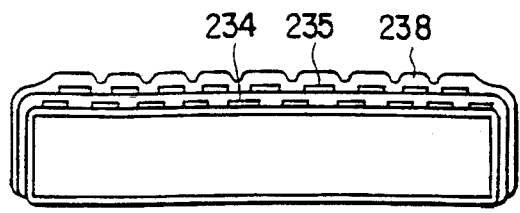
Figure 17J:
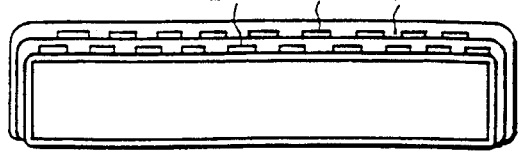
Figure 17K:
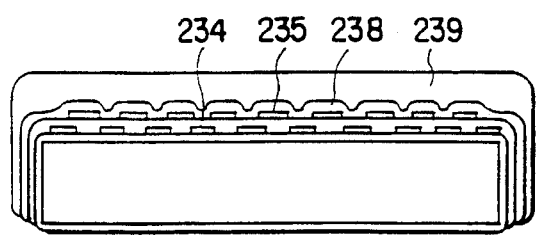
Figure 17L:
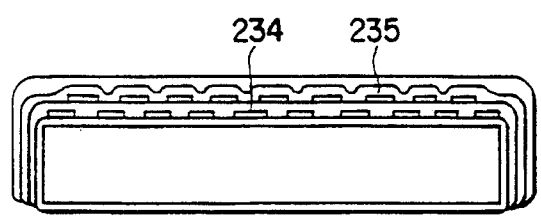
Figure 17M:
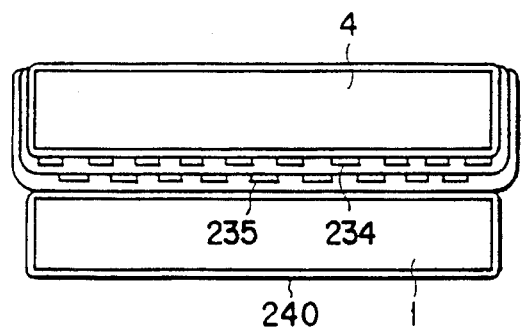
Figure 17N:
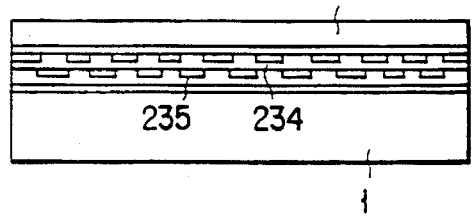
Figure 17O:
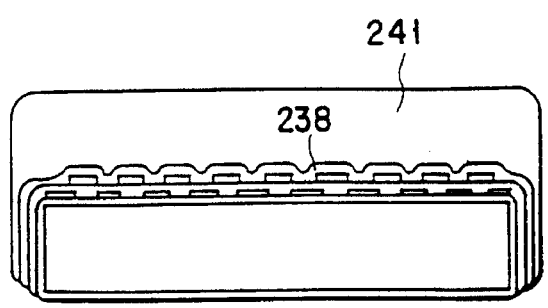
Figure 17P:
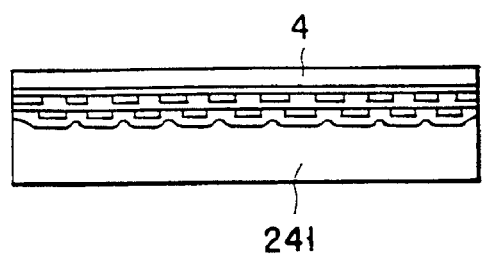

FIGS. 17A to 17P are views showing the manufacturing process of the dielectic isolation element substrate of FIG. 16.

A silicon substrate of FIG. 17A is used as the high resistance silicon layer 4 which is the element region. As shown in FIG. 17B, an oxide film 236 is formed on the silicon substrate by thermal oxidation. Then, as shown in FIG. 17C, a polycrystalline silicon film 234 is formed thereon. Thereafter, an impurity is doped by the ion plantation, and as a result, a predetermined resistivity is applied to the polycrystalline silicon film 236. Then, as shown in FIG. 17D, the polycrystalline silicon film 234 is formed in a stripe pattern or a mesh pattern to have a predetermined space. Thereafter, as shown in FIG. 17E, the upper portion of the polycrystalline silicon film 234 and the space portion are completely buried with an oxide film 237 by CVD.

Then, as shown in FIG. 17F, the surface of the film is polished and flattened, and the polycrystalline silicon film 235 is again deposited thereon, and patterned as shown in FIG. 17H. Thereafter, as shown in FIG. 17I, a CVD oxide film 238 is deposited thereon, and the surface thereof is polished and flattened as shown in FIG. 17J. The process shown in FIGS. 17G to 17J is the repetition of the process shown in FIGS. 17C to 17F.

In place of the process in which the deposited film of FIG. 17I is polished as shown in FIG. 17J, it is possible to perform a process in which a thicker polycrystalline silicon film 239 is deposited, and polished as shown in FIG. 17K, so that the flattened substrate can be obtained as shown in FIG. 17L.

Other than the substrate of FIG. 17J (or FIG. 17L) having the oxide film formed by burying two-layered polycrystalline silicon films, the silicon substrate having a thermal oxide film 240 is prepared. Then, as shown in FIG. 17M, the silicon substrate is directly bonded to the two-layered polycrystalline silicon films, thereby obtaining the integrated substrate. Then, as shown in FIG. 17N, the integrated substrate is polished such that the high resistance silicon layer 4 has a predetermined thickness, so that the device substrate is completed. In this case, an incomplete bonded portion which is the peripheral portion of the device substrate is cut. The thermal oxide film 240 of the substrate 1 of FIG. 17M is not always formed.

In the above example, the manufacturing process of the dielectric isolation element using two substrates has been explained. However, the device substrate can be obtained using one substrate. For example, after the substrate is formed as shown in FIG. 17I, a polycrystalline silicon 241 is deposited thick as shown in FIG. 17O, and the polycrystalline silicon 241 is used as a base substrate as it is. Then, as shown in FIG. 17P, the high resistance silicon layer 4 is polished to have a predetermined thickness, thereby obtaining the same device substrate.

In the above element substrate forming process, if the deposition step of a polycrystalline silicon film 235, and the patterning step are omitted, the device substrate shown in the embodiment of FIG. 15 can be obtained.

FIG. 18 is an embodiment in which the embodiment of FIG. 16 is partially modified. In this embodiment, the polycrystalline silicon film 234 is formed only under a drift layer between the p type base layer 72 and the n type base layer 74.

FIG. 19 is an embodiment in which the embodiment of FIG. 16 is partially modified. In this embodiment, the polycrystalline silicon films 234 and 235 are formed only under the drift layer between the p type base layer 72 and the n type base layer 74.

FIG. 20 is an embodiment in which the embodiment of FIG. 15 is partially modified. Similar to the embodiment of FIG. 9, the conductive members 84 and 85 such as metal are buried under the source electrode 79 and the drain electrode 80, thereby the polycrystalline silicon 234 formed in the bottom portion of the device is connected to the source electrode 79 and the drain electrode 80. Each of portions 234a and 234b to be connected to each of conductive members 84 and 85 is designed to have a suitable length for a field plate.

FIG. 21 is an embodiment in which the polycrystalline silicon 235 is formed under the polycrystalline silicon 234 as shown in the embodiment of FIG. 16 and influence of the substrate potential is effectively shielded based on the embodiment of FIG. 20.

Figure 22:
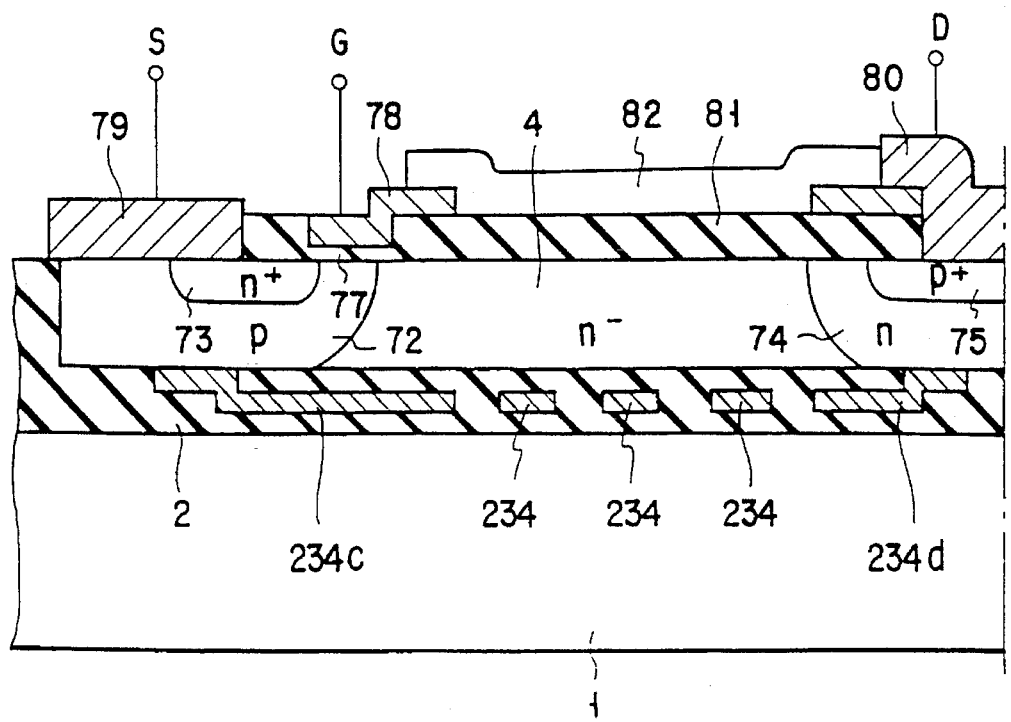
FIG. 22 is a cross sectional view showing an embodiment in which the embodiment of FIG. 15 is partially modified.

FIG. 22 is an embodiment in which the embodiment of FIG. 15 is partially modified. The portions 234c and 234d of the polycrystalline silicon film 234 buried in the silicon oxide film 2 which are formed under the p type base layer 72 and the n type buffer layer 74, are exposed to the upper surface of the oxide film 2, and connected to the p type base layer 72 and the n type buffer layer 74, respectively. Due to this, that portion of the polycrystalline film 234, which is just under the source and that portion of the polycrystalline film 234, which is just under the drain thereof, are set to be source potential and drain potential, respectively. The portions 234c and 234d of the polycrystalline silicon film 234 having the above-set potential are set to have suitable lengths as field plates similar to the embodiment of FIG. 20.

In order to manufacture the above-mentioned device structure, to the steps explained in FIGS. 17A to 17P, there may be added a step of forming an opening in an oxide film 236 at a portion to be used as a connecting portion between the p type base layer 72, and the polycrystalline silicon 234c, and between the n type buffer layer 74, and and the polycrystalline silicon 234d.

Figure 23:
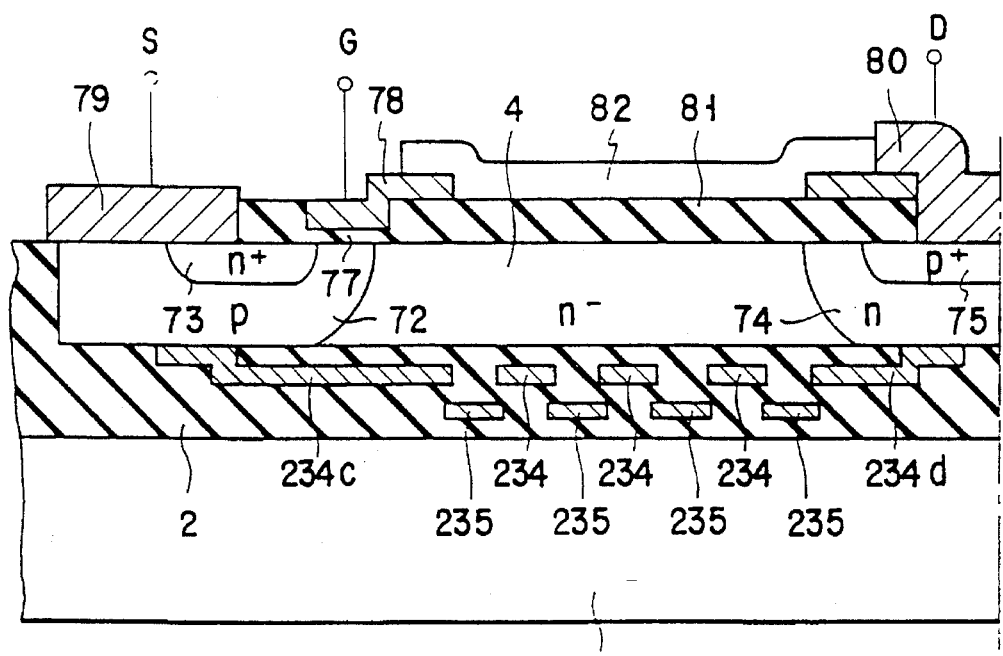
FIG. 23 is a cross sectional view showing an embodiment in which the embodiment of FIG. 22 is partially modified.

FIG. 23 is an embodiment in which the polycrystalline silicon film 235 is formed at a level lower that that of the polycrystalline silicon film 234 similar to the embodiment of FIG. 19.

FIG. 24 is an embodiment in which IGBT of the embodiment of FIG. 15 is partially modified. In this embodiment, in place of the high resistance film 82 of the embodiment of FIG. 15, a polycrystalline silicon film 242, which is similar to the polycrystalline silicon film 234 buried in the oxide film 2, is formed as a field plate. Since the polycrystalline silicon film 242 can be formed at the same time with the gate electrode 78, the manufacturing process of this embodiment is easier than that of the embodiment of FIG. 15.

FIG. 25 is an embodiment in which the polycrystalline silicon film 235 is further formed at a level lower than that of the polycrystalline silicon film 234 of the bottom portion as in the embodiment of FIG. 16 and the polycrystalline silicon film 243 is further formed at a level higher than that of the polycrystalline silicon film 242. Thereby, shield effect against the upper and lower elements increases.

The material of the films 234, 235, 242, and 243 explained the embodiments of FIGS. 15 to 25 are not limited to polycrystalline silicon. It is possible to replace polycrystalline silicon with SIPOS and the other conductive materials, or resistance materials. Moreover, the modifications explained in FIGS. 15 to 25 are useful for the diode, MOSFET, MCT, EST.

As explained above, according to the present invention, in the high breakdown voltage semiconductor device comprising the high resistance semiconductor layer, which is separated from the base semiconductor substrate by the first insulating film and separated in the lateral direction by the second insulating film or the pn junction, and the first low resistance region of the first conductive type and the low resistance region of the second conductive type formed in the surface portion of the high resistance semiconductor layer, the thickness of the first insulating film is set to be 1 µm or more, reverse bias voltage of the device is largely shared by the first insulating film, and electrical field in the high resistance semiconductor layer, which depends on the electrical field in the first insulating film, is weakened, thereby sufficiently high breakdown voltage can be obtained even if the high resistance semiconductor layer is thin. Moreover, since the high resistance semiconductor layer can be made thin, the element separation can be easily made.

According to the second specific form of the present invention, a thin active layer is used such that a high impurity concentration layer formed in a high resistance active layer reaches to the first insulating film for isolation. With the structure of the present invention, for example, it is assumed that the high impurity concentration layer of the first conductivity type is formed to reach to the depth of the first insulating film, and high voltage is applied to the high impurity concentration layer of the first conductivity type such that the pn junction becomes reverse biased in a state that the high impurity concentration of the second conductivity type and the substrate are grounded. At this time, voltage to be applied to the high impurity concentration layer of the first conductivity type is all shared by the first insulating film in the vertical direction. The lateral potential distribution of the surface of the active layer is made uniform in accordance with the uniform potential distribution to be formed in the high resistance film formed in the surface of the active layer. Thereby, the field concentration in the active layer is relaxed and the high breakdown voltage characteristic, which cannot be expected from the prior art, can be obtained.

Moreover, according to the present invention, since the thin active layer is used, the element isolation in the lateral direction can be easily performed.

The second specific form of the present invention will be explained with reference to the drawings.

FIG. 26 shows a lateral type diode relating to one embodiment of the present invention. An n⁻ type high resistance silicon layer (active layer) 303 is formed on a silicon substrate 301 through a silicon oxide film (first insulating layer) 302. The thickness of the silicon oxide film 302 is set to be about 1 to 5 µm. The n⁻ type active layer 303 is set to have the thickness of 2 µm or less, preferably 0.4µ or less, the total amount of impurities of $1.0 \times 10^{10}/cm^2$ to $2.0 \times 10^{12}/cm^2$, preferably 0.5 to $1.8 \times 10^{12}/cm^2$. A p type anode layer 304 having high impurity concentration and an n type cathode layer 305 having high impurity concentration are formed in the active layer 303 to be separated from each other with a predetermined distance. The p type anode layer 304 and the n type cathode layer 305 are formed by impurity diffusion to the depth reaching to the silicon oxide film 302 as shown in the drawing. However, the p type anode layer 304 may be formed by impurity diffusion to the depth which does not reach to the silicon oxide film 302.

On the region sandwiched between the p type anode layer 304 of the active layer 303 and the n type cathode layer 305, there is formed a high resistance film 307 through a silicon oxide film (second insulating film) 306. The thickness of the high resistance film 307 is set to be 0.3 µm or less, preferably 0.2 µm or less. As the high resistance film 307, for example, SIPOS (Semi-Insulating Polycrystalline Silicon) is used. The surface of the high resistance film 307 is coated with a silicon oxide film 308, serving as a protection film.

An anode electrode 309 and a cathode electrode 310 are formed on the p type anode layer 304 and the n type cathode layer 305, respectively. Both ends of the high resistance film 307 are connected to the anode electrode 309 and the cathode electrode 310.

According to this embodiment, excellent high breakdown voltage can be obtained. For example, it is assumed that the p type anode layer 304 and the substrate 301 are grounded and positive high voltage is applied to the n type cathode layer 305. Since the n type cathode layer 305 is formed to the depth reaching to the silicon oxide film 302, voltage to be applied to the n type cathode layer 305 is all shared by the silicon oxide film 302. Moreover, micro-current flows in the high resistance film 307 formed on the surface of the active layer 303, and a uniform potential distribution is formed in the high resistance film 307 in the lateral direction. Also, in the active layer 303 right under the high resistance film 397, such a uniform potential distribution is formed in the lateral direction by influence of the potential distribution in the high resistance film 307. As a result, field concentration in the device is relaxed and high breakdown voltage can be realized.

In order to have sufficient influence of the uniform potential distribution in the high resistance film 307 on the active layer 303, it is better that the silicon oxide film 306 under the high resistance film 307 is thinned, and favorable high voltage characteristic strength can be obtained if the thickness of the high resistance film 307 is 0.2 μm or less. Moreover, in order to make influence of the substrate potential on the active layer 3 small and make influence of the potential of the high resistance film 307 thereon relatively large, it is better that the silicon oxide film 302 under the active layer 303 is thicker than the active layer.

The specific data supporting the effect of the above embodiment will be explained as follows.

FIG. 81 shows the relationship between the total amount of impurities of the n⁻ type active layer 303 and voltage strength. As is obvious from FIG. 81, when the total amount of impurities exceeds the point of about $1.8 \times 10^{12}/cm^2$, breakdown voltage rapidly drops. Therefore, the range of the total amount of impurities, which can be allowed to obtain breakdown voltage of about 500 V or more, is $1.0 \times 10^{10}/cm^2$ to $2.0 \times 10^{12}/cm^2$.

Figure 82:
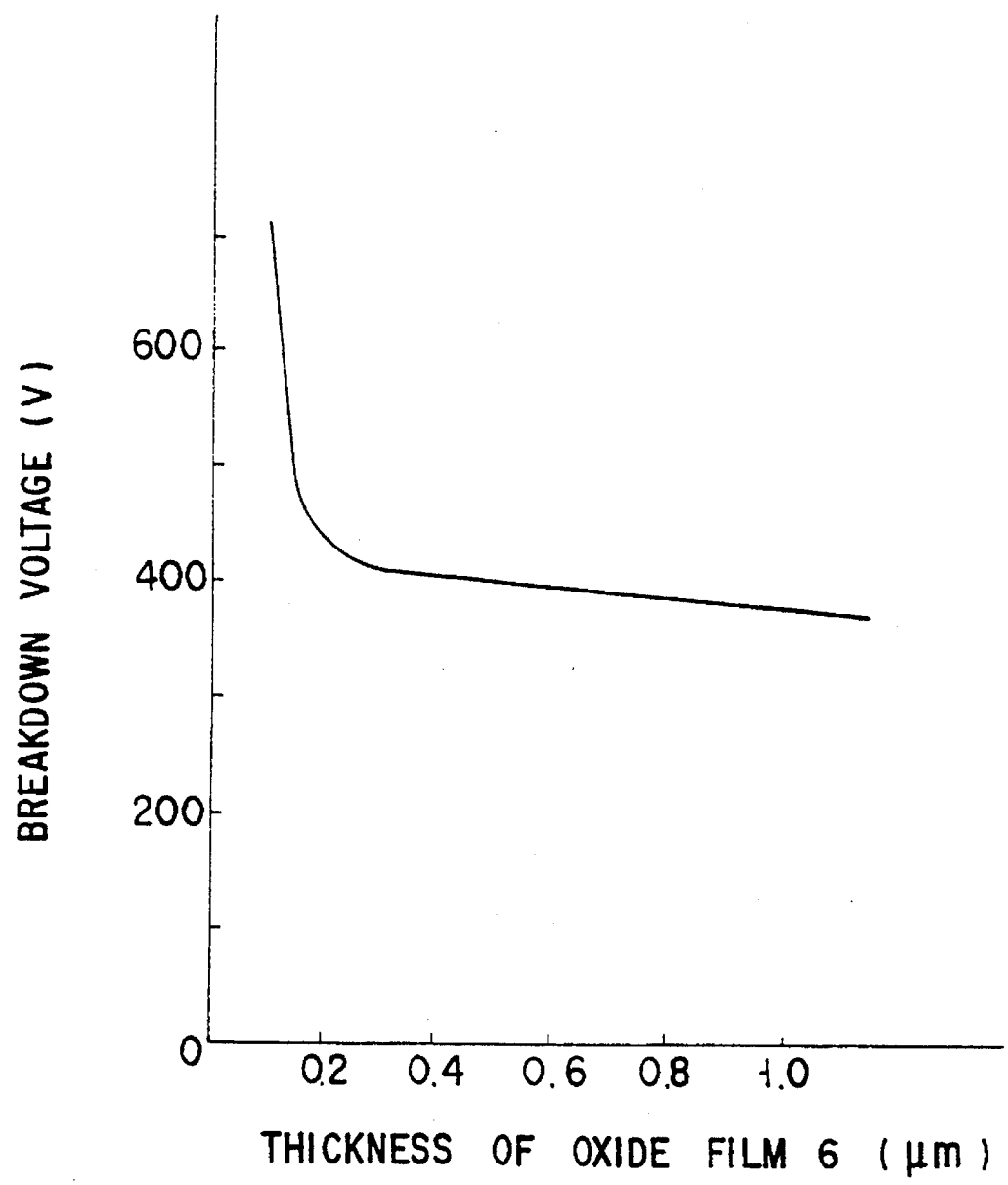
FIG. 82 is a view showing the relationship between the thickness of an oxide film under the high resistance film and breakdown voltage in the embodiment of FIG. 26.

FIG. 82 shows the relationship between the thickness of the oxide film 306 under the high resistance film 307 and breakdown voltage when the thickness of the active layer 303 is 0.1 μm. If the thickness of the oxide film 306 is too large, the effect of the uniform potential distribution of the active layer due to high resistance film 307 cannot be obtained. If the thickness of the oxide film 306 is 0.3 μm or less, the effect can be brought about. Particularly, if the thickness is 0.2 μm or less, it is understood that the effect to improvement of high breakdown voltage can be considerably brought about.

Figure 83:
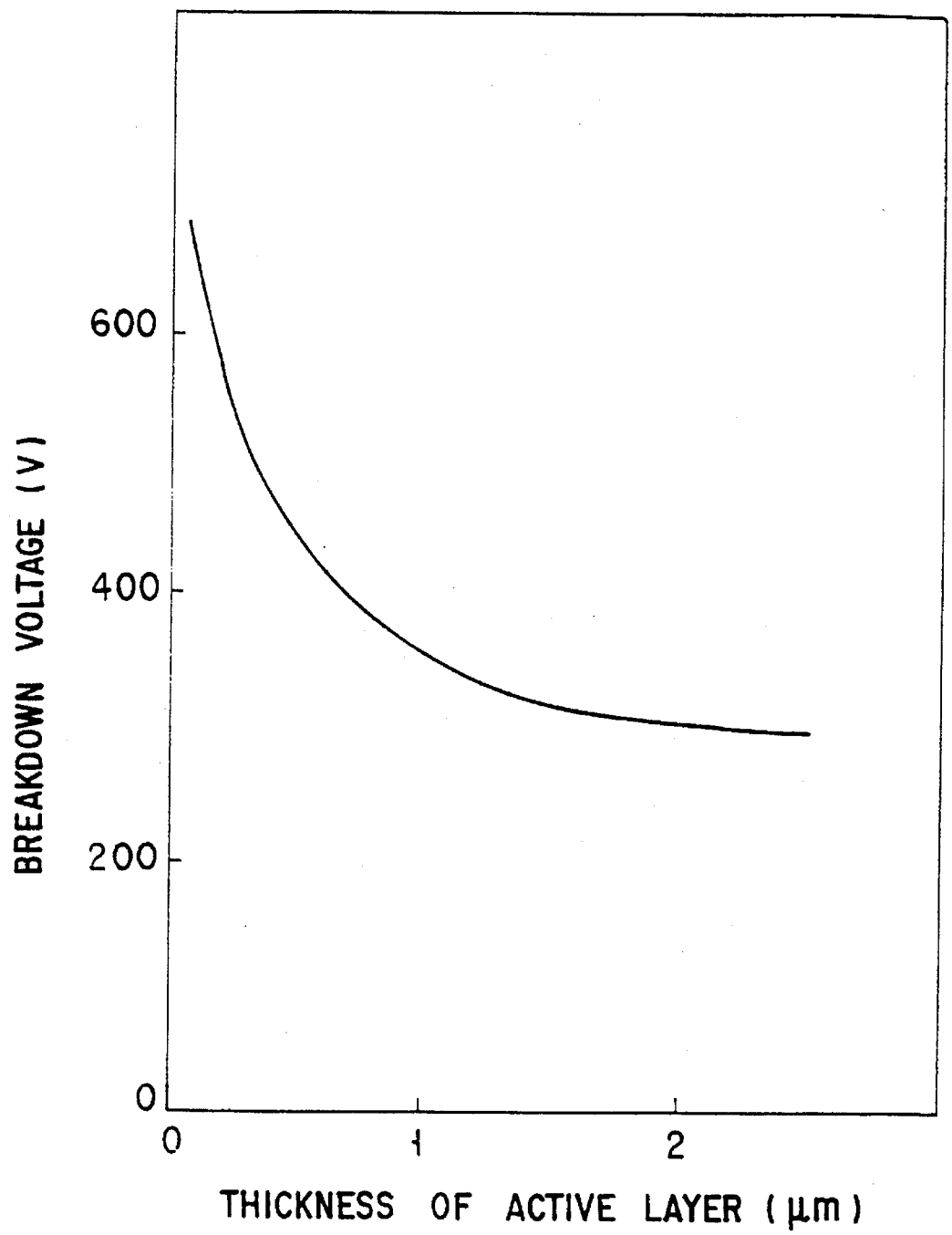
FIG. 83 is a view showing the relationship between the thickness of the active layer and breakdown voltage in the embodiment of FIG. 26.
Figure 88:
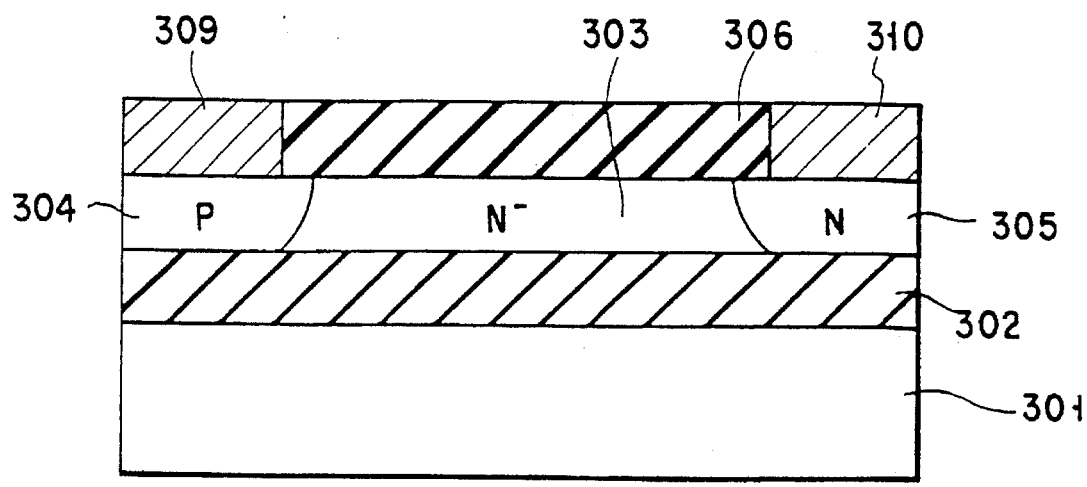
Figure 89:
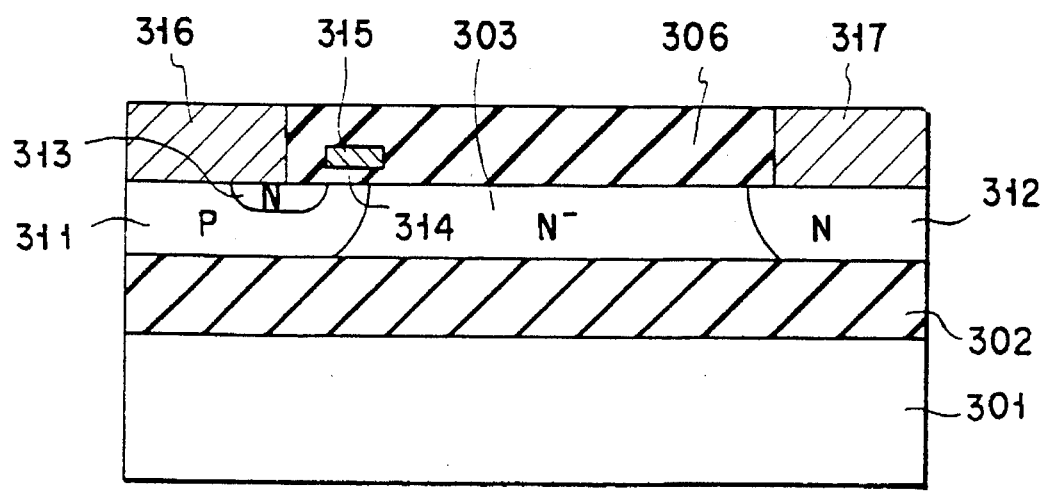

FIG. 83 is data showing the relationship between the thickness of the active layer 303 and breakdown voltage. In a case where the thickness of the active layer is 2 μm or less, breakdown voltage is improved as the active layer becomes thinner. This is because the p type anode layer 304 and the cathode layer 305 are formed to reach the depth of the oxide film 302 and there is the effect of the uniform potential distribution in the active layer 303 due to the high resistance film 307 on the active layer 303.

FIG. 27 is an embodiment in which the formation of the silicon oxide film under the high resistance film 307 is omitted and the high resistance film 307 is directly formed on the surface of the active layer 303 based on the structure of the embodiment of FIG. 65. According to this structure, the uniform potential distribution of the high resistance film 307 is directly transmitted to the inside of the active layer, and field concentration is effectively relaxed.

FIG. 28 is an embodiment in which the present invention is applied to MOSFET. Similar to the embodiment of FIG. 26, the n⁻ type high resistance silicon thin layer 303 having a thickness of 2 μm or less is formed on the silicon substrate 301 through the silicon oxide film 302. The total amount of impurities of the n⁻ type active layer 303 is also the same as that of the embodiment of FIG. 26. A p type base layer 311 and an n type drain layer 312, which correspond to the p type anode layer 304 and the n type cathode layer 305, respectively, are formed in the active layer 303. The p type base layer 311 and the n type drain layer 312 are formed to reach to the depth of the silicon oxide film 302. However, the p type base layer 311 may be formed to be shallower than the depth of the silicon oxide film 302. An n type source layer 313 is formed in the p type base layer 311. The surface portion of the p type base layer 311, which is sandwiched between the n type source layer 313 and the n⁻ type active layer 303, is used as a channel region, and a gate electrode 315 is formed thereon through a gate oxide film 314 having a thickness of about 60 nm.

On the surface of the active layer 303, which is sandwiched between the p type base layer 311 and the n type drain layer 312, similar to the the embodiment of FIG. 26, there is formed the high resistance film 307 through the silicon oxide film 306 having a thickness of 0.3 μm or less, preferably 0.2 μm or less. The upper portion of the high resistance film 307 is coated with the silicon oxide film 308.

A source electrode 316 is formed to be in contact with the n type source layer 313 and the p type base layer 311 at the same time. A drain electrode 317 is formed on the n type drain layer 312. The end portion of the high resistance film 307 is connected to the gate electrode 315 and the drain electrode 317.

MOSFET of this embodiment can also obtain the excellent high breakdown voltage characteristic which is similar to the diode of the embodiment of FIG. 26.

Figure 30:
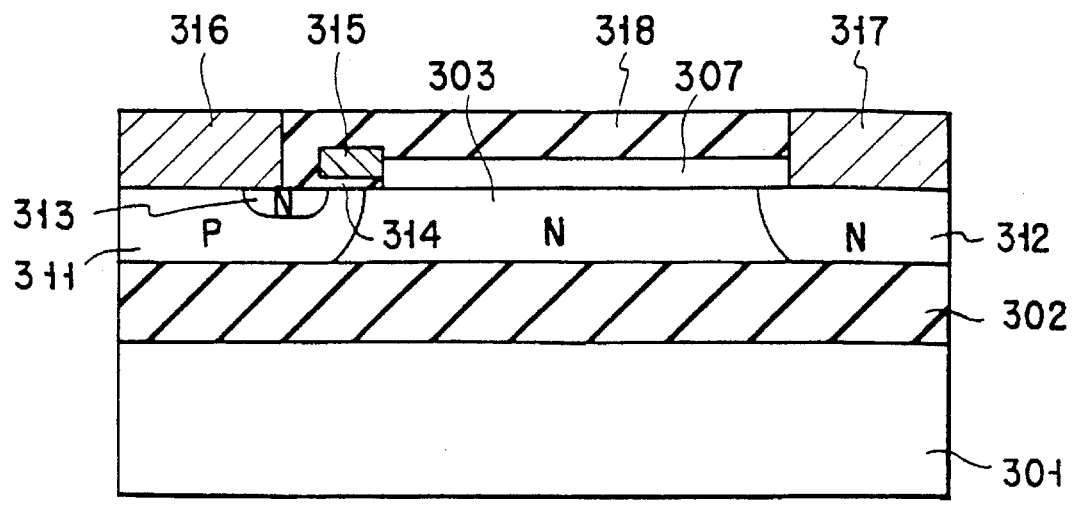
FIG. 30 is a view showing a MOSFET of an embodiment in which the structure of FIG. 28 is modified.
Figure 31:
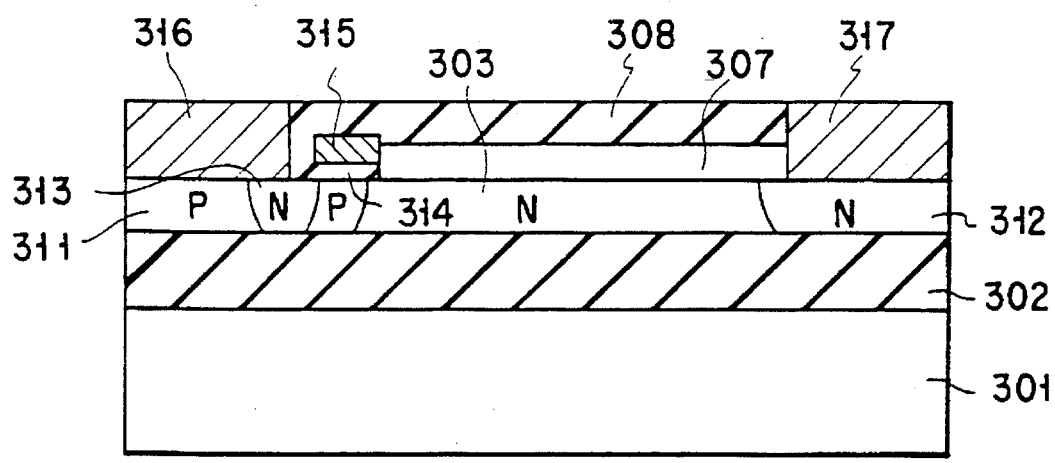
FIG. 31 is a view showing a MOSFET of an embodiment in which the structure of FIG. 29 is modified.

FIG. 29 is an embodiment in which the active layer 303 is formed to be thinner such that the n type source layer 313 reaches to the silicon oxide film 302 based on the structure of FIG. 28. FIGS. 30 and 31 are embodiments in which the high resistance film 307 is directly formed on the surface of the n⁻ type active layer 303.

These embodiments also show excellent high breakdown voltage.

Figure 32:
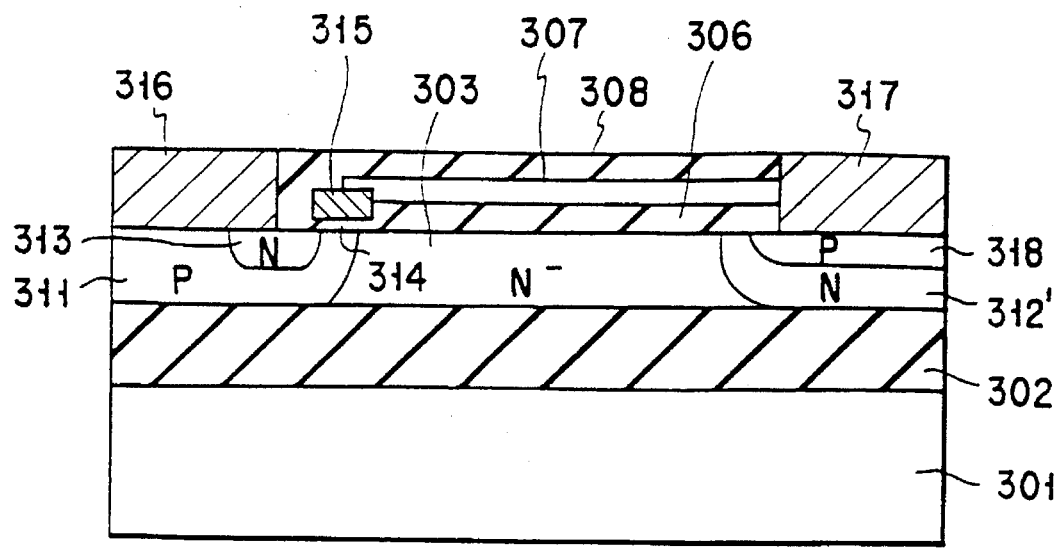
FIG. 32 is a view showing an embodiment in which the present invention is applied to the lateral type IGBT.

FIG. 32 is an embodiment in which the present invention is applied to the lateral type IGBT. The basic structure is the same as that of the embodiment of FIG. 28. In this embodiment, an n⁻ type base layer 312' corresponds to the n type drain layer 312 of FIG. 28, and the p type drain layer 318 is formed in the n type base layer 312'.

Figure 33:
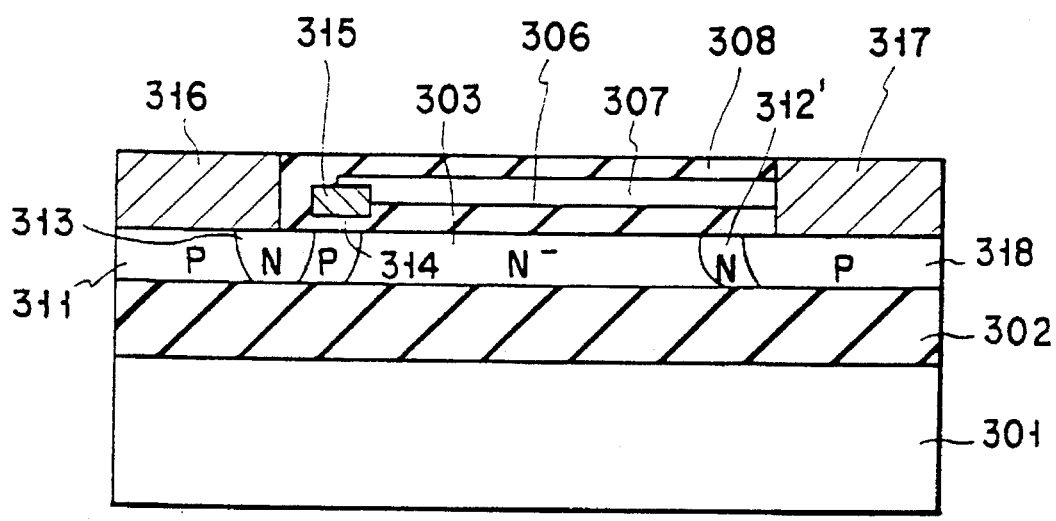
FIG. 33 is a view showing an IGBT of an embodiment in which the structure of FIG. 32 is modified.

FIG. 33 is an embodiment in which the active layer 303 is formed to be thinner such that the n type source layer 313 and the p type drain layer 318 reach to the silicon oxide film 302, similar to the embodiment of FIG. 29. At this time, since the p type drain layer 318 is in contact with the silicon oxide film 302, there is a case that a channel using a p type inversion layer is formed in the bottom portion of the active layer. In order to prevent this case, impurity concentration of the n type base layer 312' must be set to be higher. More specifically, impurity concentration of the n type base layer 312' may be $1 \times 10^{17}/cm^3$ or more.

Figure 34:
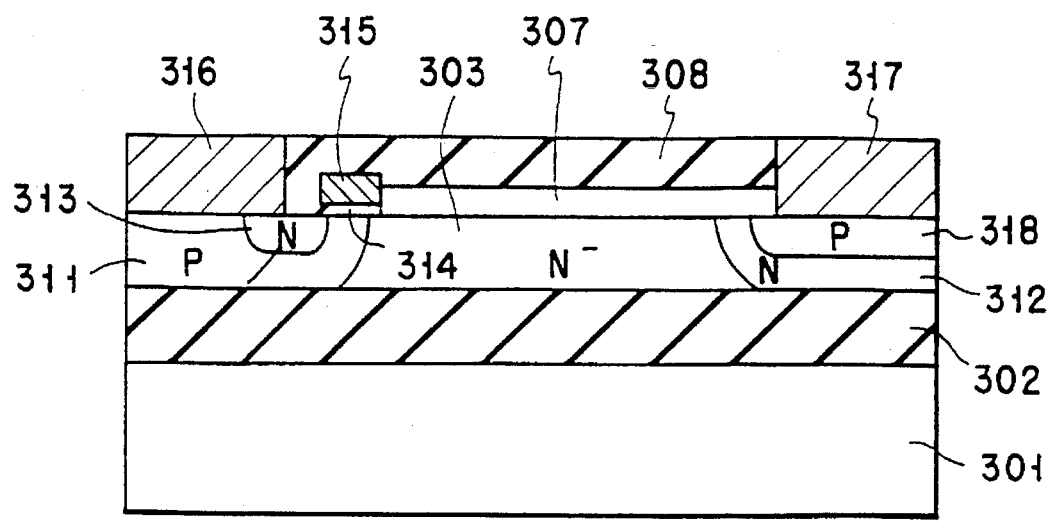
FIG. 34 is a view showing an IGBT of an embodiment in which the structure of FIG. 32 is modified.
Figure 35:
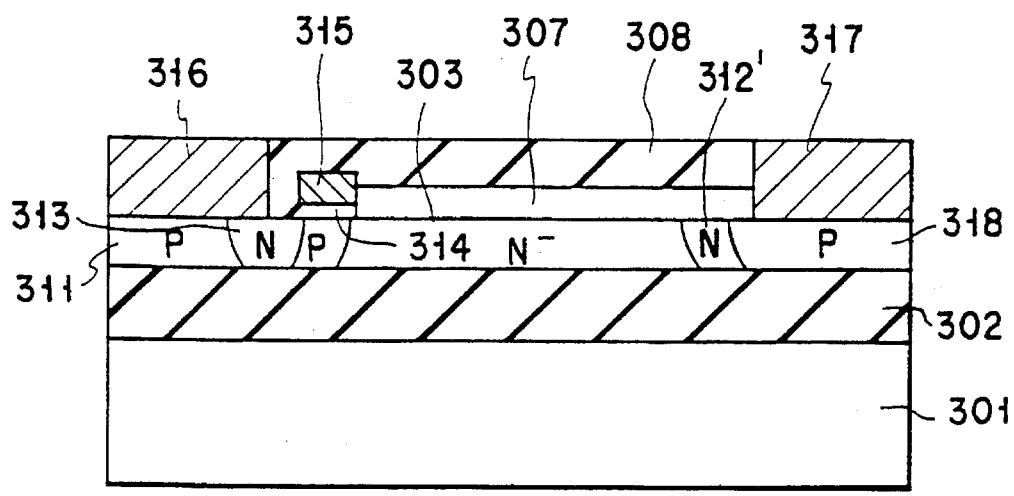
FIG. 35 is a view showing an IGBT of an embodiment in which the structure of FIG. 33 is modified.
Figure 40:
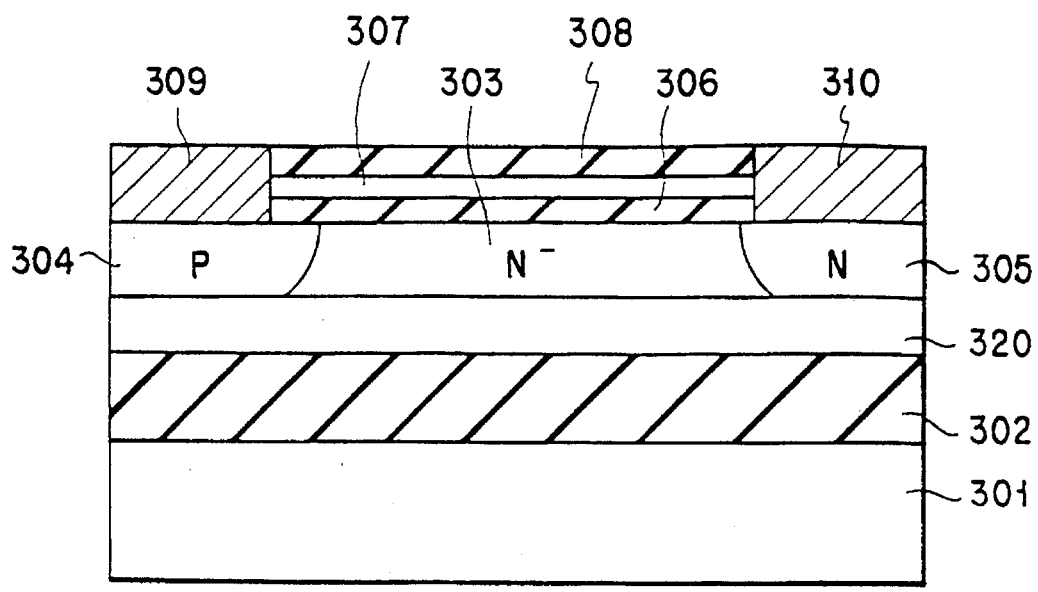
FIG. 40 is a view showing a diode of an embodiment in which a base high resistance film is added to the structure of FIG. 26.
Figure 41:
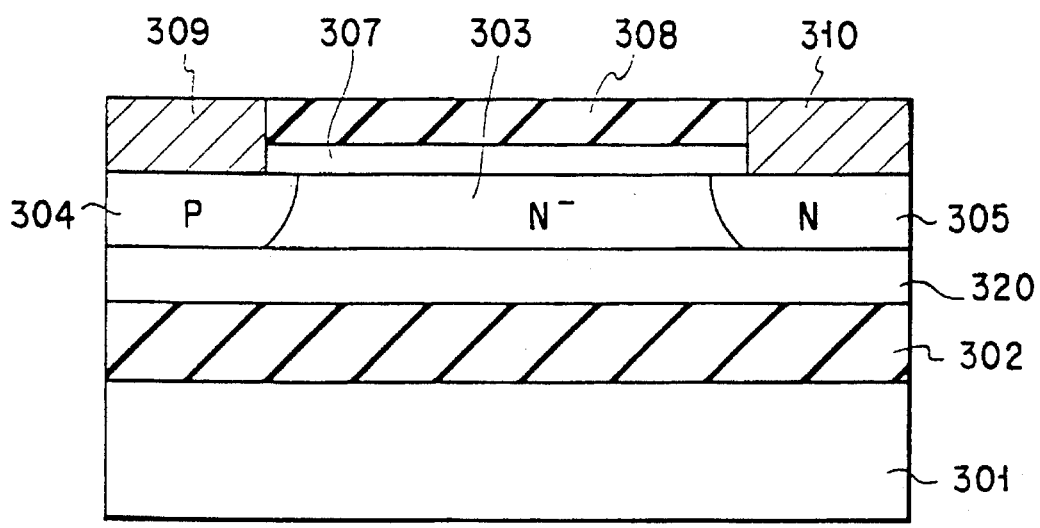
FIG. 41 is a view showing a diode of an embodiment in which a base high resistance film is added to the structure of FIG. 27.

FIGS. 34 and 35 are embodiments in which the high resistance film 307 is directly formed on the surface of the active layer 303 based on the structure of FIGS. 32 and 33.

These embodiments also show excellent high breakdown voltage.

FIG. 36 is an embodiment in which both ends of the high resistance film 307 is directly brought into contact with the p type anode layer 304 and the n type cathode layer 305.

FIG. 37 is an embodiment in which the ends of the high resistance film 307 are brought into contact with the n type source layer 313 and the n type drain layer 312, respectively, based on the MOSFET of FIG. 28. FIG. 38 is an embodiment in which the drain side end portion of the high resistance film 307 is connected to the drain electrode 317 through a polycrystalline silicon film 319 doped with impurity based on the structure of FIG. 37. FIG. 39 is an embodiment in which the source side end portion of the high resistance film 307 is connected to the n type source layer 313 based on MOSFET of FIG. 30.

In the embodiments of IGBT shown in FIGS. 32 to 35, the connection of the end portions of the high resistance film 307 can be modified (not shown) similar to the embodiment of MOSFET.

These embodiments also show excellent high breakdown voltage.

FIGS. 40 to 53 are embodiments in which a high resistance film 320 such as SIPOS is formed in the bottom portion of the active layer 303 based on the embodiments of FIGS. 26 to 39.

The high resistance film 320 formed in the bottom portion of the active layer 303 has the same function as the high resistance film 307 formed on the surface of the active layer 303. Thereby, field concentration in the element is further effectively relaxed and high breakdown voltage characteristic can be obtained.

FIGS. 54 to 67 are embodiments in which a thin silicon oxide film 321 is formed between the active layer 303 and the high resistance film 320 based on the structure of FIGS. 40 to 53. These embodiments also show that excellent high breakdown voltage characteristic can be obtained if the silicon oxide film 321 is sufficiently thinned, preferably 0.2 µm or less.

In FIGS. 40 to 53 and FIGS. 54 to 67, the anode—cathode potential or the drain—source potential is applied to the high resistance film 320 of the bottom portion of the device through the diffusion layer. However, the electrode may be connected to the high resistance film 320 by, for example, forming the groove.

In the embodiments explained so far, like the anode and cathode impurity layers of the diodes, there was explained the case in which the impurity layers of different conductivity types opposing to each other in the lateral direction in the active layer are in contact with the base oxide film of the active layer. However, the present invention is effective if at least one of impurity layers is in contact with the lower oxide film. The following explains several embodiments having such the structure.

FIG. 68 is an embodiment in which the p type anode layer 304 is not in contact with the lower oxide film 302 based on the embodiment of FIG. 26. Since it is the side of the n type cathode layer 305 that breakdown occurs by field concentration at the time of application of reverse bias, the high breakdown voltage characteristic can be sufficiently obtained in the embodiment.

Reverse to the FIG. 68, FIG. 69 is an embodiment in which the p type anode layer 304 is formed so as to reach the oxide film 302, and the n type cathode layer 305 is formed not to reach the oxide film 302. In the structure of this embodiment, if the thickness of the active layer remaining under the n type cathode layer 305 is extremely small, sufficiently high breakdown voltage characteristic can be obtained.

The similar modification can be made in the other embodiments of the diode.

FIGS. 70 and 71 are embodiments in which the n type drain layer 312 is formed not to reach the base oxide film 302 in MOSFET of the embodiments of FIGS. 30 and 31. In these embodiments, necessary high breakdown voltage characteristic can be obtained if the thickness of the active layer remaining under the n type drain layer 312 is small.

FIG. 72 is an embodiment in which the p type base layer 311 is formed to have a depth which does not contact the base oxide film 302 in the MOSFET of the embodiment of FIG. 30. In this case, for the same reason as the embodiment of the diode of FIG. 68, the high breakdown voltage characteristic can be obtained.

FIGS. 73 and 74 are embodiments in which either the source layer or the drain layer is formed to have a depth contacting the oxide film 302 in the embodiment of IGBT. In the case of IGBT, since the source and drain layers do not relate to the high breakdown voltage characteristic, there is no influence on the high breakdown voltage characteristic even if such a modification is made. Particularly in FIG. 74, the p type drain layer does not contact the oxide film 302 and the channel using the p type reverse layer can be prevented from being formed in the bottom portion of the active layer.

FIGS. 75 and 76 are embodiments in which the p type base layer 311 is formed to have a depth which does not reach to the oxide film 302 in IGBT of the embodiments of FIGS. 34 and 35. In IGBT, there is the problem in field concentration of the side of the n type base layer on the drain side at the time of application of reverse bias. Due to this, if an n type base layer 312' is formed to a depth reaching to the oxide film, high breakdown voltage characteristic can be sufficiently obtained.

Reverse to FIGS. 75 and 76, FIGS. 77 and 78 are embodiments in which the n type base layer 312' is formed to a depth which does not reach to the oxide film 302. In this case, the high breakdown voltage can be also obtained if the thickness of the active layer remaining under the n type base layer 312' is sufficiently small.

FIG. 79 is an embodiment in which the p type anode layer 304 and the n type cathode layer 305 are formed by not impurity diffusion from the top portion but lateral impurity diffusion, and the junction surface is formed to be substantially vertical to the active layer. The similar modifications can be made in the other embodiments explained so far.

In the above embodiments, the explanation of the lateral isolation of the element was omitted. However, the isolation structure as shown in FIGS. 80A to 80C can be used.

FIG. 80A shows that a silicon oxide film 322 for lateral isolation is formed to have a depth reaching to the silicon oxide film 302 of the bottom portion of the active layer 303 by LOCOS. According to the present invention, since the active layer 303 is formed to be 2 µm, the complete dielectric isolation structure can be easily obtained by such LOCOS.

In FIG. 80B, an isolation groove 323 having a depth reaching to the silicon oxide film 302 is formed and a silicon oxide film 324 is formed on the side surface thereof. Thereafter, for example, a polycrystalline silicon film 325 is buried therein.

FIG. 80C shows a pn junction isolation structure using a p type diffusion layer 326. Since the thickness of the active layer 303 is thin, the lateral isolation can be easily performed without ensuring the large area in the isolation region.

In each embodiment of diode, MOSFET and IGBT, the conductivity type of each portion can be opposed, and the present invention is useful in such a case.

As explained above, according to the present invention, there is formed the dielectric isolation structure in which the high impurity concentration layer to which high voltage is applied reaches to the base insulating film. Also, the high resistance film in which the uniform potential distribution is formed is arranged on the surface of the active layer, thereby obtaining the semiconductor device wherein the lateral element isolation is easily performed and excellent high breakdown voltage characteristic is shown.

As a specific example of the semiconductor device having high breakdown voltage relating to the second specific form of the present invention, it has been explained that the high resistance film is formed on the high resistance semiconductor layer through the insulating layer or not therethrough. However, the high resistance film is not always necessary to be formed in view of the feature of the high breakdown voltage semiconductor device relating to the above-explained second specific form of the present invention. Therefore, the following explains an example in which the high resistance film is not formed.

FIG. 84 is a lateral type diode relating to the embodiment of the present invention. The n⁻ type high resistance silicon layer (active layer) 303 is formed on the silicon substrate 301 through the silicon oxide film (first insulating film) 302. The thickness of the silicon oxide film 302 is about 1 to 5 μm. The n-type active layer 303 has and the total amount of impurities of $1.0 \times 10^{10}/cm^2$ to $2.0 \times 10^{12}/cm^2$, preferably $0.5 \times 10^{12}$ to $1.8 \times 10^{12}/cm^2$. The p type anode layer 304 having high impurity concentration and the n type cathode layer 305 having high impurity concentration are formed in the active layer 303 to be separated from each other with a predetermined distance. The p type anode layer 304 and the n type cathode layer 305 are formed to have the depth which does not reach to the silicon oxide film 302 as shown in the drawing. If voltage $V_1$ and voltage $V_2$ are applied to the p type anode layer 304 and the n type cathode layer 305, respectively, and voltages $V_1$ and $V_2$ are higher than the voltage Vsub of the silicon substrate 301, a p type channel region 303a is formed in the bottom portion of the high resistance silicon layer 303. Since the p⁻ type channel region 303a has positive charge, capacitance is formed together with the substrate 301. Thereby, influence of the potential of the substrate 301 is shielded, and the high resistance silicon layer 303 is prevented from being depleted.

FIG. 85 is a MOSFET showing other example in which the p⁻ type channel region 303a shown in FIG. 123 is formed. The n⁻ type active layer 303 is formed on the substrate 301 through the silicon oxide film 302. The p type base layer 311 and the n type drain layer 312 are formed in the active layer 303. The p type base layer 311 and the n type drain layer 312 are formed to have the depth which does not reach to the silicon oxide film 302.

The n type source layer 313 is formed in the p type base layer 311, and the the surface portion of the p type base layer 311, which is sandwiched between the n type source layer 313 and the n⁻ type active layer 303, is used as a channel region, and the gate electrode 315 is formed on the channel region through the gate oxide film 314 having a thickness of about 60 nm.

The MOSFET shown in FIG. 85 is used as a switch on the high potential side of the circuit. If the MOSFET is turned on, both source potential and the drain potential become high potential to the substrate 301. In this case, if the influence of the potential of the substrate 301 is not shielded, the active layer 303 is depleted, and on-resistance of the MOSFET becomes extremely high.

However, the distance between the p type base layer 311 and the oxide film 302 and impurity concentration of the p type base layer 311 are suitably selected, a hole is injected from the p type base layer 311 and the p⁻ channel region is formed in the bottom portion of the active layer 303 when the source potential $V_1$ is a certain constant value or more. Thereby, the active layer 303 is prevented from being depleted.

In this case, the source potential Vp to form the p⁻ type channel region can be obtained from the following equation.

$$V_p = qC_N l^2/2\epsilon$$

wherein (q: $1.6 \times 10^{-19}$ C) $C_N$: N type impurity concentration and $\epsilon$: dielectric constant ($1.05 \times 10^{-12}$ F/cm).

Vp is preferably 10 V or less. That is, $1 \leq 20\epsilon/qC_N$.

In order to set Vp to zero, the distance 1 may be changed to 0. In other words, the structure shown in FIGS. 86 and 87 may be used.

In FIG. 124, if the conductivity type of the drain region 312 is changed to p type, the device becomes IGBT. For such IGBT, the potential of n⁻ type active layer is floating and the p-channel region on the bottom oxide layer 302 is always formed even if the distance 1 is greater than zero. The n⁻ type active layer may be formed by impurity diffusion.

The structure in which the high resistance film is not formed on the high resistance semiconductor layer is not limited to the above-mentioned examples. There can be used the structure in which the high resistance film shown in FIGS. 3 to 118 is removed from the high resistance semiconductor layer. Such the structure is shown in FIGS. 88 to 112.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a substrate;

a high resistance semiconductor layer having a thermal oxide layer formed on a surface of said high resistance layer, said thermal oxide layer directly bonded to said substrate;

an isolating region formed by locally oxidizing said high resistance semiconductor layer;

a first element region formed in said high resistance semiconductor layer isolated by said isolating region in a lateral direction;

a second element region formed in said high resistance semiconductor layer isolated by said isolating region in a lateral direction, said second element region being separated from said first element region by said isolating region;

a complementary MOS transistor formed in said first element region; and a bipolar transistor formed in said second element region.

2. A semiconductor device according to claim 1, wherein said bipolar transistor is a high breakdown voltage transistor.

3. A semiconductor device according to claim 1, wherein said isolating region reaches said substrate.

4. A semiconductor device according to claim 1, wherein said thermal oxide layer has a thickness of 2 µm or more.

5. A semiconductor device according to claim 1, further comprising a high resistance film formed between said insulating layer and said high resistance semiconductor layer.

6. A semiconductor device according to claim 5, wherein said isolating region reaches said high resistance film.

7. A semiconductor device according to claim 1, wherein said bipolar transistor is an insulated gate bipolar transistor.

8. A semiconductor device according to claim 7, wherein said insulated gate bipolar transistor includes:

a first low resistance region of a first conductivity type formed in said second element region;

a second low resistance region of a second conductivity type formed in said first low resistance region and constituting a drain region;

a third low resistance region of the second conductivity type formed in said second element region; and a fourth low resistance region of the first conductivity type formed in said third low resistance region and constituting a source region.

9. A semiconductor device according to claim 8, wherein said third low resistance region reaches said thermal oxide layer, and said second low resistance region is spaced apart from said thermal oxide layer.

10. A semiconductor device according to claim 9, wherein said first low resistance region reaches said thermal oxide layer.

11. A semiconductor device according to claim 8, further comprising:

a high resistance film formed between said thermal oxide layer and said high resistance semiconductor layer; and an insulating layer formed between said high resistance film and said high resistance semiconductor layer, and said insulating layer having openings under said second low resistance region and said fourth low resistance region.

* * * * *